United States Patent
Tsuyuki

(10) Patent No.: US 9,583,606 B2
(45) Date of Patent: Feb. 28, 2017

(54) SEMICONDUCTOR DEVICE

(71) Applicant: Renesas Electronics Corporation, Tokyo (JP)

(72) Inventor: Hajime Tsuyuki, Kodaira (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/154,771

(22) Filed: May 13, 2016

(65) Prior Publication Data
US 2017/0018635 A1   Jan. 19, 2017

(30) Foreign Application Priority Data
Jul. 14, 2015   (JP) .................. 2015-140514

(51) Int. Cl.
*H01L 29/739*   (2006.01)
*H01L 29/66*    (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ............. H01L 29/0619; H01L 29/0696; H01L 29/0804; H01L 29/0821; H01L 29/7397;
(Continued)

(56) References Cited

U.S. PATENT DOCUMENTS 8,633,510 B2 * 1/2014 Matsuura .......... H01L 29/66348
257/139
9,041,050 B2   5/2015 Matsuura
(Continued)

FOREIGN PATENT DOCUMENTS

JP   2013-140885 A   7/2013

*Primary Examiner* — Dao H Nguyen
(74) *Attorney, Agent, or Firm* — McGinn IP Law Group, PLLC

(57) ABSTRACT

An improvement is achieved in the reliability of a semiconductor device having an IGBT. In an active cell region, in a portion of a semiconductor substrate which is interposed between first and second trenches in which first and second trench gate electrodes are embedded, an $n^+$-type emitter region, a p-type body region located thereunder, and a first n-type hole barrier region located thereunder are formed. In a hole collector cell region, in a portion of the semiconductor substrate which is interposed between third and fourth trenches in which third and fourth trench gate electrodes are embedded, the p-type body region and a second n-type hole barrier region located thereunder are formed, but an n-type semiconductor region equivalent to the $n^+$-type emitter region is not formed. Under the first and second n-type hole barrier regions, an $n^-$-type drift region having an impurity concentration lower than those thereof is present. The impurity concentration of the second n-type hole barrier region is higher than the impurity concentration of the first n-type hole barrier region.

15 Claims, 32 Drawing Sheets

(51) Int. Cl.
| | |
|---|---|
| *H01L 29/72* | (2006.01) |
| *H01L 29/08* | (2006.01) |
| *H01L 29/417* | (2006.01) |
| *H01L 29/423* | (2006.01) |
| *H01L 29/06* | (2006.01) |
| *H01L 29/36* | (2006.01) |
| *H01L 29/10* | (2006.01) |
| *H01L 29/40* | (2006.01) |

(52) U.S. Cl.
 CPC ...... H01L 29/0804 (2013.01); H01L 29/0821 (2013.01); H01L 29/1095 (2013.01); H01L 29/36 (2013.01); H01L 29/404 (2013.01); H01L 29/41708 (2013.01); H01L 29/4236 (2013.01); H01L 29/66348 (2013.01)

(58) Field of Classification Search
 CPC ........... H01L 29/66348; H01L 29/4236; H01L 29/41708; H01L 29/404; H01L 29/36; H01L 29/1095
 USPC ....... 257/139, 140, 143, 144, 328, 330, 617, 257/E27.019, E27.06, E27.112, E29.107, 257/E29.197, E29.198, E21.382; 438/138, 197, 270
 See application file for complete search history.

(56) References Cited

U.S. PATENT DOCUMENTS

| | | | |
|---|---|---|---|
| 2009/0242931 A1* | 10/2009 | Tsuzuki | H01L 29/167 257/143 |
| 2011/0140167 A1* | 6/2011 | Yilmaz | B82Y 10/00 257/139 |
| 2012/0193676 A1* | 8/2012 | Bobde | H01L 29/7391 257/140 |
| 2012/0313139 A1* | 12/2012 | Matsuura | H01L 29/36 257/139 |
| 2015/0340480 A1* | 11/2015 | Matsuura | H01L 29/7813 257/144 |
| 2016/0163696 A1* | 6/2016 | Takahashi | H01L 27/0635 257/140 |

* cited by examiner

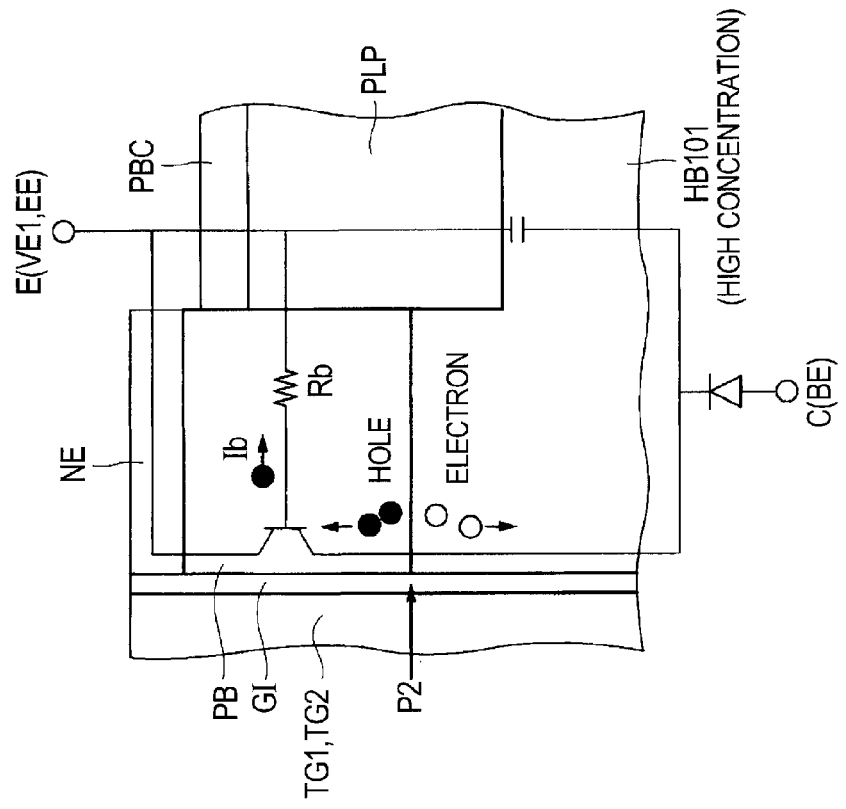
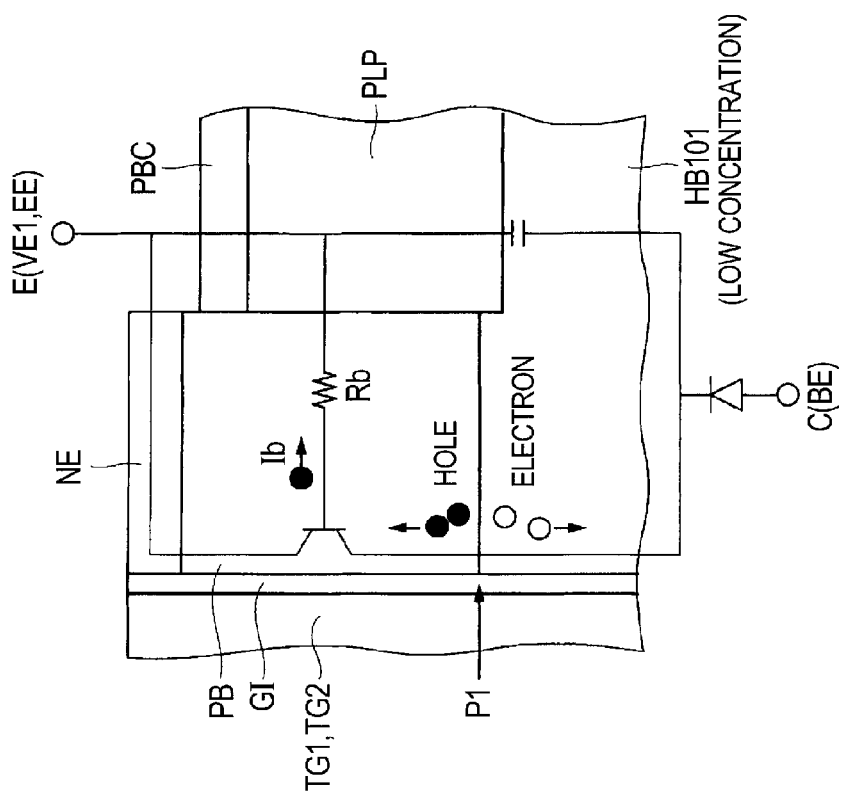
FIG. 28A
FIG. 28B

SEMICONDUCTOR DEVICE

CROSS-REFERENCE TO RELATED APPLICATIONS

The disclosure of Japanese Patent Application No. 2015-140514 filed on Jul. 14, 2015 including the specification, drawings and abstract is incorporated herein by reference in its entirety.

BACKGROUND

The present invention relates to a semiconductor device, which can be used appropriately as, e.g., a semiconductor device having an IGBT.

As a power semiconductor device, there is a semiconductor device having an IGBT.

Japanese Unexamined Patent Publication No. 2013-140885 (Patent Document 1) describes a technique related to a semiconductor device having an IGBT.

RELATED ART DOCUMENT

Patent Document

[Patent Document 1]
Japanese Unexamined Patent Publication No. 2013-140885

SUMMARY

Even in a semiconductor device having an IGBT, it is desired to maximize the performance thereof.

Other problems and novel features of the present invention will become apparent from a statement in the present specification and the accompanying drawings.

According to an embodiment, in a semiconductor substrate included in a semiconductor device, an impurity concentration of a hole barrier semiconductor region in a carrier discharge cell region is set higher than an impurity concentration of a hole barrier semiconductor region in a cell region where a unit IGBT is formed.

According to the embodiment, it is possible to improve the reliability of the semiconductor device.

BRIEF DESCRIPTION OF THE DRAWINGS

FIGS. 28A and 28B are illustrative views of the semiconductor device in the studied example;

DETAILED DESCRIPTION

Figure 1:
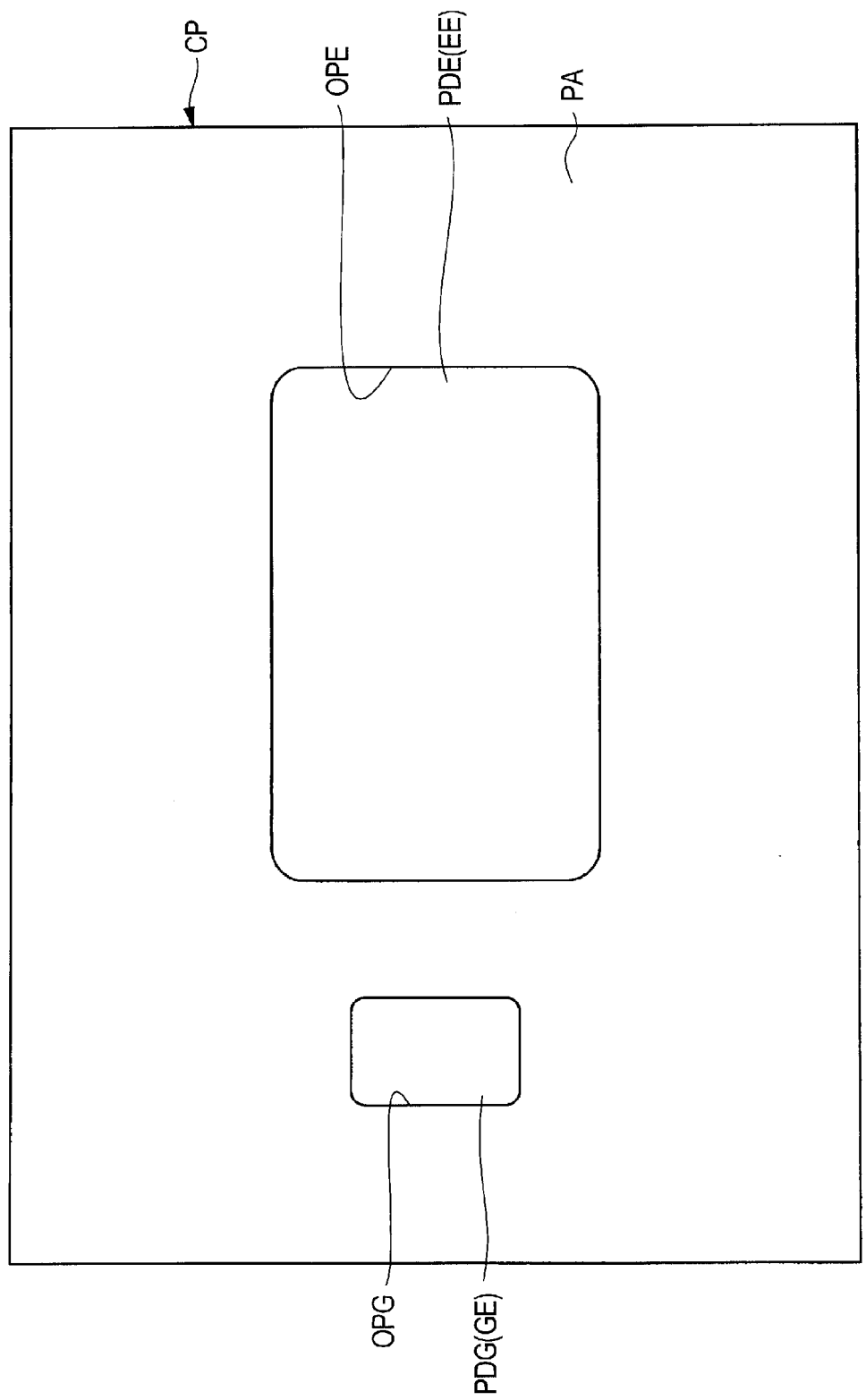
FIG. 1 is an overall plan view of an upper surface of a semiconductor device in an embodiment.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiment 1

About Overall Structure of Semiconductor Device

A semiconductor device in the present embodiment will be described with reference to the drawings.

Figure 2:
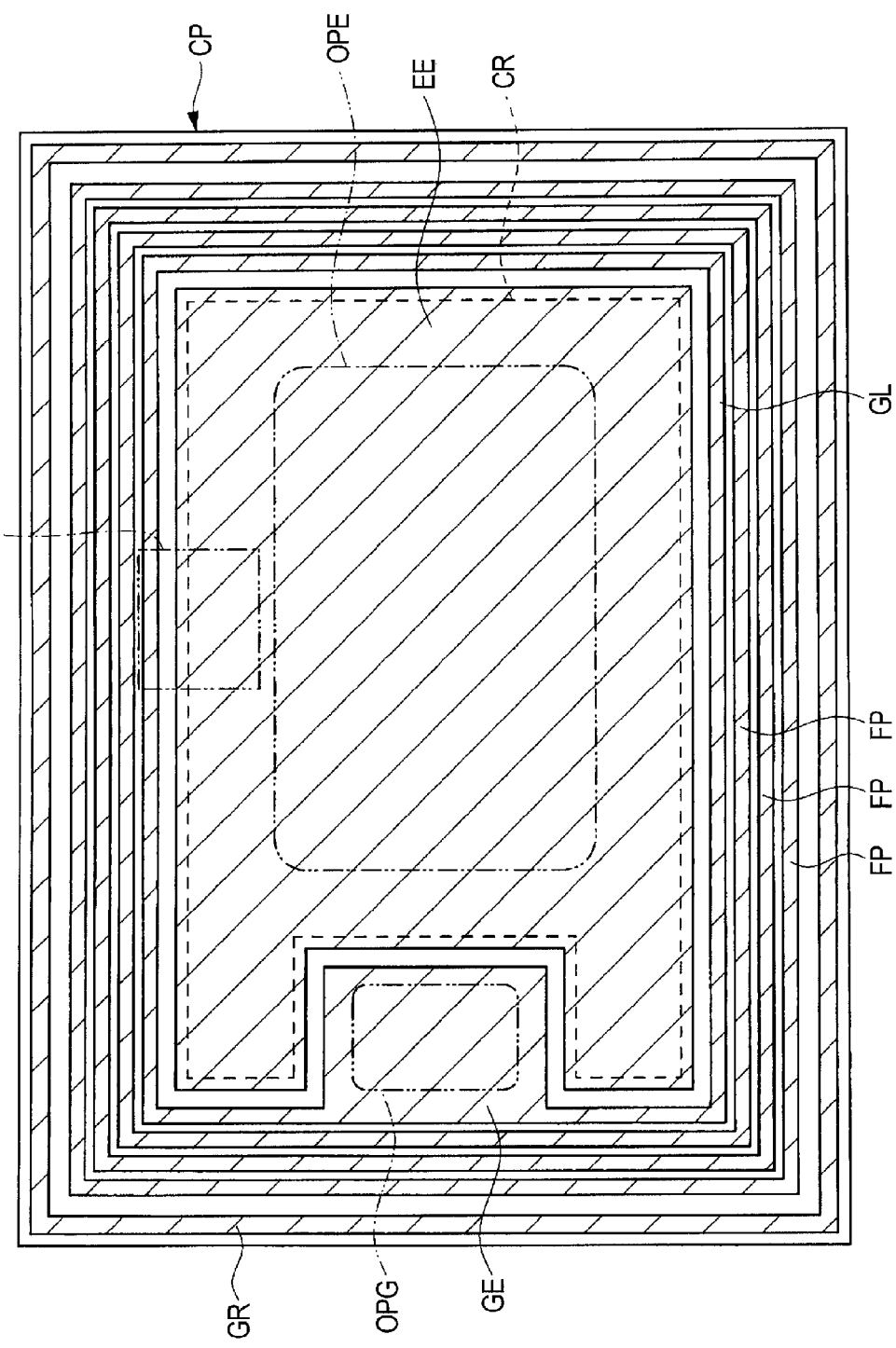
FIG. 2 is a perspective plan view of the semiconductor device in the embodiment.
Figure 3:
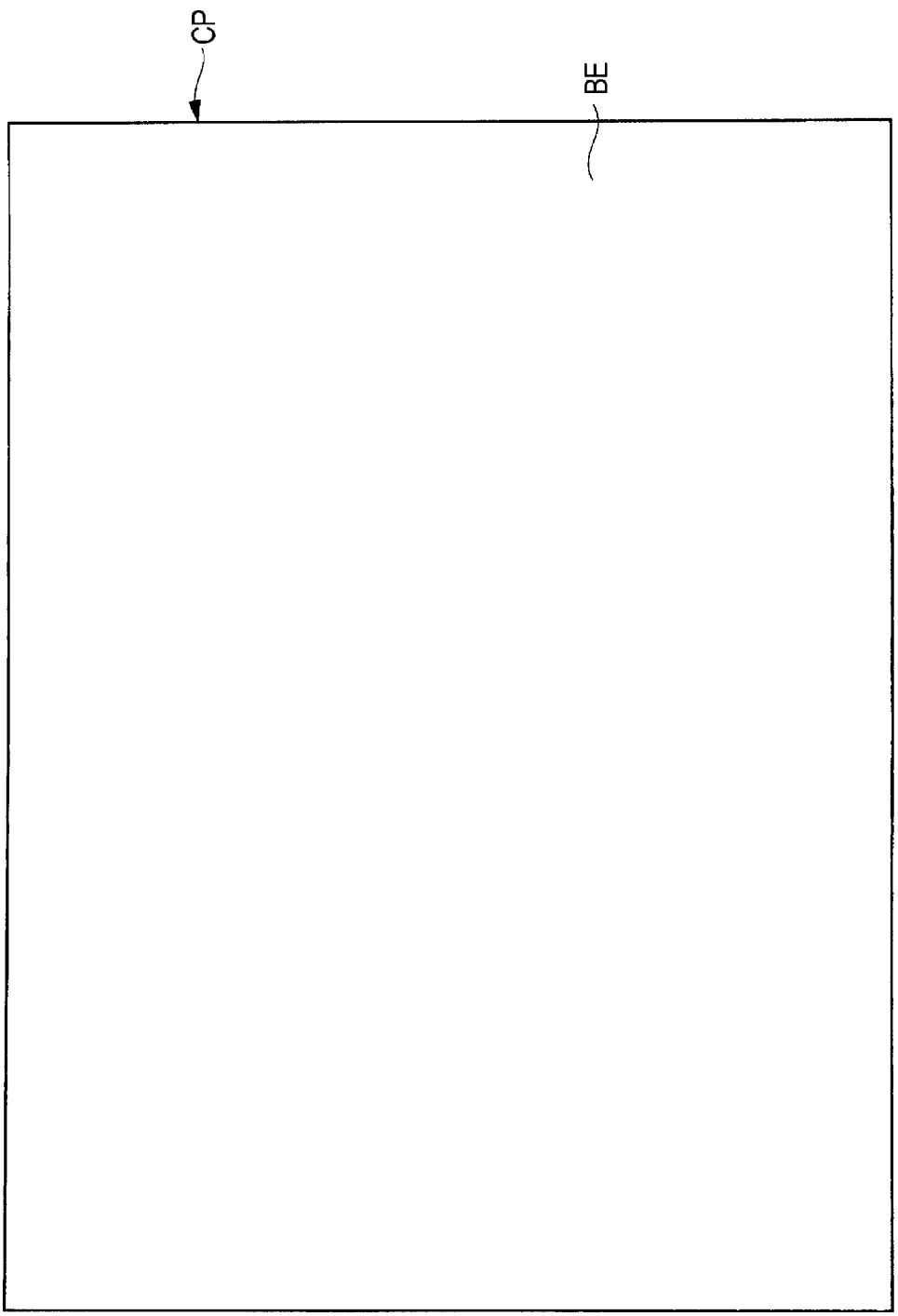
FIG. 3 is an overall plan view of a back surface of the semiconductor device in the embodiment.

FIG. 1 is an overall plan view of a semiconductor device (semiconductor chip) CP in the present embodiment, which shows an overall plan view of an upper surface of the semiconductor device CP. FIG. 2 is a perspective plan view of the semiconductor device CP in the present embodiment, which shows a plan view of the semiconductor device CP in FIG. 1 when viewed through an insulating film PA as a surface protection film. FIG. 3 is an overall plan view of the semiconductor device CP in the present embodiment, which shows an overall plan view of a back surface (lower surface) of the semiconductor device CP.

As shown in FIGS. 1 to 3, the semiconductor device (semiconductor chip) CP has an upper surface as one main surface and a back surface (lower surface) as a main surface opposite to the upper surface. Each of FIGS. 1 and 2 shows the upper surface of the semiconductor device CP. FIG. 3 shows the back surface of the semiconductor device CP. However, in FIG. 2, the semiconductor device CP is viewed through the insulating film PA.

Figure 5:
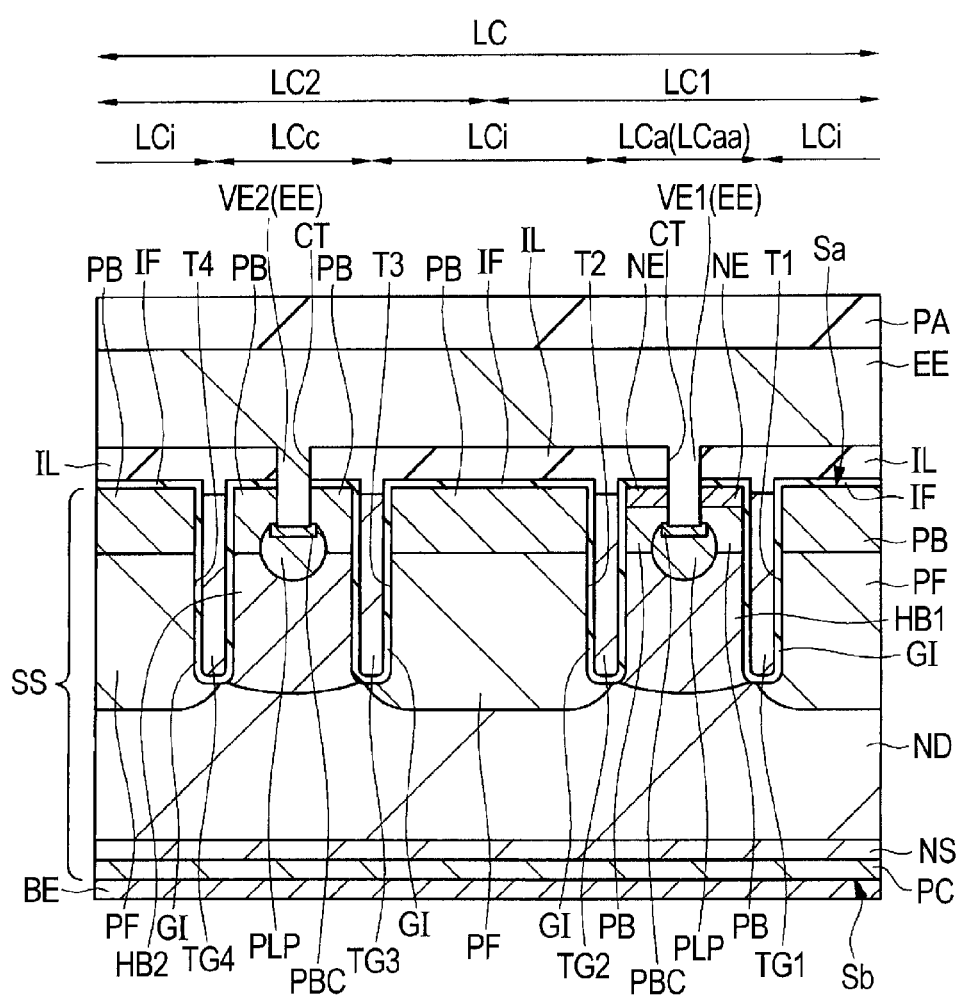
FIG. 5 is a main-portion cross-sectional view of the semiconductor device in the embodiment.
Figure 6:
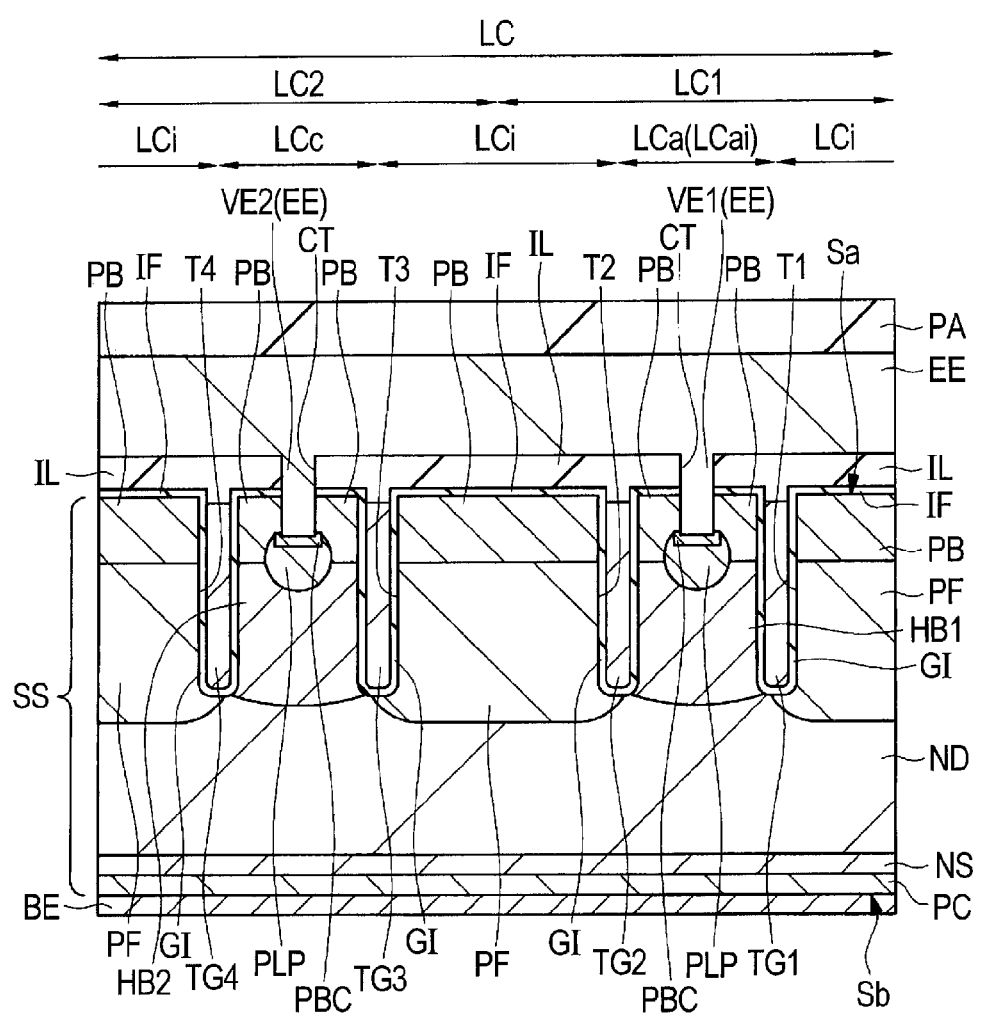
FIG. 6 is a main-portion cross-sectional view of the semiconductor device in the embodiment.
Figure 7:
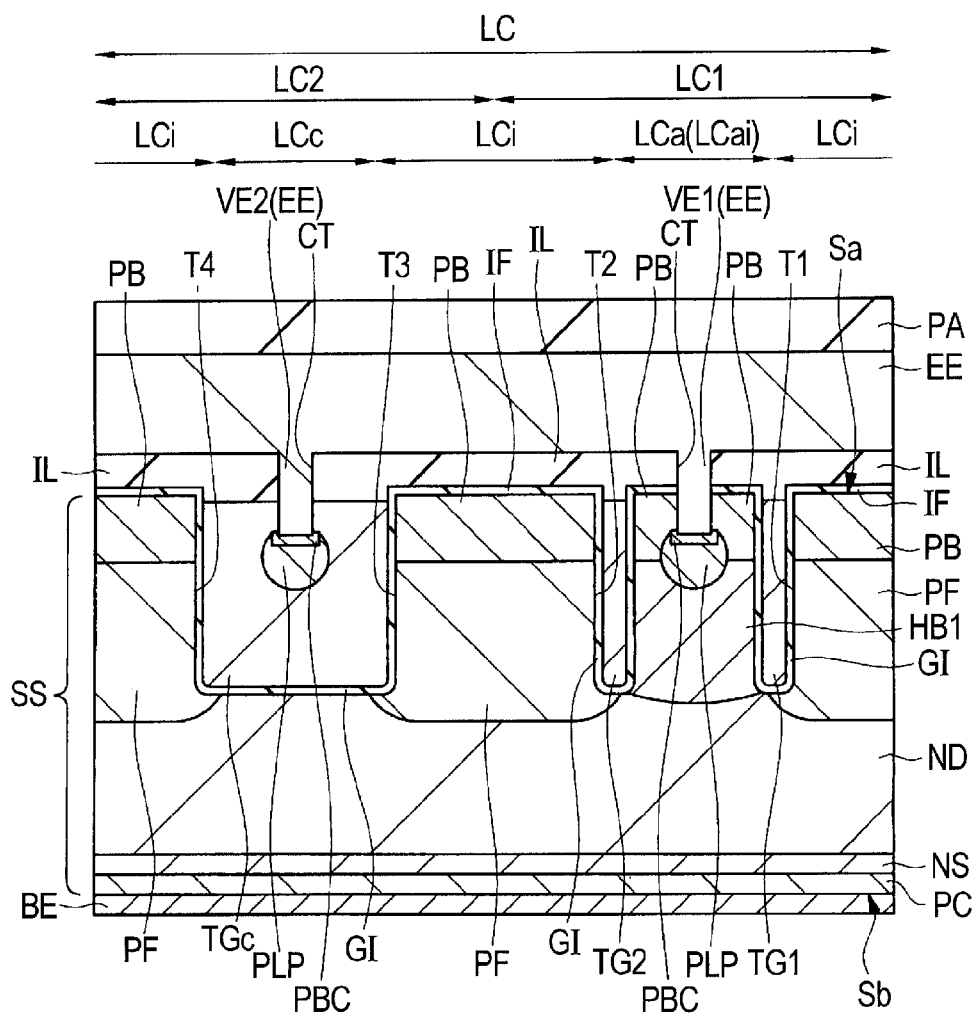
FIG. 7 is a main-portion cross-sectional view of the semiconductor device in the embodiment.

As shown in FIG. 2, over an outer peripheral portion of the main surface of the semiconductor device CP, an annular guard ring GR which circles along the outer periphery of the semiconductor device CP is formed. Inside the guard ring GR, annular field plates FP which circle along the guard ring GR are formed. In the case of FIG. 2, the three field plates FP are formed, but the number of the field plates FP is not limited thereto. The one or plurality of field plates FP can be formed. The field plates FP are coupled to annular floating field rings formed in a semiconductor substrate SS included in the semiconductor device CP. The floating field rings are each made of an annular p-type floating diffusion layer and are provided immediately under the field plates FP. The guard ring GR and the field plates FP are preferably formed but, if unnecessary, either one or both thereof can also be omitted. Note that the semiconductor substrate SS included in the semiconductor device CP is not shown in FIGS. 1 to 3, but are shown in FIGS. 5 to 7 described later.

As shown in FIG. 2, over the main surface of the semiconductor device CP located inside the field plates FP, an emitter electrode (electrode for emitter) EE, a gate electrode (electrode for gate) GE, and a gate line (wire line for gate) GL are formed. The guard ring GR, the field plates FP, the emitter electrode EE, the gate electrode GE, and the gate line GL are formed in the same layer and formed over an interlayer insulating film (corresponding to an interlayer insulating film IL described later) formed over the semiconductor substrate SS. Each of the guard ring GR, the field plates FP, the emitter electrode EE, the gate electrode GE, and the gate line GL is made of a metal film containing, e.g., aluminum (Al) as a main component. That is, by patterning the common metal film, the guard ring GR, the field plates FP, the emitter electrode EE, the gate electrode GE, and the gate line GL can be formed.

In a main part of an active portion (active region) of the semiconductor substrate SS included in the semiconductor device CP and located inside the annular field plates FP in plan view, a cell formation region CR where an IGBT (Insulated Gate Bipolar Transistor) is formed is provided. Over the cell formation region CR, the emitter electrode EE is disposed so as to cover the entire cell formation region CR. The emitter electrode EE is electrically coupled to the emitter of the IGBT formed in the cell formation region CR.

Such wording as "when viewed in plan view" or "when viewed in two dimensions" is used when the semiconductor device CP is viewed in a plane parallel with the main surface of the semiconductor substrate SS.

The emitter electrode EE and the gate electrode GE are isolated from each other. Also, the emitter electrode EE and the gate line GL are isolated from each other. On the other hand, the gate electrode GE and the gate line GL are integrally formed. Accordingly, the gate electrode GE and the gate line GI are electrically coupled to each other. The width of the gate electrode GE is larger than the width of the gate line GL.

Inside the annular field plates FP in plan view, the gate line GL is disposed between the emitter electrode EE and the field plates FP to be spaced apart from the emitter electrode EE. In the case of FIG. 2, in plan view, the gate line GL is disposed between the emitter electrode EE and the field plates FP so as to surround the periphery of the emitter electrode EE. The gate line GL is electrically coupled to the gate (corresponding to trench gate electrodes TG1 and TG2 described later) of the IGBT formed in the cell formation region CR. Accordingly, the gate electrode GE is electrically coupled to the gate of the IGBT formed in the cell formation region CR via the gate line GL.

In the uppermost layer of the semiconductor device CP closer to the upper surface thereof, the insulating film (final passivation film) PA is formed as a surface protection film. As can be also seen from FIGS. 1 and 2, the guard ring GR and the field plates FP are entirely covered with the insulating film PA and are therefore not exposed. On the other hand, the emitter electrode EE has a portion (center portion) thereof exposed from an emitter opening OPE in the insulating film PA. The exposed portion of the emitter electrode EE forms an emitter pad PDE as an emitter bonding pad. The gate electrode GE also has a portion (center portion) thereof exposed from a gate opening OPG in the insulating film PA. The exposed portion of the gate electrode GE forms a gate pad PDG as a gate bonding pad. As can also be seen from FIG. 3, the uppermost layer of the semiconductor device CP closer to the back surface thereof is a back-surface electrode BE. The back-surface electrode BE is formed over the entire back surface of the semiconductor device CP.

Consequently, as shown in FIG. 1, the semiconductor device CP has the emitter pad PDE as a first terminal and the gate pad PDG as a control terminal over the upper surface thereof, while having the back-surface electrode BE as a second terminal over the back surface thereof. The emitter pad PDE, the gate pad PDG, and the back-surface electrode BE can function as the external coupling terminals of the semiconductor devices CP. When the semiconductor device CP is packaged, to the gate pad PDG and the emitter pad PDE of the semiconductor device, conductive coupling members such as bonding wires or a metal plate can be coupled.

In the semiconductor substrate SS included in the semiconductor device CP, the IGBT is formed as a semiconductor element which controls conduction between the first terminal (emitter pad PDE) formed over the upper surface of the semiconductor device CP and the second terminal (back-surface electrode BE) formed over the back surface of the semiconductor device CP. As a result, in the semiconductor device CP, by controlling the IGBT formed in the semiconductor substrate SS, the conduction between the first terminal over the upper surface and the second terminal over the back surface is controlled so that a current flows between the first terminal over the upper surface and the second terminal over the back surface. This allows the semiconductor device CP to be used as, e.g., a switching element in which a large current flows. The gate pad PDG functions as a control terminal which controls the conduction between the first and second terminals.

<About Internal Structure of Semiconductor Device>

Next, a description will be given of the internal structure of the foregoing semiconductor device CP with reference to the drawings.

Figure 4:
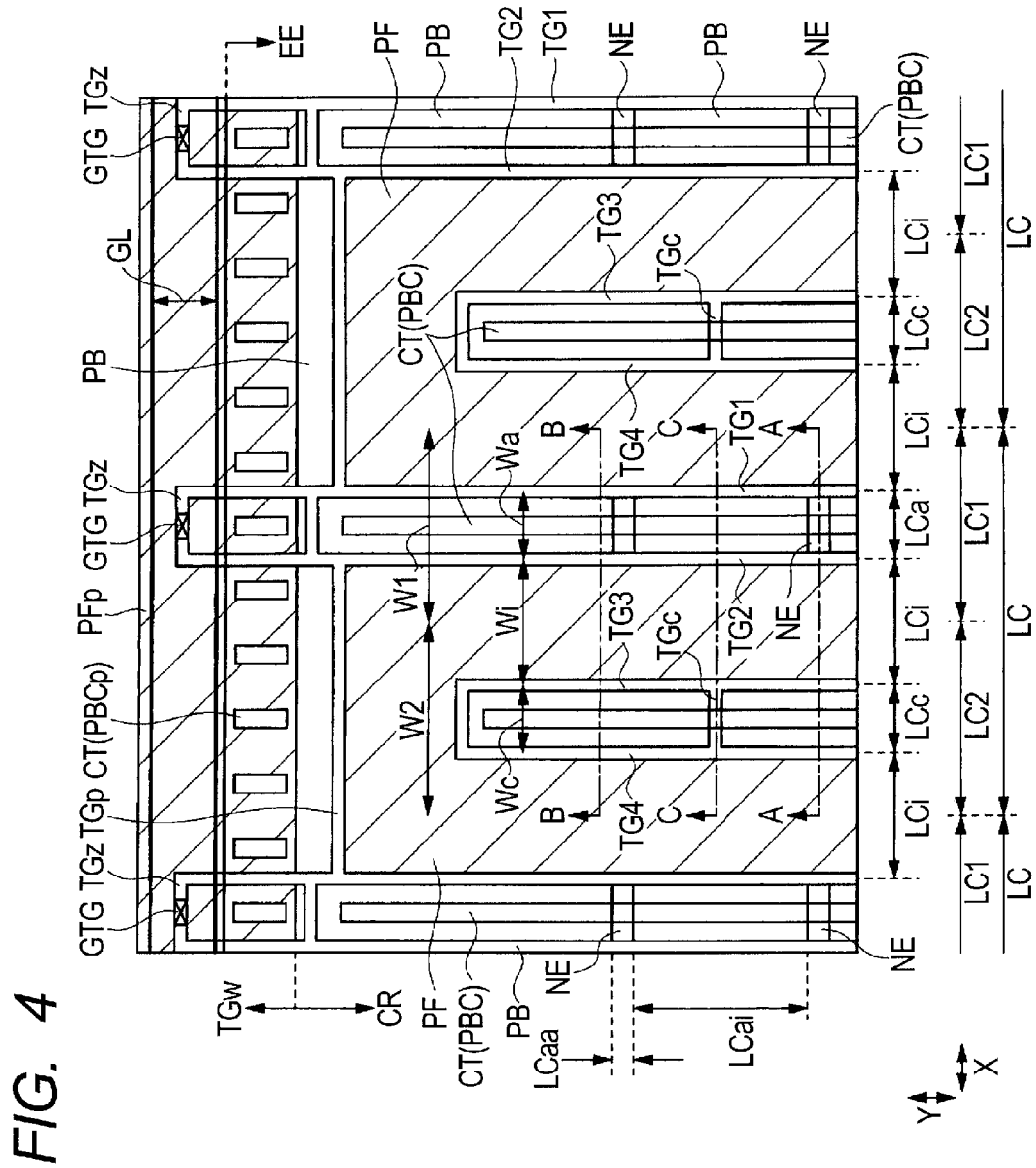
FIG. 4 is a main-portion plan view of the semiconductor device in the embodiment.

FIG. 4 is a main-portion plan view of the semiconductor device CP in the present embodiment. FIGS. 5 to 7 are main-portion cross-sectional views of the semiconductor device CP in the present embodiment. FIG. 4 shows a partially enlarged plan view in which a region RG1 shown in FIG. 2 described above is shown in enlarged relation. Among FIGS. 5 to 7, FIG. 5 corresponds to a cross-sectional view at the position along the line A-A in FIG. 4. FIG. 6 corresponds to a cross-sectional view at the position along the line B-B in FIG. 4. FIG. 7 corresponds to a cross-sectional view at the position along the line C-C in FIG. 4.

As shown in FIG. 4, in the cell formation region CR, unit cell regions (linear unit cell regions) LC are periodically arranged in an X-direction. That is, the unit cell region LC is repeated a plurality of times in the X-direction to form the cell formation region CR. In other words, the unit cell regions LC are the unit cells as repetition units.

Each of the unit cell regions LC includes a unit cell region (first linear unit cell region) LC1 and a unit cell region (second linear unit cell region) LC2. In the case of FIG. 4, a width W1 of the unit cell region LC1 and a width W2 of the unit cell region LC2 are substantially the same. Each of the widths W1 and W2 mentioned herein is a width (dimension) in the X-direction. The sum of the width W1 of the unit cell region LC1 and the width W2 of the unit cell region LC2 corresponds to a width (dimension in the X-direction) of the unit cell region LC.

Each of the unit cell regions LC1 includes a middle active cell region (linear active cell region or transistor cell region) LCa and a pair of half-width inactive cell regions (linear inactive cell regions) LCi surrounding the active cell region LCa. Between (at the boundary between) the active cell region LCa and each of the inactive cell regions LCi, the trench gate electrode (first linear trench gate electrode) TG1 or the trench gate electrode (second linear trench gate electrode) TG2 electrically coupled to the foregoing gate line GL is disposed. That is, in each of the active cell regions LCa, the trench gate electrode TG1 is disposed at one end portion thereof in the X-direction to extend in a Y-direction and the trench gate electrode TG2 is disposed at the other end portion thereof in the X-direction to extend in the Y-direction. In each of the active cell regions LCa, the trench gate electrodes GT1 and TG2 face each other in the X-direction.

On the other hand, each of the unit cell regions LC2 includes a middle hole collector cell region (linear hole collector cell region or hole discharge cell region) LCc and the pair of half-width inactive cell regions LCi surrounding the hole collector cell region LCc. Between (at the boundary between) the hole collector cell region LCc and each of the inactive cell regions LCi, a trench gate electrode (third linear trench gate electrode) TG3 or a trench gate electrode (fourth linear trench gate electrode) TG4 electrically coupled to the foregoing emitter electrode EE is disposed. That is, in each of the hole collector cell regions LCc, the trench gate electrode TG3 is disposed at one end portion thereof in the X-direction to extend in the Y-direction and the trench gate electrode TG4 is disposed at the other end portion thereof in the X-direction to extend in the Y-direction. In each of the hole collector cell regions LCc, the trench gate electrodes TG3 and TG4 face each other in the X-direction.

Thus, the unit cell region LC1 and the unit cell region LC2 which are adjacent to each other in the X-direction share the inactive cell region LCi. It follows that a half (half closer to the unit cell region LC1) of the inactive cell region LCi belongs to the unit cell region LC1, while the remaining half (half closer to the unit cell region LC2) of the inactive cell region LCi belongs to the unit cell region LC2. That is, in the unit cell regions LC1 and LC2 which are adjacent to each other in the X-direction, between the active cell region LCa of the unit cell region LC1 and the hole collector cell region LCc of the unit cell region LC2, the full-width inactive cell region LCi is interposed. A half-width portion of the full-width inactive cell region LCi belongs to the unit cell region LC1, while the remaining half-width portion of the full-width inactive cell region LCi belongs to the unit cell region LC2. However, even though the inactive cell region LCi is assumedly divided into the half-width portion belonging to the unit cell region LC1 and the other half-width portion belonging to the unit cell region LC2, there is no boundary therebetween. The inactive cell region LCi is divided only virtually.

Note that, in the case of FIG. 4, a width Wa of the active cell region LCa is substantially the same as a width Wc of the hole collector cell region LC1. Also, in the case of FIG. 4, the width Wa of the active cell region LCa and the width Wc of the hole collector cell region LCc are narrower (smaller) than a width Wi of the inactive cell region LCi. Each of the widths Wa, Wc, and Wi mentioned herein is a width (dimension) in the X-direction.

Also, in the case of FIG. 4, the active cell region LCa or the hole collector cell region LCc and the inactive cell region LCi are alternately arranged (disposed) in the X-direction to form the unit cell region LC.

In each of the active cell regions LCa and the hole collector cell regions LCc, in the middle portion thereof in the X-direction, a contact trench (opening) CT is provided to extend in the Y-direction. The bottom portions of the contact trenches CT reach a p$^+$-type body contact region PBC formed in the semiconductor substrate SS.

Note that the Y-direction intersects the X-direction. Preferably, the Y-direction is orthogonal to the X-direction. The X-direction is the direction in which the unit cell regions LC repeats. The Y-direction is a longitudinal direction (long side direction or extending direction) of each of the unit cell regions LC, LC1, and LC2, the active cell regions LCa, the hole collector cell regions LCc, the inactive cell regions LCi, the contact trenches CT, and the trenches T1, T2, T3, and T4. Accordingly, each of the unit cell regions LC, LC1, and LC2, the active cell regions LCa, the hole collector cell regions LCc, the inactive cell regions LCi, the contact trenches CT, and the trenches T1, T2, T3, and T4 extends in the Y-direction. The semiconductor device CP has a generally rectangular plan shape and has sides generally parallel with the X-axis direction and sides generally parallel with the Y-direction.

In the active cell regions LCa, regions (two-dimensional regions) where n$^+$-type emitter regions NE are formed, i.e., active sections LCaa and regions (two-dimensional regions) where the n$^+$-type emitter regions NE are not formed, i.e., inactive sections LCai are alternately and periodically provided in the Y-direction.

In the hole collector cell regions LCc, connection trench gate electrodes (emitter coupling portions) TGc which couple trench gate electrodes (trench electrodes) TG3 and trench gate electrodes (trench electrodes) TG4 to each other are periodically provided in the Y-direction.

In each of the hole collector cell regions LCc, the trench gate electrodes TG3 and TG4 extend in the Y-direction and are apart from each other in the X-direction. The connection trench gate electrodes TGc are formed integrally with the trench gate electrodes TG3 and TG4 to extend in the X-direction so as to connect the trench gate electrodes TG3 and TG4 to each other. As a result, in each of the hole collector cell regions LCc, the trench gate electrodes TG3 and TG4 are formed integrally via the connection trench gate electrodes TGc and electrically coupled to each other via the connection trench gate electrodes TGc.

In each of the hole collector cell regions LCc, between the trench gate electrode TG3 extending in the Y-direction and the trench-gate electrode TG4 extending in the Y-direction, the contact trench CT extending in the Y-direction is disposed. Accordingly, in each of the hole collector cell regions LCc, the contact trench CT intersects the connection trench gate electrode TGc and, at the intersecting portion thereof, the connection trench gate electrode TGc is electrically coupled to the emitter electrode EE. As a result, in each of the hole collector cell regions LCc, the trench gate electrodes TG3 and TG4 are electrically coupled to each other via the connection trench gate electrode TGc and electrically coupled to the emitter electrode EE via the connection trench gate electrode TGc.

The trench gate electrodes TG1 and TG2 function as the gate electrode of a field effect transistor (corresponding to a field effect transistor FE described later), while the trench gate electrodes TG3 and TG4 do not function as the gate electrode of the field effect transistor and are so-called dummy trench gate electrodes. The trench gate electrodes TG3 and TG4 which are embedded in the trenches T3 and T4 can be regarded as trench electrodes.

In the inactive cell regions LCi, p-type floating regions (p-type semiconductor regions) PF are provided. FIG. 4 is a plan view but, for easier understanding, the p-type floating regions PF and a p-type flowing region PFp described later are hatched.

In the case of FIGS. 5 to 7, a structure is provided such that the depths of the bottom surfaces of the p-type floating regions PF are deeper than those of the bottom surfaces of the trench gate electrodes TG1, TG2, TG3, and TG4 (trenches T1, T2, T3, and T4) and the bottom surfaces of the trench gate electrodes TG1, TG2, TG3, and TG4 (trenches T1, T2, T3, and T4) are covered with the p-type floating regions PF. Such a structure is not indispensable but provides the advantage of allowing a breakdown voltage to be easily maintained even when the width Wi of each of the inactive cell regions LCi in the X-direction is set larger than the width Wa of each of the active cell regions LCa in the X-direction. Also, in the case of FIGS. 5 to 7, the width Wa of each of the active cell regions LCa in the X-direction is set smaller than the width Wi of each of the inactive cell regions LCi in the X-direction. Such settings are not indispensable, but can further enhance an IE effect.

Outside the periphery of the cell formation regions CR, there are portions where, e.g., the p-type flowing region (p-type semiconductor region) PFp is provided so as to surround the cell formation regions CR. The p-type floating region PFp is electrically coupled to the emitter electrode EE by contact trenches CT (p+-type body contact regions PBCp) disposed at positions overlapping the p-type floating region PFp in plan view.

Also, outside the periphery of the cell formation region CR, e.g., the gate line GL is disposed. Toward the gate line GL, from within the cell formation region CR, the trench gate electrodes TG1 and TG2 extend. Thus, the trench gate electrodes TG1 and TG2 extend in the Y-direction mainly within the cell formation region CR and further extend to the outside of the periphery of the cell formation region CR. Outside the periphery of the cell formation region CR (at a gate lead-out portion TGw), the end portions of the trench gate electrodes TG1 in the Y-direction are connected to the end portions of the trench gate electrodes TG2 in the Y-direction via end-portion-connection trench gate electrodes (gate coupling portions) TGz. The end-portion-connection trench gate electrodes TGz are formed integrally with the trench gate electrodes TG1 and TG2 to extend in the X-direction so as to connect the trench gate electrodes TG1 and TG2. Accordingly, the trench gate electrodes TG1 and TG2 are electrically coupled to each other via the end-portion-connection trench gate electrodes TGz.

The end-portion-connection trench gate electrodes TGz overlap the gate line GL in plan view. The end-portion-connection trench gate electrodes TGz are electrically coupled to the gate line GL via coupling portions (gate-line/trench-gate-electrode coupling portions) GTG provided at positions overlapping the end-portion-connection trench gate electrode TGz in plan view. Each of the coupling portions GTG includes the contact hole formed in the interlayer insulating film IL and the portion of the gate line GL which is embedded in the contact hole. That is, the portions of the gate line GL embedded in the contact holes formed in the interlayer insulating film IL are coupled to the end-portion-connection trench gate electrodes TGz to thus electrically couple the trench gate electrodes TG1 and TG2 to the gate line GL.

The inactive cell regions LCi are separated from the outside of the periphery of the cell formation region CR by an end-portion trench gate electrode TGp. The end-portion trench gate electrode TGp is formed integrally with the trench gate electrodes TG1 and TG2.

Consequently, the trench gate electrodes TG1 and TG2 of the plurality of unit cell regions LC formed in the cell formation region CR are electrically coupled to each other, electrically coupled to the common gate line GL, and further electrically coupled to the foregoing gate electrode GE via the gate line GL. On the other hand, the trench gate electrodes TG3 and TG4 of the plurality of unit cell regions LC formed in the cell formation region CR are electrically coupled to each other and electrically coupled to the common emitter electrode EE.

Next, a description will be given of a cross-sectional structure of the semiconductor device CP with reference to FIGS. 5 to 7.

As also shown in FIGS. 5 to 7, the semiconductor substrate SS included in the semiconductor device CP is made of, e.g., n-type monocrystalline silicon into which an n-type impurity such as, e.g., phosphorus (P) has been introduced or the like. The semiconductor substrate SS has a top surface Sa as one main surface and a back surface Sb as a main surface opposite to the top surface Sa.

In the bottom portion of the semiconductor substrate SS, i.e., in the back surface Sb of the semiconductor substrate SS, a p+-type collector layer (p+-type collector region or p+-type semiconductor region) PC having a predetermined thickness is formed. The p+-type collector layer PC is a p-type semiconductor region (semiconductor layer) into which a p-type impurity has been introduced and can be formed in the entire back surface Sb of the semiconductor substrate SS. Then, over the entire back surface Sb of the semiconductor substrate SS, the back-surface electrode (collector electrode) BE is formed so as to come in contact with the p+-type collector layer PC. The back-surface electrode BE is a collector electrode.

Also, in the semiconductor substrate SS, on the side of the p+-type collector layer PC which is opposite to the side thereof where the back-surface electrode BE is located, an n-type field stop layer (n-type semiconductor region) NS is formed so as to come in contact with the p+-type collector layer PC. The n-type field stop layer NS is an n-type semiconductor region (semiconductor layer) into which an n-type impurity has been introduced and has an impurity concentration higher than that of an n−-type drift region ND. As a result, the p+-type collector layer PC is adjacent to the back-surface electrode BE and also adjacent to the n-type field stop layer NS on the side thereof opposite to the side where the back surface electrode BE is located. In the semiconductor substrate SS, a stacked structure including the p+-type collector layer PC and the n-type field stop layer NS can be formed in the entire back surface Sb of the semiconductor substrate SS.

The n-type field stop layer NS can also be omitted. However, since the n-type field stop layer NS can function as a field stop layer which prevents a depletion layer extending from the top surface of the semiconductor substrate SS from reaching the p+-type collector layer PC, the n-type field stop layer NS is more preferably formed. In the case where the n-type field stop layer NS is omitted, the upper surface (surface opposite to the surface adjacent to the back-surface electrode BE) of the p+-type collector layer PC is in contact with the n−-type drift region ND.

The back-surface electrode BE can be formed of a stacked film including, e.g., an aluminum (Al) layer, a titanium (Ti) layer, a nickel (Ni) layer, and a gold (Au) layer which are shown in order of increasing distance from the back surface Sb of the semiconductor substrate SS or the like. The back-surface electrode GE is in contact with the p+-type collector layer PC and electrically coupled to the back-surface electrode BE and the p+-type collector layer PC.

As shown in FIGS. 5 to 7, a main portion of the semiconductor substrate SS is occupied by the n−-type drift region ND as the n-type semiconductor region. That is, the n−-type drift region ND is formed in the region of the semiconductor substrate SS other than upper-layer and lower-layer portions thereof. The n−-type drift region ND corresponds to the region (i.e., region into which an n-type impurity or a p-type impurity has not substantially been implanted in the manufacturing process of the semiconductor device) of the semiconductor substrate SS where an n-type state when the semiconductor substrate SS was formed as an n-type semiconductor substrate is substantially maintained. The impurity concentration of the n−-type drift region ND is lower than the impurity concentration of each of the n-type field stop layer NS, the n+-type emitter region NE, and the n-type hole barrier regions HB1 and HB2. The upper surface (surface opposite to the surface adjacent to the p+-type collector layer PC) of the n-type field stop layer NS is adjacent to the bottom surface (lower surface) of the n⁻-type drift region ND. That is, the n-type field stop layer NS is interposed between the n⁻-type drift region ND and the p⁺-type collector layer PC.

In the top surface Sa of the semiconductor substrate SS, i.e., in the upper-layer portion of the semiconductor substrate SS, a p-type body region (p-type semiconductor region or p-type semiconductor layer) PB is formed over substantially the entire surface of the cell formation region CR. The p-type body region PB is a p-type semiconductor region (semiconductor layer) into which a p-type impurity has been introduced. The depth (depth position) of the bottom surface of the p-type body region is shallower than the depths (depth positions) of the bottom surfaces of the trenches T1, T2, T3, and T4.

Note that the "depth" or "depth position" is based on the top surface Sa of the semiconductor substrate SS as a reference surface and corresponds to the distance (distance in a direction perpendicular to the main surfaces of the semiconductor substrate SS) from the top surface Sa of the semiconductor substrate SS. It is assumed that the part of the semiconductor substrate SS which is closer to the top surface Sa thereof is the shallower part and the part of the semiconductor substrate SS which is more distant from the top surface Sa thereof (in other words, the part closer to the back surface Sb of the semiconductor substrate SS) is the deeper part.

In the semiconductor substrate SS, the trenches T1, T2, T3, and T4 are formed to extend from the top surface Sa in the depth direction (thickness direction) of the semiconductor substrate SS. In the trenches T1, T2, T3, and T4, the trench gate electrodes (gate electrodes or trench-type gate electrodes) TG1, TG2, TG3, and TG4 are embedded via a gate insulating film GI. That is, in the trench T1, the trench gate electrode TG1 is embedded via the gate insulating film GI and, in the trench T2, the trench gate electrode TG2 is embedded via the gate insulating film GI. Also, in the trench T3, the trench gate electrode TG3 is embedded via the gate insulating film GI and, in the trench T4, the trench gate electrode TG4 is embedded via the gate insulating film GI. The trenches T1, T2, T3, and T4 are formed in the top surface Sa of the semiconductor substrate SS and do not extend through the semiconductor substrate SS. The bottom surfaces of the trenches T1, T2, T3, and T4 are located at middle points along the thickness of the semiconductor substrate SS. The depths of the respective bottom surfaces of the trenches T1, T2, T3, and T4 are substantially equal to each other.

Over the bottom surfaces and side surfaces of the trenches T1, T2, T3, and T4 formed in the semiconductor substrate SS, the gate insulating film GI made of an insulating film such as a silicon dioxide film is formed. Consequently, between the trench gate electrodes TG1, TG2, TG3, and TG4 embedded in the trenches T1, T2, T3, and T4 and the semiconductor substrate SS, the gate insulating film GI is interposed. The trench gate electrodes TG1, TG2, TG3, and TG4 are each made of the conductive film embedded in each of the trenches T1, T2, T3, and T4 in the semiconductor substrate SS and made of, e.g., a doped polysilicon film (polysilicon film into which, e.g., phosphorus or the like has been introduced).

In each of the active cell regions LCa, the trench T1 and the trench gate electrode TG1 embedded in the trench T1 are disposed closer to one end portion thereof in the X-direction, while the trench T2 and the trench gate electrode TG2 embedded in the trench T2 are disposed closer to the other end portion thereof in the X-direction. The trenches T1 and T2 and the trench gate electrodes TG1 and TG2 embedded therein extend in the Y-direction, as shown in FIG. 4 described above. As described above, the trench gate electrodes TG1 and TG2 are electrically coupled to each other and also electrically coupled to the gate line GL and the gate electrode GE.

In each of the hole collector cell regions LCc, the trench T3 and the trench gate electrode TG3 embedded in the trench T3 are disposed closer to one end portion thereof in the X-direction, while the trench T4 and the trench gate electrode TG4 embedded therein are disposed closer to the other end portion thereof in the X-direction. The trenches T3 and T4 and the trench gate electrodes TG3 and TG4 embedded therein extend in the Y-direction, as shown in FIG. 4 described above. As described above, the trench gate electrodes TG3 and TG4 are electrically coupled to each other and also electrically coupled to the emitter electrode EE.

In the active section LCaa of each of the active cell regions LCa, the n⁺-type emitter region (n⁺-type semiconductor region) NE is formed in the top surface Sa of the semiconductor substrate SS. That is, the n⁺-type emitter region NE is formed in the upper portion (upper-layer portion) of the p-type body region PB. The n⁺-type emitter region NE is an n-type semiconductor region into which an n-type impurity has been introduced. As described above, in the active section LCaa of the active cell region LCa, the n⁺-type emitter region NE is formed (see FIG. 5) while, in the inactive section LCai of the active cell region LCa, the n⁺-type emitter region NE is not formed (see FIG. 6).

Over substantially the entire top surface Sa of the semiconductor substrate SS, the interlayer insulating film IL made of a silicon dioxide film or the like is formed. The trench gate electrodes TG1, TG2, TG3, and TG4 are covered with the interlayer insulating film IL. Over the interlayer insulating film IL, the emitter electrode EE made of a metal film containing, e.g., aluminum (Al) as a main component is formed. Over the interlayer insulating film IL, in the same layer as that of the emitter electrode EE, the foregoing gate line GL, the foregoing gate electrode GE, the foregoing field plates FP, and the foregoing guard ring GR are also formed, but are not shown in the cross sections of FIGS. 5 to 7. Over the interlayer insulating film IL, the insulating film PA as a surface protection film is formed so as to cover the emitter electrode EE. The insulating film PA is made of, e.g., a polyimide-based organic insulating film (resin film) or the like. Note that, as shown in FIGS. 1 and 2 described above, from the foregoing emitter opening OPE of the insulating film PA, a part of the emitter electrode EE is exposed and, from the foregoing gate opening OPG of the insulating film PA, a part of the gate electrode GE is exposed.

Each of the contact trenches CT extends through the interlayer insulating film IL and is further cut into a part of the semiconductor substrate SS. In the active cell region LCa, the contact trench CT is formed between the trenches T1 and T2 adjacent to each other in the X-direction and is consequently formed between the trench gate electrodes TG1 and TG2 adjacent to each other in the X-direction. In the hole collector cell region LCc, the contact trench CT is formed between the trenches T3 and 14 adjacent to each other in the X-direction and consequently formed between the trench gate electrodes TG3 and TG4 adjacent to each other in the X-direction.

In the semiconductor substrate SS in the active cell region LCa, at a position adjacent to the bottom surface of the contact trench CT, i.e., under the bottom surface of the contact trench CT, the p⁺-type body contact region (p⁺-type semiconductor region) PBC is formed. Under the p⁺-type body contact region PBC, a p⁺-type latch-up prevention region (p$^+$-type semiconductor region) PLP is formed so as to come in contact with the p$^+$-type body contact region PBC. The p$^+$-type body contact region PBC, the p$^+$-type latch-up prevention region PLP, and the p-type body region PB each formed in the active cell region LCa are electrically coupled to each other.

In the semiconductor substrate SS in the hole collector cell region LCc also, at a position adjacent to the bottom surface of the contact trench CT, i.e., under the bottom surface of the contact trench CT, the p$^+$-type body contact region PBC is formed. Under the p$^+$-type body contact region PBC, the p$^+$-type latch-up prevention region (p$^+$-type semiconductor region) PLP is formed so as to come in contact with the p$^+$-type body contact region PBC. The p$^+$-type body contact region PBC, the p$^+$-type latch-up prevention region PLP, and the p-type body region PB each formed in the hole collector cell region LCc are electrically coupled to each other.

Each of the p$^+$-type body contact region PBC and the p$^+$-type latch-up prevention region PLP is a p-type semiconductor region into which a p-type impurity has been introduced. The impurity concentration of the p$^+$-type latch-up prevention region PLP is higher than the impurity concentration of the p-type body region PB. The impurity concentration of the p$^+$-type body contact region PBC is higher than the impurity concentration of the p$^+$-type latch-up prevention region PLP.

In the active section LCaa of the active cell region LCa, the n$^+$-type emitter region NE is formed. As a result, the p$^+$-type body contact region PBC is exposed at the bottom surface of the contact trench CT, and the p-type body region PB and the n$^+$-type emitter region NE are exposed at the side surfaces of the contact trench CT. Consequently, in the active section LCaa of the active cell region LCa, a coupling electrode VE1 embedded in the contact trench CT is in contact with the p-type body region PB and the n$^+$-type emitter region NE at the side surfaces of the contact trenches CT and electrically coupled thereto, while being in contact with the p$^+$-type body contact region PBC at the bottom surface of the contact trench CT to be electrically coupled thereto.

It is assumed that the portion of the emitter electrode EE which is embedded in the contact trench CT formed in the active cell region LCa is referred to as the coupling electrode VE1 and the portion of the emitter electrode EE which is embedded in the contact trench CT formed in the hole collector cell region LCc is referred to as a coupling electrode VE2. The coupling electrode VE1 is embedded in the contact trench CT formed in the active cell region LCa, while the coupling electrode VE2 is embedded in the contact trench CT formed in the hole collector cell region LCc. Each of the coupling electrodes VE1 and VE2 is formed integrally with the emitter electrode EE and thus electrically coupled to the emitter electrode EE.

In another form, the coupling electrodes VE1 and VE2 can also be formed separately from the emitter electrode EE. In that case, however, the respective upper surfaces of the coupling electrodes VE1 and VE2 are in contact with the lower surface of the emitter electrode EE. In either case, the coupling electrodes VE1 and VE2 are electrically coupled to the emitter electrode EE.

In the inactive section LCai of the active cell region LCa, the n$^+$-type emitter region NE is not formed. As a result, the p$^+$-type body contact region PBC is exposed at the bottom surface of the contact trench CT and the p-type body region PB is exposed at the side surfaces of the contact trench CT. Consequently, in the inactive section LCai of the active cell region LCa, the coupling electrode VE1 embedded in the contact trench CT is in contact with the p-type body region PB at the side surfaces of the contact trench CT and electrically coupled thereto, while being in contact with the p$^+$-type body contact region PBC at the bottom surface of the contact trench CT and electrically coupled thereto.

Also, in the active cell region LCa, the coupling electrode VE1 has the bottom surface thereof in contact with the p$^+$-type body contact region PBC to be electrically coupled thereto with a low resistance, while being electrically coupled to the p-type body region PB via the p$^+$-type body contact region PBC and the p$^+$-type latch-up prevention region PLP in contact with the p$^+$-type body contact region PBC.

On the other hand, in the hole collector cell region LCc, the n$^+$-type emitter region NE is not formed. As a result, the p$^+$-type body contact region PBC is exposed at the bottom surface of the contact trench CT and the p-type body region PB is exposed at the side surfaces of the contact trench CT. Consequently, in the hole collector cell region LCc, the coupling electrode VE2 embedded in the contact trench CT is in contact with the p-type body region PB at the side surfaces of the contact trench CT and electrically coupled thereto, while being in contact with the p$^+$-type body contact region PBC at the bottom surface of the contact trench CT and electrically coupled thereto.

Also, in the hole collector cell region LCc, the coupling electrode VE2 has the bottom surface thereof in contact with the p$^+$-type body contact region PBC having a higher impurity concentration to be electrically coupled thereto with a low resistance, while being electrically coupled to the p-type body region PB via the p$^+$-type body contact region PBC and the p$^+$-type latch-up prevention region PLP in contact with the p$^+$-type body contact region PBC.

Accordingly, in the active cell region LCa, the coupling electrode VE1 is electrically coupled to the n$^+$-type emitter region NE formed in the active section LCaa, while being electrically coupled to the p$^+$-type body contact region PBC, the p$^+$-type latch-up prevention region PLP, and the p-type body region PB each formed extensively over the active section LCaa and the inactive section LCai. As a result, the n$^+$-type emitter region NE and the p-type body region PB each formed in the active cell region LCa are electrically coupled to the coupling electrode VE1 and electrically coupled to the emitter electrode EE via the coupling electrode VE1.

On the other hand, in the hole collector cell region LCc, the coupling electrode VE2 embedded in the contact trench CT is electrically coupled to the p-type body region PB, the p$^+$-type body contact region PBC, and the p$^+$-type latch-up prevention region PLP each formed in the hole collector cell region LCc. Consequently, the p-type body region PB formed in the hole collector cell region LCc is electrically coupled to the coupling electrode VE2 and electrically coupled to the emitter electrode EE via the coupling electrode VE2.

In the semiconductor substrate SS in the active cell region LCa, under the p$^+$-type latch-up prevention region PLP and the p-type body region PB, the n-type hole barrier region (n-type semiconductor region) HB1 is formed. On the other hand, in the semiconductor substrate SS in the hole collector cell region LCc, under the p$^+$-type latch-up prevention region PLP and the p-type body region PB, the n-type hole barrier region (n-type semiconductor region) HB2 is formed. Under each of the n-type hole barrier regions HB1 and HB2, the n$^-$-type drift region ND is present so that the respective bottom surfaces (lower surfaces) of the n-type hole barrier regions HB1 and HB2 are in contact with the n⁻-type drift region ND.

Each of the n-type hole barrier regions HB1 and HB2 is an n-type semiconductor region into which an n-type impurity has been introduced. The depth of the bottom surface of the n-type hole barrier region HB1 is substantially the same as the depths of the bottom surfaces of the trenches T1 and T2. The depth of the bottom surface of the n-type hole barrier region HB2 is substantially the same as the depths of the bottom surfaces of the trenches T3 and T4.

The impurity concentration of the n-type hole barrier region HB1 formed in the active cell region LCa is higher than the impurity concentration of the n⁻-type drift region ND under the n-type hole barrier region HB1 and lower than the impurity concentration of the n⁺-type emitter region NE. On the other hand, the impurity concentration of the n-type hole barrier region HB2 formed in the hole collector cell region LCc is higher than the impurity concentration of the n⁻-type drift region ND located under the n-type hole barrier region HB2.

Also, in the present embodiment, the impurity concentration of the n-type hole barrier region HB2 formed in the hole collector cell region LCc is higher than the impurity concentration of the n-type hole barrier region HB1 formed in the active cell region LCa. In other words, the impurity concentration of the n-type hole barrier region HB1 formed in the active cell region LCa is lower than the impurity concentration of the n-type hole barrier region HB2 formed in the hole collector cell region LCc. Accordingly, the conductivity of the n-type hole barrier region HB1 is lower than the conductivity of the n-type hole barrier region HB2.

Note that each of the n-type hole barrier regions HB1 and HB2 has the same conductivity type, and the impurity concentration of the n-type hole barrier region HB2 is higher than that of the n-type hole barrier region HB1. This means that the effective impurity concentration (i.e., charge density of an impurity) of the n-type hole barrier region HB2 is higher than that of the n-type hole barrier region HB1. When an n-type impurity and a p-type impurity are present in mixed relation, the n-type impurity and the p-type impurity cancel out (compensate for) each other and only the impurities equivalent to the impurity concentration difference therebetween can function as effective impurities (donor or acceptor). As a result, when the n-type impurity and the p-type impurity are present in mixed relation, the difference between the concentration of the n-type impurity and the concentration of the p-type impurity can be the effective impurity concentration. In the present embodiment, when an impurity concentration is mentioned, the impurity concentration basically corresponds to the effective impurity concentration.

In each of the inactive cell regions LCi, under the p-type body region PB, the p-type floating region (p-type semiconductor region) PF is formed in the top surface Sa of the semiconductor substrate SS. The p-type floating region PF is a p-type semiconductor region into which a p-type impurity has been introduced. The upper surface of the p-type floating region PF is in contact with the bottom surface of the p-type body region PB.

The following is the outline of a cross-sectional structure (corresponding to the cross-sectional structure in the active cell region LCa in FIG. 5) in the active section LCaa in the active cell region LCa.

That is, in the region of the semiconductor substrate SS which is interposed between the trenches T1 and T2, the n⁺-type emitter region NE is formed in the uppermost-layer portion. Under the n⁺-type emitter region NE, the p-type body region PB is formed and, under the p-type body region PB, the n-type hole barrier region HB1 is formed. The n⁺-type emitter region NE, the p-type body region PB, and the n-type hole barrier region HB1 are adjacent to the side surface of the trench T1. In the region adjacent to the side surface of the trench T1, a state is provided in which the p-type body region PB is interposed between the n⁺-type emitter region NE and the n-type hole barrier region HB1. Also, the n⁺-type emitter region NE, the p-type body region PB, and the n-type hole barrier region HB1 are in contact with the side surface of the trench T2. In the region adjacent to the side surface of the trench T2, a state is provided in which the p-type body region PB is interposed between the n⁺-type emitter region NE and the n-type hole barrier region HB1.

Under the n-type hole barrier region HB1, the n⁻-type drift region ND is present. Under the n⁻-type drift region ND, the n-type field stop layer NS is formed and, under the n-type field stop layer NS, the p⁺-type collector layer PC is formed. The p⁺-type collector layer PC is the lowermost layer in the semiconductor substrate SS. Over the back surface Sb of the semiconductor substrate SS, the back-surface electrode BE is formed so as to come in contact with the p⁺-type collector layer PC. In the trench T1 formed in the semiconductor substrate SS, the trench gate electrode TG1 is formed via the gate insulating film GI. In the trench T2 formed in the semiconductor substrate SS, the trench gate electrode TG2 is formed via the gate insulating film GI. The trench gate electrodes TG1 and TG2 face the n⁺-type emitter region NE, the p-type body region PB, and the n-type hole barrier region HB1 via the gate insulating film GI.

In the interlayer insulating film IL formed over the top surface Sa of the semiconductor substrate SS so as to cover the trench gate electrodes TG1 and TG2, between the trenches T1 and T2 in plan view, the contact trench CT is formed. The contact trench CT not only extends through the interlayer insulating film IL, but also is cut into a part of the region of the semiconductor substrate SS which is interposed between the trenches T1 and T2. Specifically, the contact trench CT extends through the n⁺-type emitter region NE so that the bottom surface of the contact trench CT is located at a middle point along the thickness of the p-type body region PB. The depth position of the bottom surface of the contact trench CT is deeper than that of the upper surface (i.e., pn junction surface between the n⁺-type emitter region NE and the p-type body region PB) and shallower than the bottom surface (i.e., pn junction surface between the p-type body region PB and the n-type hole barrier region HB1) of the p-type body region PB.

In the region of the semiconductor substrate SS which is interposed between the trenches T1 and T2, in the area in contact with the bottom surface of the contact trench CT, the p⁺-type body contact region PBC is formed. Under the p⁺-type body contact region PBC, the p⁺-type latch-up prevention region PLP is formed. The p⁺-type latch-up prevention region PLP is interposed between the p⁺-type body contact region PBC and the n-type hole barrier region HB1 and in contact with the p⁺-type body contact region PBC, the p-type body region PB, and the n-type hole barrier region HB1. The p⁺-type latch-up prevention region PLP is formed to extend from a part of the p-type body region PB to a part of the n-type hole barrier region HB1. The depth position of the lower surface of the p⁺-type latch-up prevention region PLP is deeper than the boundary (pn junction surface) between the p-type body region PB and the n-type hole barrier region HB1. Consequently, a state is provided in which, between the coupling electrode VE1 and the n-type hole barrier region HB1, the p$^+$-type body contact region PBC and the p$^+$-type latch-up prevention region PLP are interposed. A p-type semiconductor region including the p-type body region PB, the p$^+$-type body contact region PBC, and the p$^+$-type latch-up prevention region PLP forms a p-type emitter region in the IGBT. However, among the p-type body region PB, the p$^+$-type body contact region PBC, and the p$^+$-type latch-up prevention region PLP, the p-type body region PB is adjacent to the trenches T1 and T2. The p$^+$-type body contact region PBC and the p$^+$-type latch-up prevention region PLP each having an impurity concentration higher than that of the p-type body region PB are adjacent to neither the trenches T1 and T2 nor the gate insulating film GI.

The p$^+$-type body contact region PBC and the p$^+$-type latch-up prevention region PLP are preferably formed, but either one or both thereof can also be omitted. In the case where the p$^+$-type body contact region PBC is omitted, the bottom surface of the coupling electrode VE1 is consequently adjacent to the p$^+$-type latch-up prevention region PLP. Conversely, in the case where the p$^+$-type latch-up prevention region PLP is omitted, the p$^+$-type body contact region PBC is consequently in contact with the p-type body region PB except for the area thereof in contact with the coupling electrode VE1. On the other hand, when both of the p$^+$-type body contact region PBC and the p$^+$-type latch-up prevention region PLP are omitted, the bottom surface of the coupling electrode VE1 is in contact with the p-type body region PB. Irrespective of whether or not either one or both of the p$^+$-type body contact region PBC and the p$^+$-type latch-up prevention region PLP are omitted, the coupling electrode VE1 is electrically coupled to each of the p-type body region PB and the n$^+$-type emitter region NE.

A cross-sectional structure (corresponding to the cross-sectional structure in the active cell region LCa in FIG. 6) in the inactive section LCai of the active cell region LCa is the same as a cross-sectional structure (corresponding to the cross-sectional structure in the active cell region LCa in FIG. 5) in the active section LCaa of the active cell region LCa except that the n$^+$-type emitter region NE is not provided. That is, the cross-sectional structure in the active cell region LCa (inactive section LCai) in FIG. 6 is the same as the cross-sectional structure in the active cell region LCa (active section LCaa) in FIG. 5 except that, in the region of the semiconductor substrate SS which is interposed between the trenches T1 and T2, the n$^+$-type emitter region NE is not provided and the p-type body region PB is formed up to the top surface Sa.

The following is the outline of the cross-sectional structure (corresponding to the cross-sectional structure in the hole collector cell region LCa in FIGS. 5 and 6) in the hole collector cell region LCa.

The cross-sectional structure (corresponding to the cross-sectional structure in the hole collector cell region LCc in each of FIGS. 5 and 6) in the hole collector cell region LCc is similar to the cross-sectional structure (corresponding to the cross-sectional structure in the active cell region LCa in FIG. 6) in the active cell region LCa in the inactive section LCai. That is, the cross-sectional structure in the hole collector cell region LCc in FIGS. 5 and 6 is the same as the cross-sectional structure in the active cell region LCa (inactive section LCai) in FIG. 6 except that, in the region of the semiconductor substrate SS which is interposed between the trenches (T3 and T4), the n$^+$-type emitter region NE is not provided and the p-type body region PB is formed up to the top surface Sa. Consequently, in the portion of the semiconductor substrate SS which is interposed between the trenches T3 and T4, the n-type semiconductor region (n-type emitter region) electrically coupled to the emitter region EE is not formed over the p-type body region PB.

However, the cross-sectional structure in the hole collector cell region LCc in FIGS. 5 and 6 is different from the cross-sectional structure in the active cell region LCa (inactive section LCai) in FIG. 6 in that, instead of the n-type hole barrier region HB1, the n-type hole barrier region HB2 having the impurity concentration higher than that of the n-type hole barrier region HB1 is formed. Also, in the trenches T1 and T2 in the active cell region LCa, the trench gate electrodes TG1 and TG2 electrically coupled to the gate line GL (gate electrode GE) are embedded each via the gate insulating film GI. By contrast, in the trenches T3 and T4 in the hole collector cell region LCc equivalent to the trenches T1 and T2 in the active cell region LCa, the trench gate electrodes TG3 and TG4 electrically coupled to the emitter electrode EE, not to the gate line GL (gate electrode GE), are embedded each via the gate insulating film GI. The cross-sectional structure in the hole collector cell region LCc in FIGS. 5 and 6 is otherwise the same as the cross-sectional structure (corresponding to the cross-sectional structure in the active cell region LCa in FIG. 6) in the inactive section LCai of the active cell region LCa.

That is, as shown in FIGS. 5 and 6, in the hole collector cell region LCc, in the region of the semiconductor substrate SS which is interposed between the trenches T3 and T4, the p-type body region PB is formed up to the top surface Sa. Under the p-type body region PB, the n-type hole barrier region HB2 is formed. Under the n-type hole barrier region HB2, the n$^-$-type drift region ND is present. Under the n$^-$-type drift region ND, the n-type field stop layer NS is formed. Under the n-type field stop layer NS, the p$^+$-type collector layer PC is formed. The p$^+$-type collector layer PC is the lowermost layer in the semiconductor substrate SS. Over the back surface Sb of the semiconductor substrate SS, the back-surface electrode BE is formed so as to come in contact with the p$^+$-type collector layer PC. In the trench T3 formed in the semiconductor substrate SS, the trench gate electrode TG3 is formed via the gate insulating film GI. In the trench T4 formed in the semiconductor substrate SS, the trench gate electrode TG4 is formed via the gate insulating film GI.

In the interlayer insulating film IL formed over the top surface Sa of the semiconductor substrate SS so as to cover the trench gate electrodes TG3 and TG4, the contact trench CT is disposed between the trenches T3 and T4 in plan view. The contact trench CT not only extends through the interlayer insulating film IL, but also is cut into a part of the region of the semiconductor substrate SS which is interposed between the trenches T3 and T4. The bottom surface of the contact trench CT is located at a middle point along the thickness of the p-type body PB. The depth position of the bottom surface of the contact trench CT is deeper than that of the upper surface (i.e., the top surface of the semiconductor substrate SS) of the p-type body region PB and shallower than that of the bottom surface (i.e., pn junction surface between the p-type body region PB and the n-type hole barrier region HB2) of the p-type body region PB.

In the region of the semiconductor substrate SS interposed between the trenches T3 and T4, in the area in contact with the bottom surface of the contact trench CT, the p$^+$-type body contact region PBC is formed. Under the p$^+$-type body contact region PBC, the p$^+$-type latch-up prevention region PLP is formed. The p$^+$-type latch-up prevention region PLP is interposed between the p$^+$-type body contact region PBC and the n-type hole barrier region HB2 and in contact with the p$^+$-type body contact region PBC, the p-type body region PB, and the n-type hole barrier region HB2. The p$^+$-type latch-up prevention region PLP is formed to extend from a part of the p-type body region PB to a part of the n-type hole barrier region HB2. The depth position of the lower surface of the p$^+$-type latch-up prevention region PLP is deeper than that of the boundary (pn junction surface) between the p-type body region PB and the n-type hole barrier region HB2. Accordingly, a state is provided in which, between the coupling electrode VE2 and the n-type hole barrier region HB2, the p$^+$-type body contact region PBC and the p$^+$-type latch-up prevention region PLP are interposed. In the hole collector cell region LCc, the coupling electrode VE2 embedded in the contact trench CT has the side surfaces thereof in contact with the p-type body region PB and the bottom surface thereof in contact with the p$^+$-type body contact region PBC and is electrically coupled to the p$^+$-type body contact region PBC, the p$^+$-type latch-up prevention region PLP, and the p-type body region PB. The hole collector cell region LCc is the same as the active cell region LCa in that the p$^+$-type body contact region PBC and the p$^+$-type latch-up prevention region PLP are preferably formed, but either one or both thereof can also be omitted.

Note that, in the cross section of FIG. 7, in the hole collector cell region LCc, the trench gate electrodes TG3 and TG4 are connected via the connection trench gate electrode TGc formed integrally therewith. Over the connection trench gate electrode TGc, the contact hole CT is provided and the connection trench gate electrode TGc is electrically coupled to the portion of the emitter electrode EE which is embedded in the contact trench CT.

Also, in FIG. 7, in the connection trench gate electrode TGc, the p-type semiconductor region which was formed simultaneously when the p$^+$-type body contact region PBC and the p$^+$-type latch-up prevention region PLP were formed is formed. However, depending on the conductivity type of the conductive film forming the connection trench gate electrode TGc, the formation of such a p-type semiconductor region can also be omitted. In either case, the connection trench gate electrode TGc may appropriately be electrically coupled to the emitter electrode EE through the contact trench CT.

<Configuration and Operation of IGBT>

Figure 8:
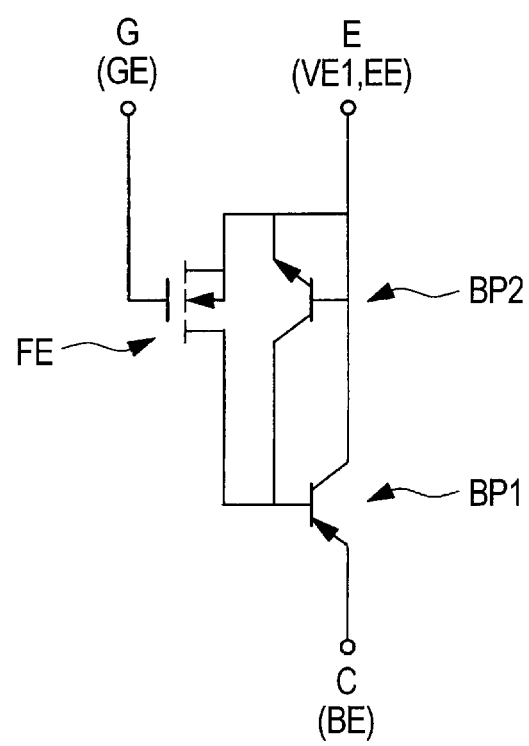
FIG. 8 is an equivalent circuit diagram of an IGBT.

FIG. 8 is an equivalent circuit diagram of the IGBT formed in the active cell region LCa.

A description will be given of a circuit configuration of the IGBT formed in the semiconductor substrate SS with reference to FIG. 8 and FIG. 5 described above. Note that the reference mark E in FIG. 8 denotes an emitter electrode. The coupling electrode VE1 formed in the active region LCa in FIG. 5 described above or the emitter electrode EE electrically coupled to the coupling electrode VE1 corresponds to the emitter electrode E. Also, the reference mark C in FIG. 8 denotes a collector electrode and the foregoing back-surface electrode BE corresponds to the collector electrode C. Also, the reference mark G in FIG. 8 denotes a gate electrode and the foregoing gate line GL or the foregoing gate electrode GE electrically coupled to the gate line GL corresponds to the gate electrode G.

As shown in FIG. 8, the IGBT formed in the active cell region LCa has a pnp bipolar transistor BP1, an npn bipolar transistor BP2, and a field effect transistor FE. The pnp bipolar transistor BP1 and the field effect transistor FE are included in the IGBT. The npn bipolar transistor BP2 is a parasitic transistor parasitically formed in terms of a device structure.

The pnp bipolar transistor BP1 includes the p-type semiconductor region (p-type emitter region) including the p-type body region PB, the p$^+$-type body contact region PBC, and the p$^+$-type latch-up prevention region PLP, an n-type semiconductor region (n-type base region) including the n-type hole barrier region HB1, the n$^-$-type drift region ND, and the n-type field stop layer NS, and a p-type semiconductor region (p-type collector region) formed of the p$^+$-type collector layer PC.

The npn bipolar transistor BP2 as a parasitic component includes an n-type semiconductor region (n-type emitter region) formed of the n$^+$-type emitter region NE, the p-type semiconductor region (p-type base region) formed of the p-type body region PB, the p$^+$-type body contact region PBC, and the p$^+$-type latch-up prevention region PLP, and an n-type semiconductor region (n-type collector region) including the n-type hole barrier region HB1, the n$^-$-type drift region ND, and the n-type field stop layer NS.

The field effect transistor FE includes the n$^+$-type emitter region NE serving as a source region, the n-type hole barrier region HB1 serving as a drain region, the gate insulating film GI formed over each of the inner walls of the trenches T1 and T2, and the trench gate electrodes TG1 and TG2 embedded in the trenches T1 and T2 each via the gate insulating film GI. The gate electrode of the field effect transistor FE includes the trench gate electrodes TG1 and TG2. The portion of the p-type body region PB which is located between the n$^+$-type emitter region NE and the n-type hole barrier region HB1 and faces the trench gate electrodes TG1 and TG2 via the gate insulating film GI serves as a region where the channel of the field effect transistor FE is to be formed.

Next, a description will be given of coupling relationships between the pnp bipolar transistor BP1, the npn bipolar transistor BP2, and the field effect transistor FE.

Between the emitter electrode E and the collector electrode C, the pnp bipolar transistor BP1 is coupled. The n-type base of the pnp bipolar transistor BP1 is coupled to the drain region of the field effect transistor FE, while the source region of the field effect transistor FE is coupled to the emitter electrode E. At this time, the n-type collector of the npn bipolar transistor BP2 parasitically formed is coupled to the n-type base of the pnp bipolar transistor BP1, the n-type emitter of the npn bipolar transistor BP2 is coupled to the emitter electrode E, and the p-type base of the npn bipolar transistor BP2 is coupled to the emitter electrode E.

Next, a description will be given of an operation of the IGBT with reference to FIG. 8.

With a potential higher than at the emitter electrode E being applied to the collector electrode C, a gate voltage of not less than a threshold voltage is applied to the gate electrode of the field effect transistor FE via the gate electrode G. As a result, the field effect transistor FE is turned ON so that a base current flows in the pnp bipolar transistor BP1. Consequently, between the collector electrode C to which the pnp bipolar transistor BP1 is coupled and the emitter electrode E, a current flows. That is, the pnp bipolar transistor BP1 is turned ON (brought into an conductive state). Thus, the IGBT is turned ON (brought into the conductive state). Subsequently, to the gate electrode of the field effect transistor FE, a gate voltage of not more than the threshold voltage is applied. As a result, the field effect transistor FE is turned OFF so that the base current in the pnp bipolar transistor BP1 no longer flows. Consequently, the current flowing between the collector electrode C and the emitter electrode E on the basis of the base current no longer flows. That is, as a result of the turning OFF of the pnp bipolar transistor BP1, the IGBT is turned OFF. Thus, in the IGBT, by controlling the turning ON/OFF of the field effect transistor FE, the supply and cutoff of the base current in the pnp bipolar transistor BP1 is controlled. By the supply and cutoff of the base current in the pnp bipolar transistor BP1, the supply and cutoff of a collector current in the pnp bipolar transistor BP1 is consequently controlled so that the turning ON/OFF of the IGBT is controlled. Accordingly, the IGBT is a semiconductor element having both the high-speed switching property of the field effect transistor FE and the voltage drive property thereof and the low-ON-voltage property of the pnp bipolar transistor BP1.

Next, a description will be given of an operation in a device structure with reference to FIG. 5.

With a potential higher than at the emitter electrode EE (emitter electrode E) being applied to the back-surface electrode BE (collector electrode C), a gate voltage of not less than the threshold voltage is applied to the trench gate electrodes TG1 and TG2 via the gate electrode GE and the gate line GL. As a result, in the p-type body region PB facing the trench gate electrodes TG1 and TG2 through the gate insulating film GI, an inversion layer (channel) made of an n-type semiconductor layer is formed. Consequently, the $n^+$-type emitter region NE is electrically coupled to the n-type hole barrier region HB1 via the inversion layer (channel) and electrons flow from the $n^+$-type emitter region NE to the n-type base region (the n-type hole barrier region HB1, the $n^-$-type drift region ND, and the n-type field stop layer NS) via the inversion layer. On the other hand, a forward bias is applied between the n-type base region (HB1, ND, NS) and the $p^+$-type collector layer PC so that positive holes (holes) are injected from the $p^+$-type collector layer PC into the n-type base region (NS, ND, and HB1). Consequently, in the n-type base region (NS, ND, and HB1), the holes are stored. As a result of the attraction of the electrons by positive charges resulting from the stored holes, a large number of electrons flow into the n-type base region (HB1, ND, and NS) to thus reduce the resistance of the base region (HB1, ND, and NS). This phenomenon is a so-called conductivity modulation which reduces the resistance of the n-type base region (HB1, ND, and NS). The phenomenon is so-called conductivity modulation. The conductivity modulation reduces the ON voltage (corresponding to the potential difference between the emitter electrode E and the collector electrode C in an ON state) of the IGBT. Then, the holes that have flown into the n-type base region (NS, ND, and HB1) flow out into the emitter electrode EE via the p-type semiconductor regions (the p-type body region PB, the $p^+$-type latch-up prevention region PLP, and the $p^+$-type body contact region PBC). Thus, a current flows from the back-surface electrode BE into the emitter electrode EE to turn ON the IGBT. At this time, it can be considered that the holes injected from the $p^+$-type collector layer PC into the n-type base region (NS, ND, and HB1) are recombined with the electrons present in the n-type base region (NS, ND, and HB1). However, a semiconductor material containing silicon as a main component has a property such that electron-hole recombination is less likely to occur therein than in a semiconductor material containing a compound semiconductor as a main component. Accordingly, the majority of the holes injected into the n-type base region (NS, ND, and HB1) are stored without being recombined with the electrons present in the n-type base region (NS, ND, and HB1). As a result, the holes are stored in the n-type base region (NS, ND, and HB1) and the electrons that have flown from the $n^+$-type emitter region NE in such a manner as to be attracted by the stored holes are stored in the n-type base region (HB1, ND, and NS) to cause the conductivity modulation. From the foregoing, it can be said that the IGBT has the characteristic feature that the ON voltage thereof is reduced by the conductivity modulation.

A plurality of the active cell regions LCa where such IGBTs are formed are formed and regularly placed (arranged) in the foregoing cell formation region CR of the semiconductor substrate SS to provide a state where the plurality of unit IGBTs are coupled in parallel between the emitter electrode EE and the back-surface electrode BE. The IGBT formed in each of the active cell regions LCa is referred to as the unit IGBT. The gate electrodes (trench gate electrodes TG1 and TG2) of the plurality of unit IGBTs are electrically coupled to each other via the gate line GL and electrically coupled to the common gate pad PDG (gate electrode GE) through the gate line GL. The plurality of unit IGBTs coupled in parallel form one power transistor (power IGBT) between the emitter electrode EE and the back-surface electrode BE and accordingly between the emitter pad PDE and the back-surface electrode BE.

In addition, by providing the hole collector cell region LCc in the cell formation region CR of the semiconductor substrate SS, it is possible to obtain the following effect.

That is, as described above, in the ON state of the IGBT, holes are stored in the n-type base region (the n-type field stop layer NS, the $n^-$-type drift region ND, and the n-type hole barrier region HB1). To switch the IGBT from the ON state to an OFF state, the voltage of each of the trench gate electrodes TG1 and TG2 is set to a value of not more than the threshold. However, even when the voltage of each of the trench gate electrodes TG1 and TG2 is set to a value of not more than the threshold, the IGBT is not immediately turned OFF. The turning OFF is delayed by the time period required by the holes stored in the n-type base region to flow to the outside of the IGBT. Note that the phenomenon in which, in the IGBT, after the application of an OFF voltage to the gate electrode (which is the trench gate electrodes TG1 and TG2 herein), a current is not immediately shut off but a given time period is required until the IGBT is completely turned OFF is referred to as a turn OFF loss. Accordingly, when an OFF operation which sets the voltage of each of the trench gate electrodes TG1 and TG2 to a value of not more than the threshold is performed, to promptly turn OFF the IGBT and rapidly prevent the current from flowing, it is desirable to swiftly discharge the holes stored in the n-type base region to the outside of the IGBT.

In the case where the hole collector cell region LCc is provided, the hole collector cell region LCc also serves as a discharge path for holes. In the present embodiment, the hole collector cell region LCc is provided. As a result, when the OFF operation is performed, the holes stored in the n-type base region can be discharged also from the hole collector cell region LCc into the emitter electrode EE. That is, the holes stored in the n-type base region (the n-type field stop layer NS, the $n^-$-type drift region ND, and the n-type hole barrier regions HB1 and HB2) can be discharged into the emitter electrode EE via the n-type hole barrier region HB2 of the hole collector cell region LCc and the p-type semiconductor region (the p-type body region PB, the $p^+$-type latch-up prevention region PLP, and the $p^+$-type body contact region PBC) over the n-type hole barrier region HB2. Accordingly, the hole collector cell region LCc can also be regarded as a hole discharge cell region (carrier discharge cell region).

Since the hole collector cell region LCc is provided, during an OFF operation, paths for discharging the holes stored in the n-type base region to the outside of the IGBT accordingly increase. As a result, when the OFF operation is performed, the holes stored in the n-type base region are more easily discharged to the outside of the IGBT. Accordingly, it is possible to shorten (reduce) the time period (turn OFF loss) between the time when the OFF operation is performed and the time when the IGBT is turned OFF and the current no longer flows. A reduction in the turn OFF loss in the IGBT leads to an improvement in the switching speed of the IGBT. Therefore, it is possible to improve the performance of the semiconductor device.

However, in the case where the hole collector cell region LCc is provided, some of the holes stored in the n-type base region may be discharged from the hole collector cell region LCc upon the turning ON of the IGBT. When the holes stored in the n-type base region are discharged from the hole collector cell region LCc upon the turning ON of the IGBT, the ON voltage of the IGBT tends to increase.

Accordingly, by giving priority to the ON voltage of the IGBT or to the switching speed thereof, the number of the hole collector cell regions LCc or the like can be selected. For example, in the case of FIG. 4, the hole collector cell regions LCc are disposed between the active cell regions LCa adjacent to each other in the X-direction. However, in another form, it is also possible to provide a portion where the hole collector cell region LCc is disposed between the active cell regions LCa adjacent to each other in the X-direction and a portion where the hole collector cell region LCc is not disposed between the active cell regions LCa adjacent to each other in the X-direction in mixed relation.

<About Manufacturing Process of Semiconductor Device>

Next, a description will be given of a manufacturing process of the semiconductor device in the present embodiment with reference to FIGS. 9 to 26. FIGS. 9 to 26 are main-portion cross-sectional views of the semiconductor device in the present embodiment during the manufacturing process thereof, which show cross-sectional views of a region corresponding to FIG. 5 described above.

Figure 9:
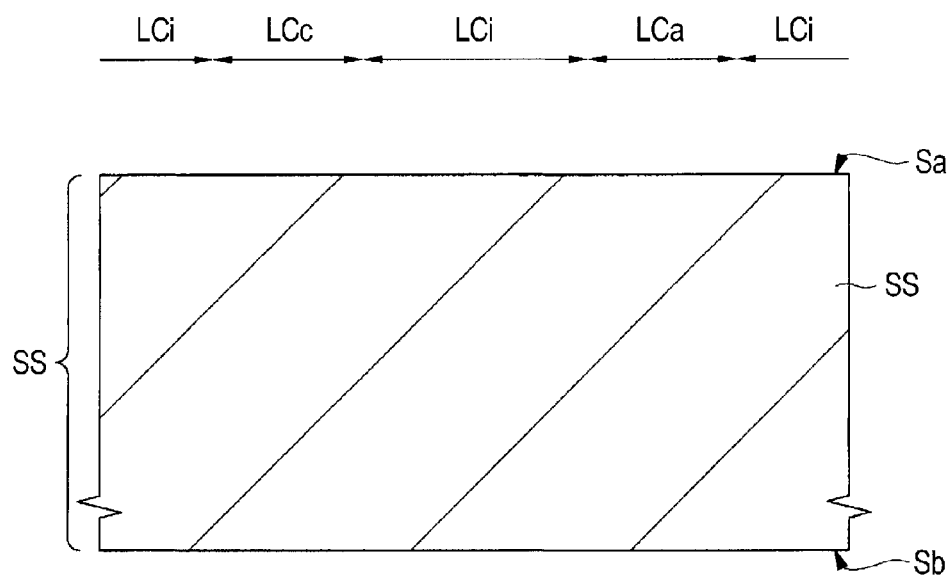
FIG. 9 is a main-portion cross-sectional view of the semiconductor device in the embodiment during the manufacturing process thereof.

To manufacture the semiconductor device, first, as shown in FIG. 9, the semiconductor substrate SS (semiconductor wafer) made of n-type monocrystalline silicon into which an n-type impurity such as, e.g., phosphorus (P) has been introduced is provided. The semiconductor substrate SS has the top surface Sa as one main surface and the back surface Sb as the main surface opposite to the top surface Sa.

The impurity concentration of the n-type impurity in the semiconductor substrate SS can be set to, e.g., about $2\times10^{14}$ cm$^{-3}$. At this stage, the semiconductor substrate SS is a semiconductor thin plate having a generally circular plan shape referred to as a wafer. The thickness of the semiconductor substrate SS can be set to, e.g., about 450 μm to 1000 μm.

Figure 10:
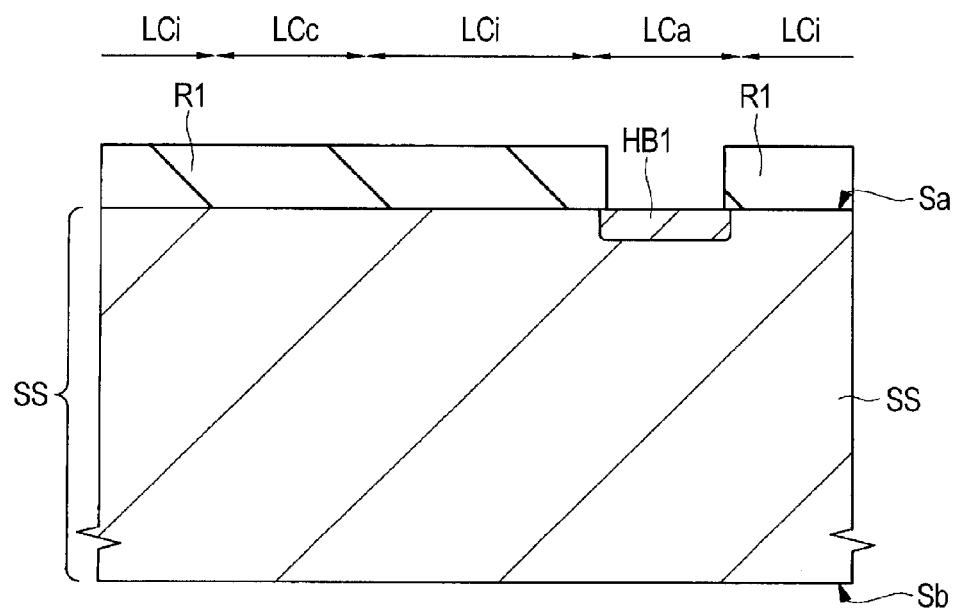
FIG. 10 is a main-portion cross-sectional view of the semiconductor device during the manufacturing process thereof, which is subsequent to FIG. 9.

Next, as shown in FIG. 10, using a photolithographic technique, over the top surface Sa of the semiconductor substrate SS, a resist pattern R1 for forming the n-type hole barrier region HB1 is formed. The photolithographic technique is a technique which forms a resist film (photoresist film) over the entire main surface of a semiconductor substrate by a coating method or the like, exposes the resist film to light, develops the exposed resist film, and patterns the developed resist film to thus provide an intended resist pattern (photoresist pattern).

The resist pattern R1 has an opening which exposes the region of the top surface Sa of the semiconductor substrate SS where the n-type hole barrier region HB1 is to be formed.

The region where the n-type hole barrier region HB2 is to be formed is covered with the resist pattern R1.

Next, using the resist pattern R1 as a mask (ion implantation blocking mask), an n-type impurity (e.g., phosphorus (P)) is introduced into the semiconductor substrate SS from the top surface Sa of the semiconductor substrate SS by, e.g., an ion implantation method to form the n-type hole barrier region HB1 in the semiconductor substrate SS. Then, the unneeded resist pattern R1 is removed by asking or the like.

Figure 11:
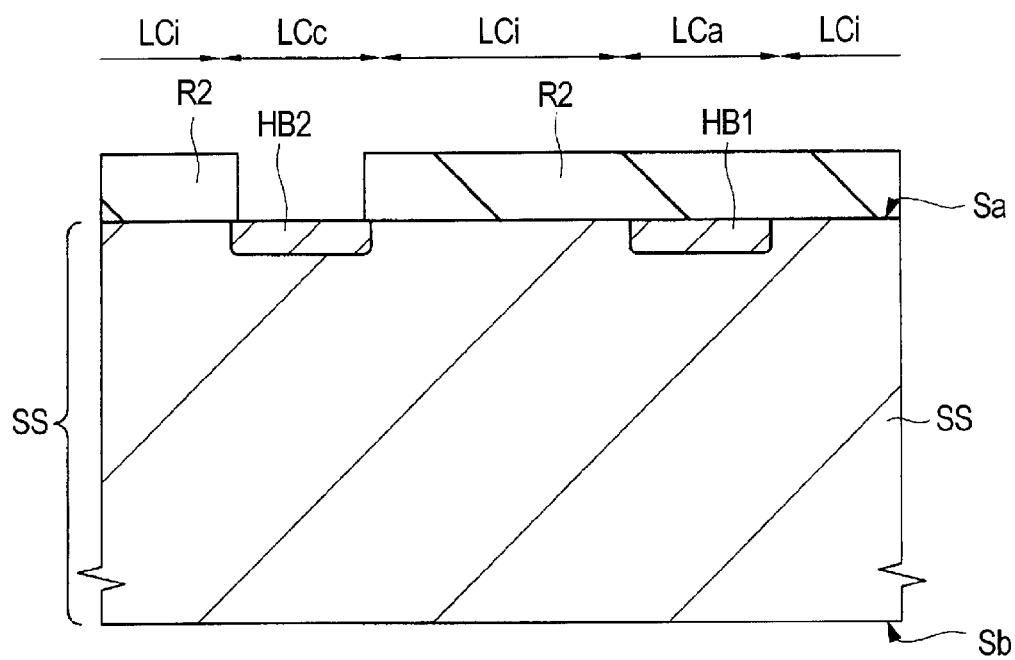
FIG. 11 is a main-portion cross-sectional view of the semiconductor device during the manufacturing process thereof, which is subsequent to FIG. 10.

Next, as shown in FIG. 11, using a photolithographic technique, over the top surface Sa of the semiconductor substrate SS, a resist pattern R2 for forming the n-type hole barrier region HB2 is formed.

The resist pattern R2 has an opening which exposes the region of the top surface Sa of the semiconductor substrate SS where the n-type hole barrier region HB2 is to be formed. The region where the n-type hole barrier region HB1 is to be formed is covered with the resist pattern R2.

Next, using the resist pattern R2 as a mask (ion implantation blocking mask), an n-type impurity (e.g., phosphorus (P)) is introduced from the top surface Sa of the semiconductor substrate Sa into the semiconductor substrate SS by, e.g., an ion implantation method to form the n-type hole barrier region HB2 in the semiconductor substrate SS. Then, the unneeded resist pattern R2 is removed by asking or the like.

As described above, in the manufactured semiconductor device, the impurity concentration of the n-type hole barrier region HB2 is higher than the impurity concentration of the n-type hole barrier region HB1. To achieve this, a dose in ion implantation (ion implantation in FIG. 11) for forming the n-type hole barrier region HB2 is set higher than a dose in ion implantation (ion implantation in FIG. 10) for forming the n-type hole barrier region HB1. As a result, the impurity concentration (n-type impurity concentration) of the formed n-type hole barrier region HB2 is higher than the impurity concentration (n-type impurity concentration) of the formed n-type hole barrier region HB1.

In the manufactured semiconductor device, the impurity concentration (n-type impurity concentration) of the n-type hole barrier region HB2 is preferably about twice to twenty-five times the impurity concentration (n-type impurity concentration) of the n-type hole barrier region HB1. Accordingly, the dose in the ion implantation for forming the n-type hole barrier region HB2 is preferably about twice to twenty-five times the dose in the ion implantation for forming the n-type hole barrier region HB1.

For example, the dose in the ion implantation for forming the n-type hole barrier region HB1 can be set to about $7\times10^{12}/\text{cm}^{-2}$ and the dose in the ion implantation for forming the n-type hole barrier region HB2 can be set to about twice to twenty-five times as high as about $7\times10^{12}/\text{cm}^{-2}$.

The implantation energy in the ion implantation for forming the n-type hole barrier region HB2 and the implantation energy in the ion implantation for forming the n-type hole barrier region HB1 can be set to substantially the same value (e.g., about 80 keV). In that case, the depth of the bottom surface of the n-type hole barrier region HB1 is substantially the same as the depth of the bottom surface of the n-type hole barrier region HB2.

The description has been given heretofore of the case where the n-type hole barrier region HB1 is formed first and then the n-type hole barrier region HB2 is formed. In another form, it is also possible to reverse the order of the step of forming the n-type hole barrier region HB1 and the step of forming the n-type hole barrier region HB2 to thus form the n-type hole barrier region HB2 first and then form the n-type hole barrier region HB1. In that case, it follows that, after the step of forming the resist pattern R2, the ion implantation step for forming the n-type hole barrier region HB2, and the step of removing the resist pattern R2 are successively performed, the step of forming the resist pattern R1, the ion implantation step for forming the hole barrier region HB1, and the step of removing the resist pattern R1 are successively performed.

Figure 12:
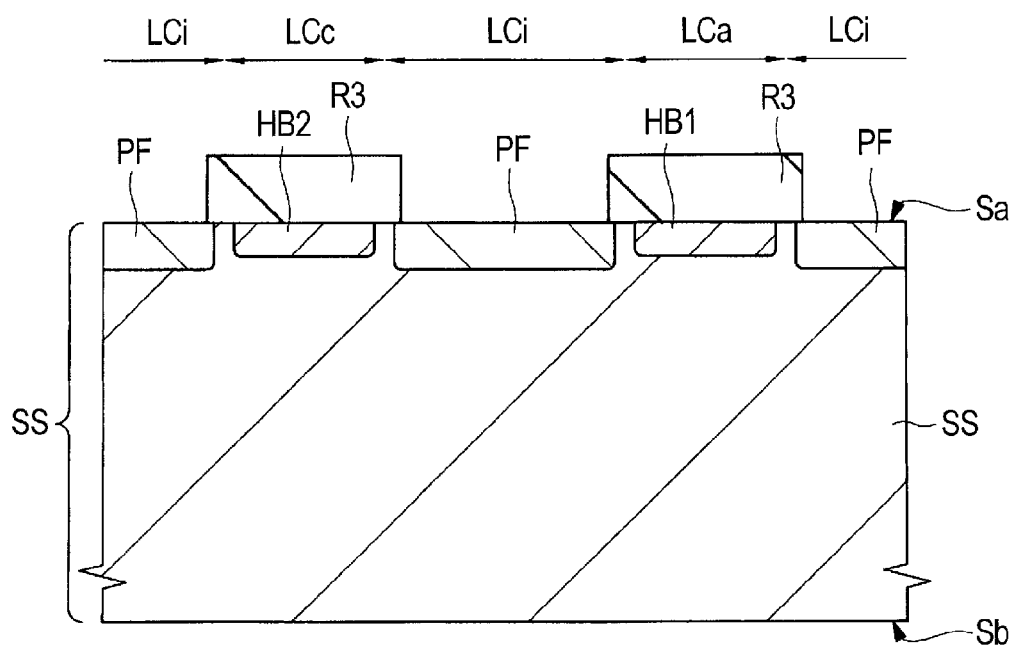
FIG. 12 is a main-portion cross-sectional view of the semiconductor device during the manufacturing process thereof, which is subsequent to FIG. 11.

Next, as shown in FIG. 12, using a photolithographic technique, a resist pattern R3 for forming the p-type floating regions PF is formed over the top surface Sa of the semiconductor substrate SS. The resist pattern R3 has openings which expose the regions of the top surface Sa of the semiconductor substrate SS where the p-type floating regions PF are to be formed.

Next, using the resist pattern R3 as a mask, a p-type impurity (e.g., boron (B)) is introduced from the top surface Sa of the semiconductor substrate SS into the semiconductor substrate SS by, e.g., an ion implantation method to form the p-type floating regions PF in the semiconductor substrate SS. Then, the unneeded resist pattern R3 is removed by asking or the like. Note that, when the p-type floating regions PF are formed by ion implantation, e.g., the foregoing p-type floating regions PFp, the floating field rings, and the like can also be formed simultaneously.

Figure 13:
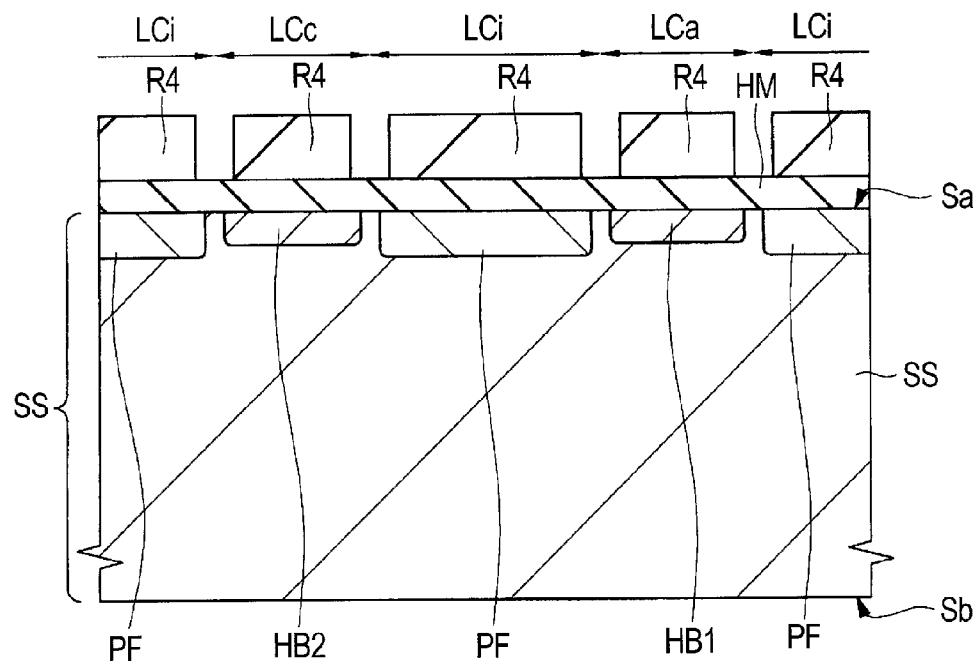
FIG. 13 is a main-portion cross-sectional view of the semiconductor device during the manufacturing process thereof, which is subsequent to FIG. 12.

Next, as shown in FIG. 13, over the entire top surface Sa of the semiconductor substrate SS, a hard mask film (insulating film) HM made of, e.g., silicon dioxide is formed by, e.g., a CVD (Chemical Vapor Deposition) method or the like.

Figure 14:
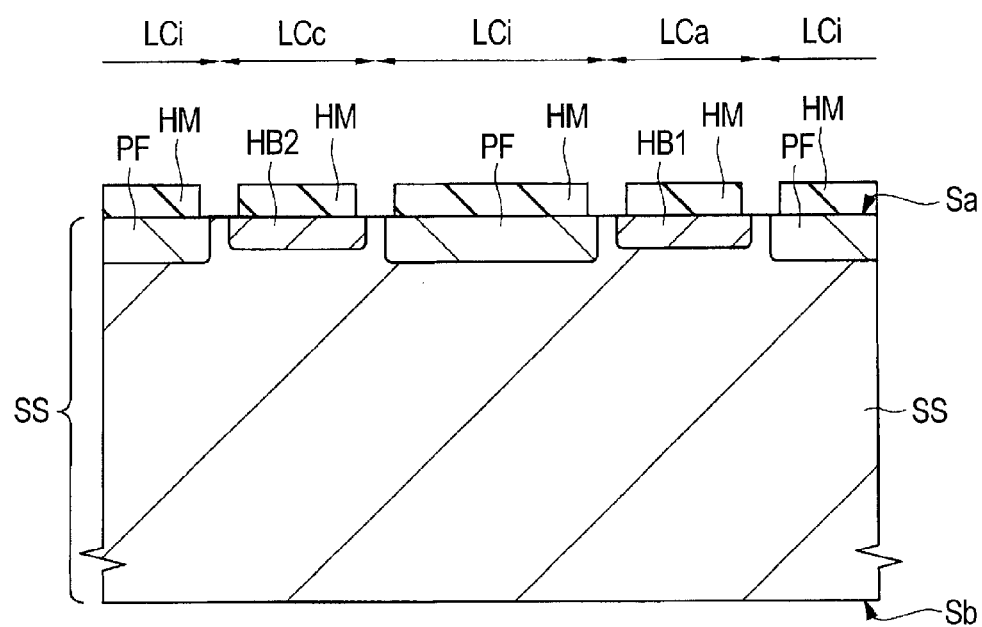
FIG. 14 is a main-portion cross-sectional view of the semiconductor device during the manufacturing process thereof, which is subsequent to FIG. 13.

Next, as shown in FIG. 13, over the hard mask film HM, a resist pattern R4 is formed using a photolithographic technique. Then, using the resist pattern R4 as an etching mask, the hard mask film HM is etched (e.g., dry-etched) to be patterned. Then, the unneeded resist pattern R4 is removed by asking or the like. FIG. 14 shows the semiconductor device at this stage.

Figure 15:
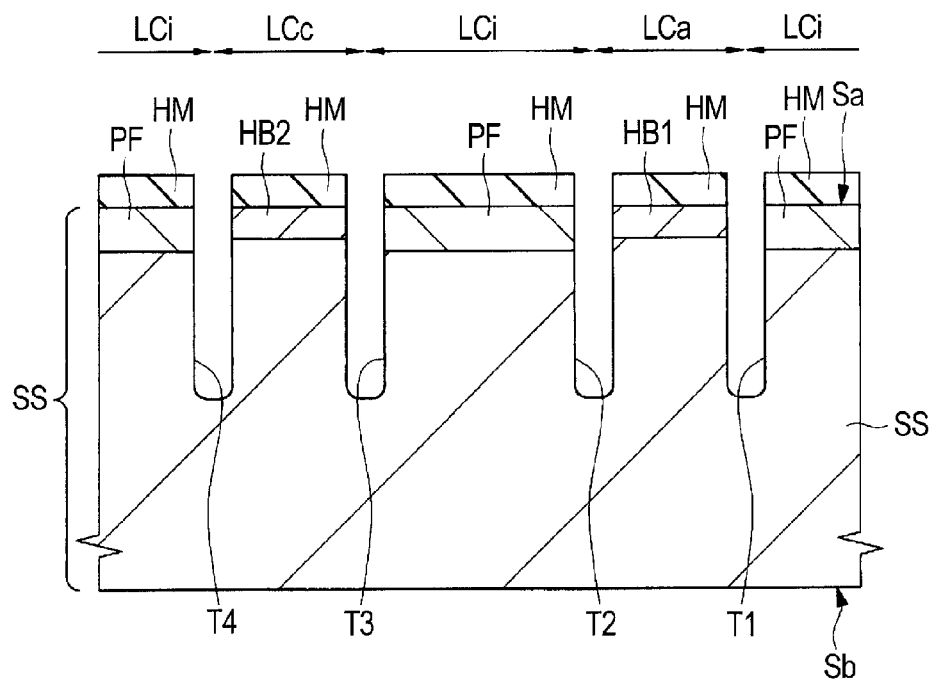
FIG. 15 is a main-portion cross-sectional view of the semiconductor device during the manufacturing process thereof, which is subsequent to FIG. 14.
Figure 16:
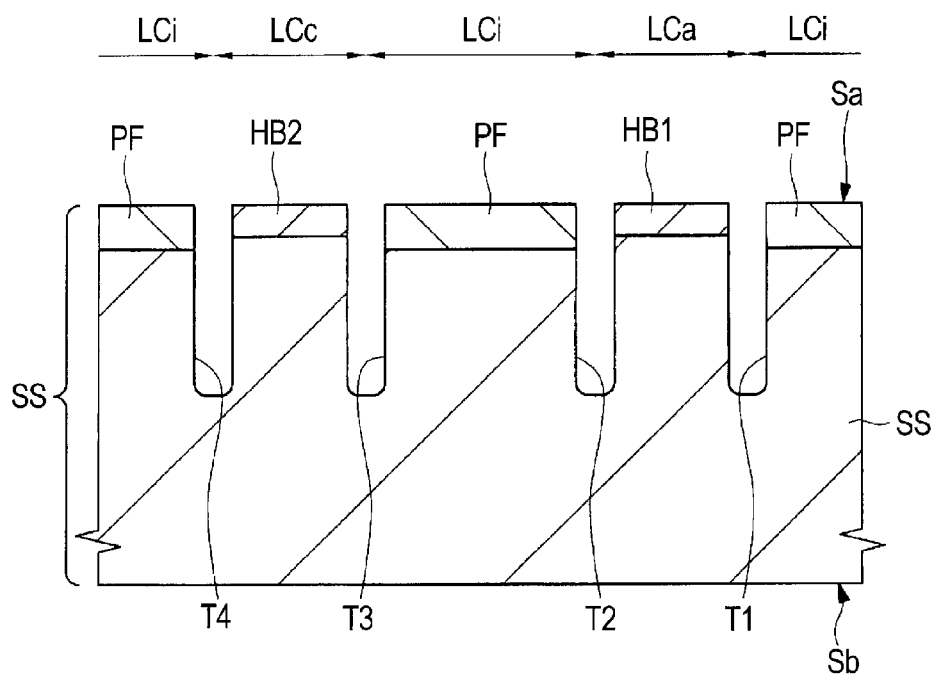
FIG. 16 is a main-portion cross-sectional view of the semiconductor device during the manufacturing process thereof, which is subsequent to FIG. 15.

Next, as shown in FIG. 15, using the patterned hard mask film HM as an etching mask, the semiconductor substrate SS is etched (e.g., anisotropically dry-etched) to be formed with the trenches T1, T2, T3, and T4. Then, as shown in FIG. 16, the unneeded hard mask film HM is removed by wet etching or the like.

Figure 17:
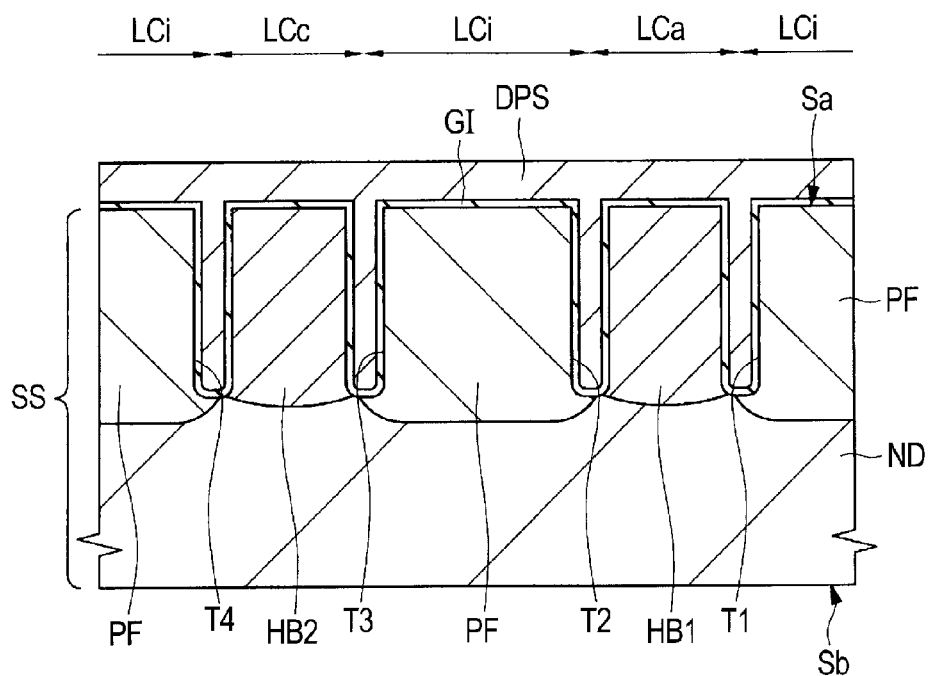
FIG. 17 is a main-portion cross-sectional view of the semiconductor device during the manufacturing process thereof, which is subsequent to FIG. 16.

Next, as shown in FIG. 17, extensive diffusion (thermal diffusion) is performed on the p-type floating regions PF and the n-type hole barrier regions HB1 and HB2. This can be performed by performing heat treatment (heat treatment at a temperature of, e.g., 1200° C. for about 30 minutes) on the semiconductor substrate SS. By the heat treatment, in the semiconductor substrate SS, the p-type impurity introduced into the p-type floating regions PF and the n-type impurity introduced in the n-type hole barrier regions HB1 and HB2 are diffused in a depth direction. Consequently, the respective depths (depth positions of the bottom surfaces) of the p-type floating regions PF and the n-type hole barrier regions HB1 and HB2 are deeper after the heat treatment than before the heat treatment. After the heat treatment, the depth of the bottom surface of the n-type hole barrier region HB1 is substantially the same as the depth of the bottom surface of the n-type hole barrier region HB2.

When the extensive diffusion (thermal diffusion) is performed, a state is provided in which, in substantially the entire portion of the semiconductor substrate SS which is interposed between the trenches T1 and T2, the n-type hole barrier region HB1 is formed and, in substantially the entire portion of the semiconductor substrate SS which is interposed between the trenches T3 and T4, the n-type hole barrier region HB2 is formed. At this stage also, the relationship between the impurity concentration (n-type impurity concentration) of the n-type hole barrier region HB1 and the impurity concentration (n-type impurity concentration) of the n-type hole barrier region HB2 which is higher than the impurity concentration (n-type impurity) of the n-type hole barrier region HB1 is maintained. Of the semiconductor substrate SS, the region where the p-type floating regions PF and the n-type hole barrier regions HB1 and HB2 are not formed serves as the n$^-$-type drift region ND. The respective impurity concentrations (n-type impurity concentrations) of the n-type hole barrier regions HB1 and HB2 are higher than the impurity concentration (n-type impurity concentration) of the n$^-$-type drift region ND.

Next, as shown in FIG. 17, the gate insulating film GI made of, e.g., silicon dioxide is formed over the top surface Sa of the semiconductor substrate SS and over the respective inner walls (side and bottom surfaces) of the trenches T1, T2, T3, and T4 by, e.g., a thermal oxidation method or the like. The thickness of the gate insulating film GI can be set to, e.g., about 0.12 μm.

Note that the description has been given heretofore of the case where the foregoing extensive diffusion (thermal diffusion) and the thermal oxidation for forming the gate insulating film GI are individually performed. However, in another form, it is also possible to perform the foregoing extensive diffusion (thermal diffusion) and the thermal oxidation for forming the gate insulating film GI by common heat treatment. In that case, by a common heat treatment step, the extensive diffusion (thermal diffusion) is performed on the p-type floating regions PF and the n-type hole barrier regions HB1 and HB2, while the gate insulating film GI is simultaneously formed over the top surface Sa of the semiconductor substrate SS and the respective inner walls of the trenches T1, T2, T3, and T4.

Next, as shown in FIG. 17, over the top surface Sa of the semiconductor substrate SS, a doped polysilicon film DPS is formed as a conductive film using, e.g., a CVD method or the like so as to be embedded in the trenches T1, T2, T3, and T4.

Figure 18:
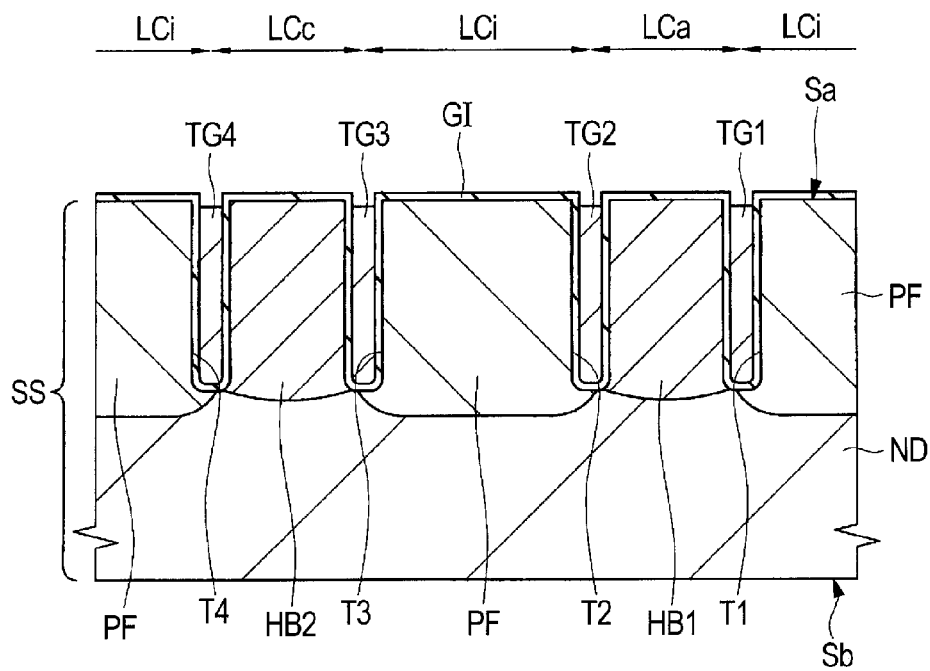
FIG. 18 is a main-portion cross-sectional view of the semiconductor device during the manufacturing process thereof, which is subsequent to FIG. 17.

Next, as shown in FIG. 18, by, e.g., dry etching or the like, the doped polysilicon film DPS is etched back. As a result, the doped polysilicon film DPS located outside the trenches T1, T2, T3, and T4 is removed, while the doped polysilicon film DPS remains in the trenches T1, T2, T3, and T4 to form the trench gate electrodes TG1, TG2, TG3, and TG4. The trench gate electrode TG1 is made of the doped polysilicon film DPS embedded in the trench T1 via the gate insulating film GI. The trench gate electrode TG2 is made of the doped polysilicon film DPS embedded in the trench T2 via the gate insulating film GI. The trench gate electrode TG3 is made of the doped polysilicon film DPS embedded in the trench T3 via the gate insulating film GI. The trench gate electrode TG4 is made of the doped polysilicon film DPS embedded in the trench T4 via the gate insulating film GI.

Figure 19:
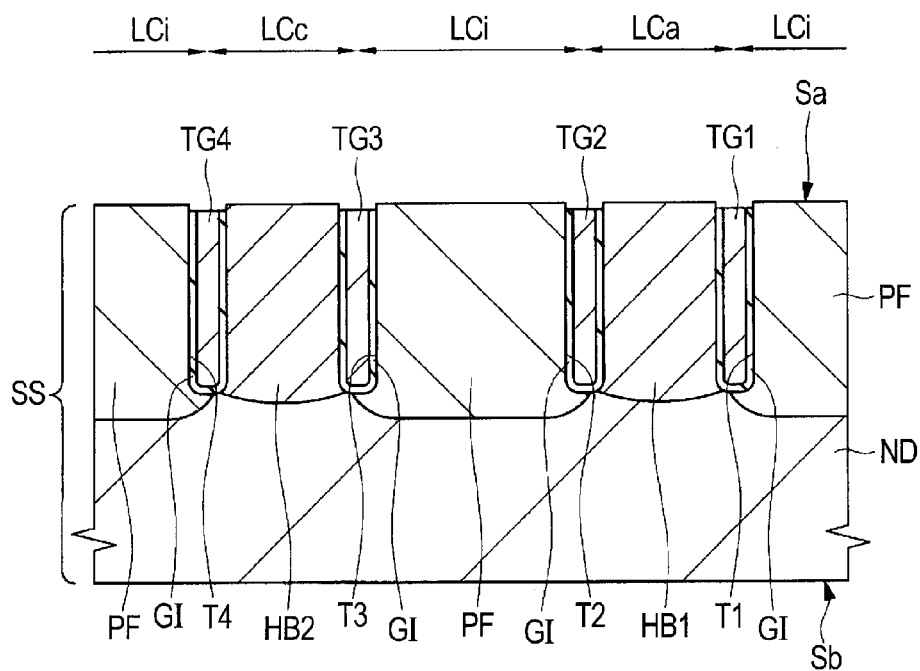
FIG. 19 is a main-portion cross-sectional view of the semiconductor device during the manufacturing process thereof, which is subsequent to FIG. 18.

Next, as shown in FIG. 19, the gate insulating film GI located outside the trenches T1, T2, T3, and T4 is removed by etching (e.g., wet etching). When the etching is performed, the gate insulating film GI located in the trenches T1, T2, T3, and T4, i.e., the gate insulating film GI interposed between the trench gate electrodes TG1, TG2, TG3, and TG4 and the semiconductor substrate SS is not etched and remain.

Figure 20:
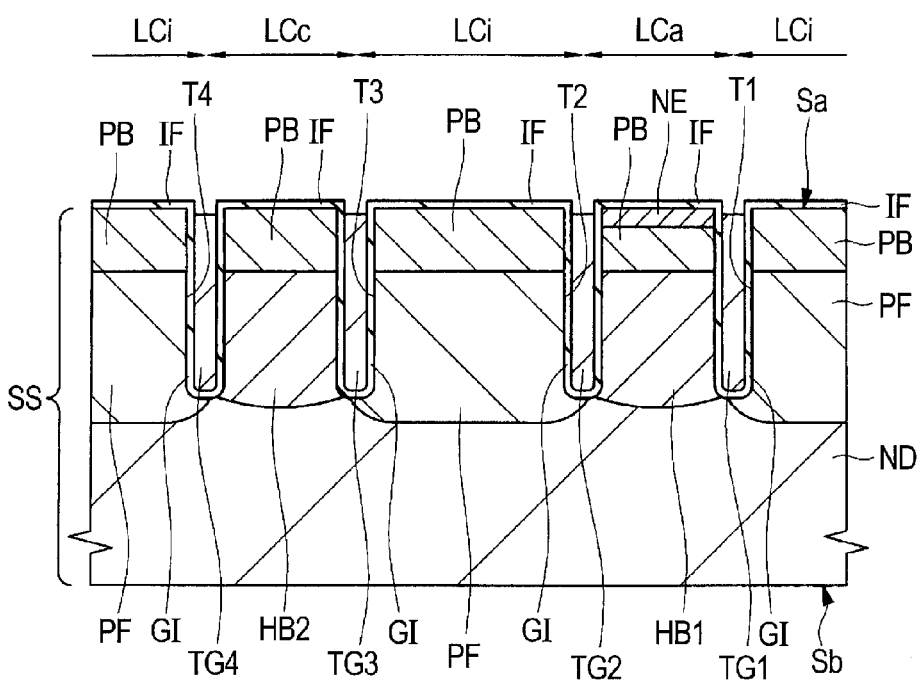
FIG. 20 is a main-portion cross-sectional view of the semiconductor device during the manufacturing process thereof, which is subsequent to FIG. 19.

Next, as shown in FIG. 20, over the top surface Sa of the semiconductor substrate SS, an insulating film IF formed of a relatively thin silicon dioxide film (silicon dioxide film having, e.g., substantially the same thickness as that of the gate insulating film GI) for ion implantation performed later is formed by, e.g., a thermal oxidation method or a CVD method.

Next, over the top surface Sa of the semiconductor substrate SS, using a photolithographic technique, a resist pattern (which is not shown herein) for forming the p-type body region PB is formed. Then, using the resist pattern as a mask, a p-type impurity is introduced into the entire surface of the cell formation region CR in the semiconductor substrate SS and another portion of the semiconductor substrate SS which needs the introduction of the p-type impurity by, e.g., an ion implantation method to thus form the p-type body region PB. As a result, the p-type body region PB is formed in the upper portion (upper-layer portion) of each of the p-type floating regions PF, in the upper portion (upper-layer portion) of the n-type hole barrier region HB1 in the portion of the semiconductor substrate SS which is interposed between the trenches T1 and T2, and in the upper portion (upper-layer portion) of the n-type hole barrier region HB2 in the portion of the semiconductor substrate SS which is interposed between the trenches T3 and T4.

As a preferred example of the ion implantation conditions used at this time, an ion species of, e.g., boron (B), a dose of about $3\times10^{13}$ cm$^{-2}$, and an implantation energy of about 75 eV can be shown. Then, the unneeded resist pattern is removed by asking or the like.

Next, over the top surface Sa of the semiconductor substrate SS, using a photolithographic technique, a resist pattern (the illustration of which is omitted) for forming the n$^+$-type emitter region NE is formed. Then, using the resist pattern as a mask, an n-type impurity is introduced into the semiconductor substrate SS by, e.g., an ion implantation method to form the n$^+$-type emitter region NE by, e.g., an ion implantation method. The n$^+$-type emitter region NE is formed in the upper portion (upper-layer portion) of the p-type body region PB in the portion of the semiconductor substrate SS which is interposed between the trenches T1 and T2. Note that, as described above, the n$^+$-type emitter region NE is formed in the active section LCaa of the foregoing active cell region LCa, but is not formed in the inactive section LCai thereof.

As a preferred example of the ion implantation conditions used at this time, an ion species of, e.g., arsenic (As), a dose of about $5\times10^{15}$ cm$^{-2}$, and an implantation energy of about 80 eV can be shown. Then, the unneeded resist pattern is removed by asking or the like.

At this stage, in the active section LCaa, the portion of the semiconductor substrate SS which is interposed between the trenches T1 and T2 has a stacked structure including the n$^+$-type emitter region NE as the uppermost layer, the p-type body region PB under the n$^+$-type emitter region NE, and the n-type hole barrier region HB1 under the p-type body region PB. In the inactive section LCai, the portion of the semiconductor substrate SS which is interposed between the trenches T1 and T2 has a stacked structure including the p-type body region PB formed up to the top surface Sa of the semiconductor substrate SS and the n-type hole barrier region HB2 under the p-type body region PB. In the hole collector cell region LCC, the portion of the semiconductor substrate SS which is interposed between the trenches T3 and T4 has a stacked structure including the p-type body region PB formed up to the top surface Sa of the semiconductor substrate SS and the n-type hole barrier region HB2 under the p-type body region PB.

Figure 21:
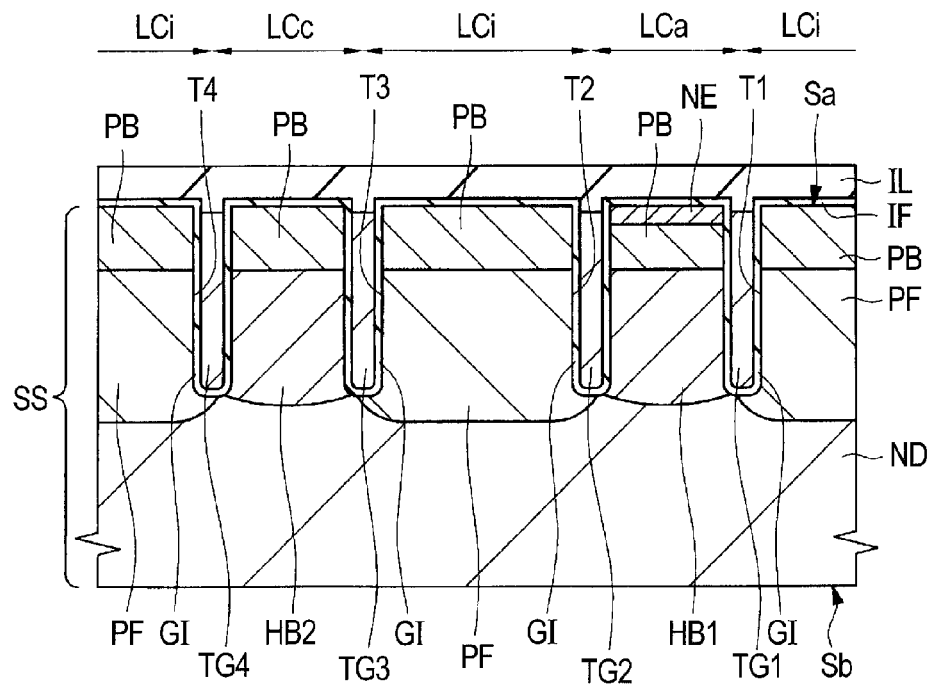
FIG. 21 is a main-portion cross-sectional view of the semiconductor device during the manufacturing process thereof, which is subsequent to FIG. 20.

Next, as shown in FIG. 21, over the top surface Sa of the semiconductor substrate SS, the interlayer insulating film IL is formed so as to cover the trench gate electrodes TG1, TG2, TG3, and TG4. The interlayer insulating film IL is formed so as to cover the p-type body region PB via the insulating film IF. The interlayer insulating film IL is made of, e.g., a PSG (Phospho Silicate Glass) film or the like and can be formed using, e.g., a CVD method or the like.

Figure 22:
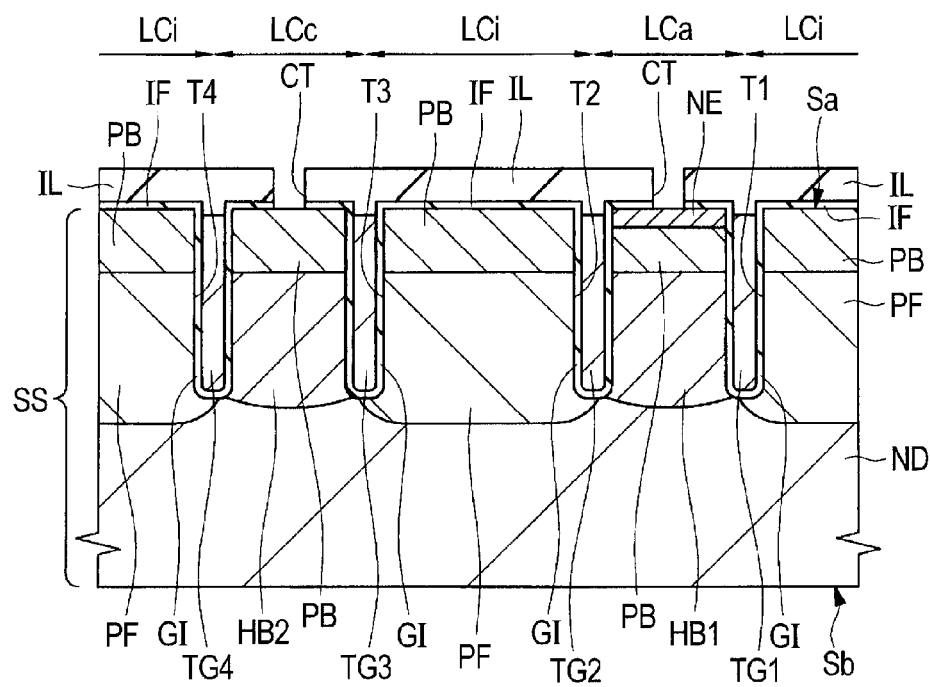
FIG. 22 is a main-portion cross-sectional view of the semiconductor device during the manufacturing process thereof, which is subsequent to FIG. 21.

Next, as shown in FIG. 22, over the interlayer insulating film IL, using a photolithographic technique, a resist pattern (the illustration of which is omitted) is formed. Then, using the resist pattern as an etching mask, the interlayer insulating film IL is etched (e.g., anisotropically dry-etched) to be formed with the contract trenches CT. Then, the unneeded resist pattern is removed by asking or the like.

Figure 23:
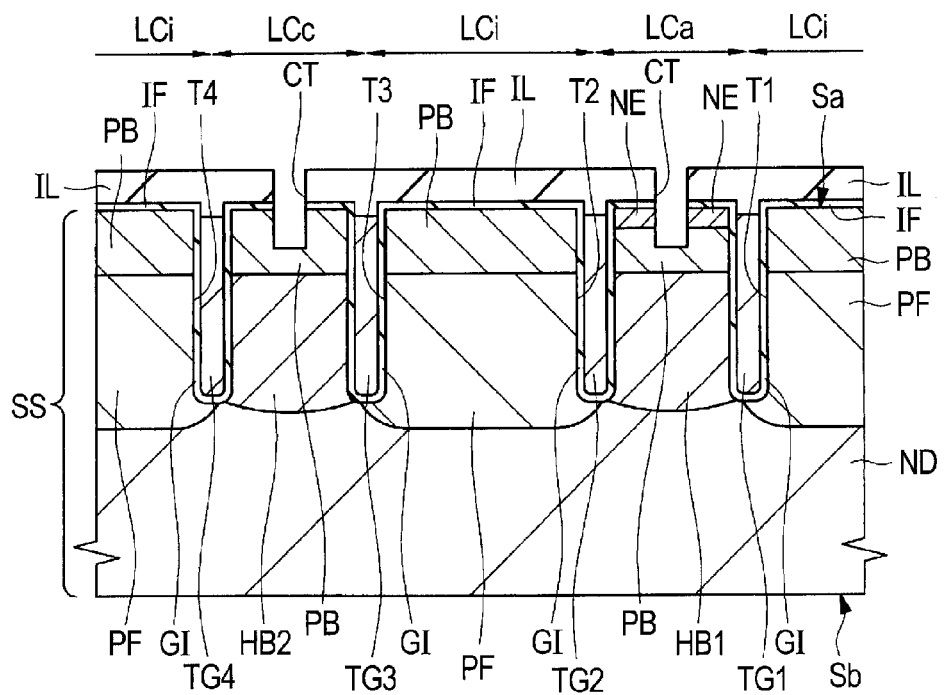
FIG. 23 is a main-portion cross-sectional view of the semiconductor device during the manufacturing process thereof, which is subsequent to FIG. 22.

Next, as shown in FIG. 23, by, e.g., anisotropic dry etching, the semiconductor substrate SS at the bottom portions of the contact trenches CT is cut away to extend the contact trenches CT into the semiconductor substrate SS.

This provides a state where the contact trenches CT extend through the interlayer insulating film IL to reach middle points along the thickness of the p-type body region PB.

That is, in the active section LCaa where the n$^+$-type emitter region NE is formed, the contact trench CT formed between the trenches T1 and T2 in plan view extends through the interlayer insulating film IL and the n$^+$-type emitter region NE to reach a middle point along the thickness of the p-type body region PB, but does not reach the n-type hole barrier region HB1. In the inactive section LCai where the n$^+$-type emitter region NE is not formed, the contact trench CT formed between the trenches T1 and T2 in plan view extends through the interlayer insulating film IL to reach a middle point along the thickness of the p-type body region PB, but does not reach the n-type hole barrier region HB1. In the hole collector cell region LCc, the contact trench CT formed between the trenches T3 and T4 in plan view extends through the interlayer insulating film IL to reach a middle point along the thickness of the p-type body region PB, but does not reach the n-type hole barrier region HB2.

Figure 24:
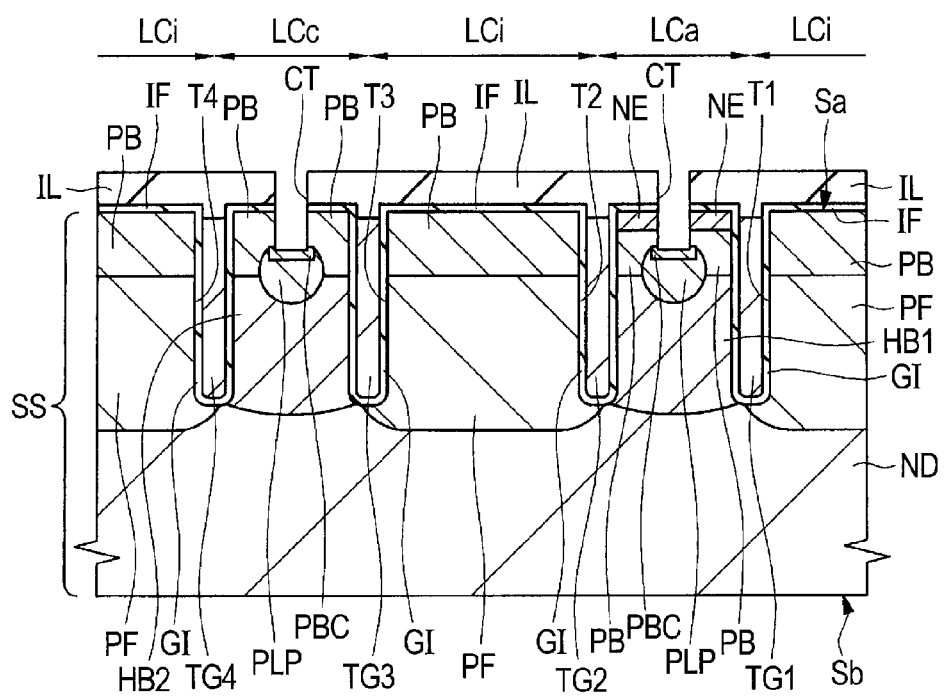
FIG. 24 is a main-portion cross-sectional view of the semiconductor device during the manufacturing process thereof, which is subsequent to FIG. 23.

Next, as shown in FIG. 24, a p-type impurity is ion-implanted into, e.g., the semiconductor substrate SS exposed at the bottom portions of the contact trenches CT through the contact trenches CT to thus form the p$^+$-type body contact regions PBC. The p$^+$-type body contact regions PBC are formed in the areas of the p-type body region PB which are adjacent to the bottom surfaces of the contact trenches CT. As a preferred example of the ion implantation conditions used at this time, an ion species of, e.g., boron (B), a dose of about $5\times10^{15}$ cm$^{-2}$, and an implantation energy of about 80 eV can be shown.

Likewise, by ion-implanting a p-type impurity into, e.g., the semiconductor substrate SS exposed at the bottom portions of the contact trenches CT through the contact trenches CT, the p$^+$-type latch-up prevention regions PLP are formed. As a preferred example of the ion implantation conditions used at this time, an ion species of, e.g., boron (B), a dose of about $5\times10^{15}$ cm$^{-2}$, and an implantation energy of about 80 eV can be shown.

The impurity concentration (p-type impurity concentration) of each of the p$^+$-type body contact regions PBC is higher than the impurity concentration (p-type impurity concentration) of each of the p$^+$-type latch-up prevention regions PLP, and the impurity concentration (p-type impurity concentration) of each of the p$^+$-type latch-up prevention regions PLP is higher than the impurity concentration (p-type impurity concentration) of the p-type body region PB. In the active cell region LCa, the p$^+$-type latch-up prevention region PLP is formed extensively over both the p-type body region PB and the n-type hole barrier region HB1 to be adjacent to the p+-type body contact region PBC and reach the n-type hole barrier region HB1. In the hole collector cell region LCc, the p+-type latch-up prevention region PLP is formed extensively over both the p-type body region PB and the n-type hole barrier region HB2 to be adjacent to the p+-type body contact region PBC and reach the n-type hole barrier region HB2.

Figure 25:
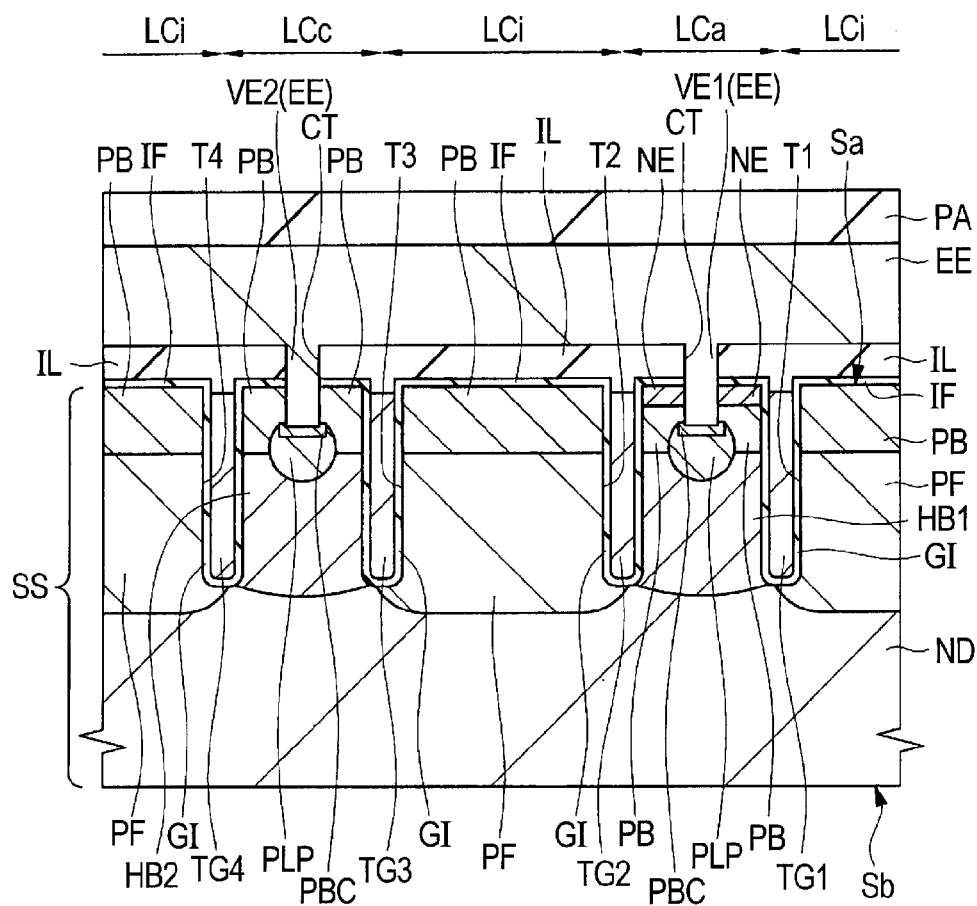
FIG. 25 is a main-portion cross-sectional view of the semiconductor device during the manufacturing process thereof, which is subsequent to FIG. 24.

Next, as shown in FIG. 25, the emitter electrode EE is formed. Specifically, the formation of the emitter electrode EE is performed by, e.g., the following procedure.

First, over the top surface Sa of the semiconductor substrate SS, i.e., over the interlayer insulating film IL including the inner surfaces (bottom and side surfaces) of the contact trenches CT, a TiW (titanium tungsten) film is formed as a barrier metal film by, e.g., sputtering. A majority of titanium in the TiW film moves to a silicon interface as a result of subsequent heat treatment to form a silicide and contribute to an improvement in contact property. However, such a process is complicated and is therefore not shown in the drawing. When unnecessary, the formation of the TiW film and subsequent silicide anneal can also be omitted.

Next, the silicide anneal (heat treatment for silicidation) is performed in a nitrogen atmosphere. Then, over the entire surface of the barrier metal film, an aluminum-based metal film is formed by, e.g., a sputtering method so as to be embedded in the contact trenches CT. The aluminum-based metal film contains aluminum (Al) as a main component. To the aluminum-based metal film, e.g., about several atom % of silicon (Si) has been added, while the remaining part of the aluminum-based metal film is made of aluminum (Al).

Next, over the aluminum-based metal film, a resist pattern (the illustration of which is omitted) is formed using a photolithographic technique. Then, using the resist pattern as an etching mask, the aluminum-based metal film and the barrier metal film are patterned by etching (e.g., dry etching) to thus form the emitter electrode EE, the foregoing gate electrode GE, the foregoing gate line GL, the foregoing field plates FP, and the foregoing guard ring GR. Each of the emitter electrode EE, the foregoing gate electrode GE, the foregoing gate line GL, the foregoing field plates FP, and the foregoing guard ring GR is made of a stacked film including the patterned aluminum-based metal film and the barrier metal film. Note that the foregoing gate line GL and the foregoing gate electrode GE are integrally formed. Then, the unneeded resist pattern is removed by asking or the like.

Next, as shown in FIG. 25, over the interlayer insulating film IL, the insulating film PA is formed as a passivation film so as to cover the emitter electrode EE, the foregoing gate electrode GE, the foregoing gate line GL, the foregoing field plates FP, and the foregoing guard ring GR. The insulating film PA is made of an organic insulating film containing, e.g., polyimide as a main component or the like.

Next, using a photolithographic technique, a resist pattern (the illustration of which is omitted) is formed over the insulating film PA. Then, using the resist pattern as an etching mask, the insulating film PA is etched (e.g., dry-etched) to be formed with the foregoing emitter opening OPE and the foregoing gate opening OPG. The emitter opening OPE and the gate opening OPG extend through the insulating film PA. The emitter electrode EE exposed from the emitter opening OPE forms the foregoing emitter pad PDE. The gate electrode GE exposed from the gate opening OPG forms the foregoing gate pad PDG. Then, the unneeded resist pattern is removed by asking or the like.

Figure 26:
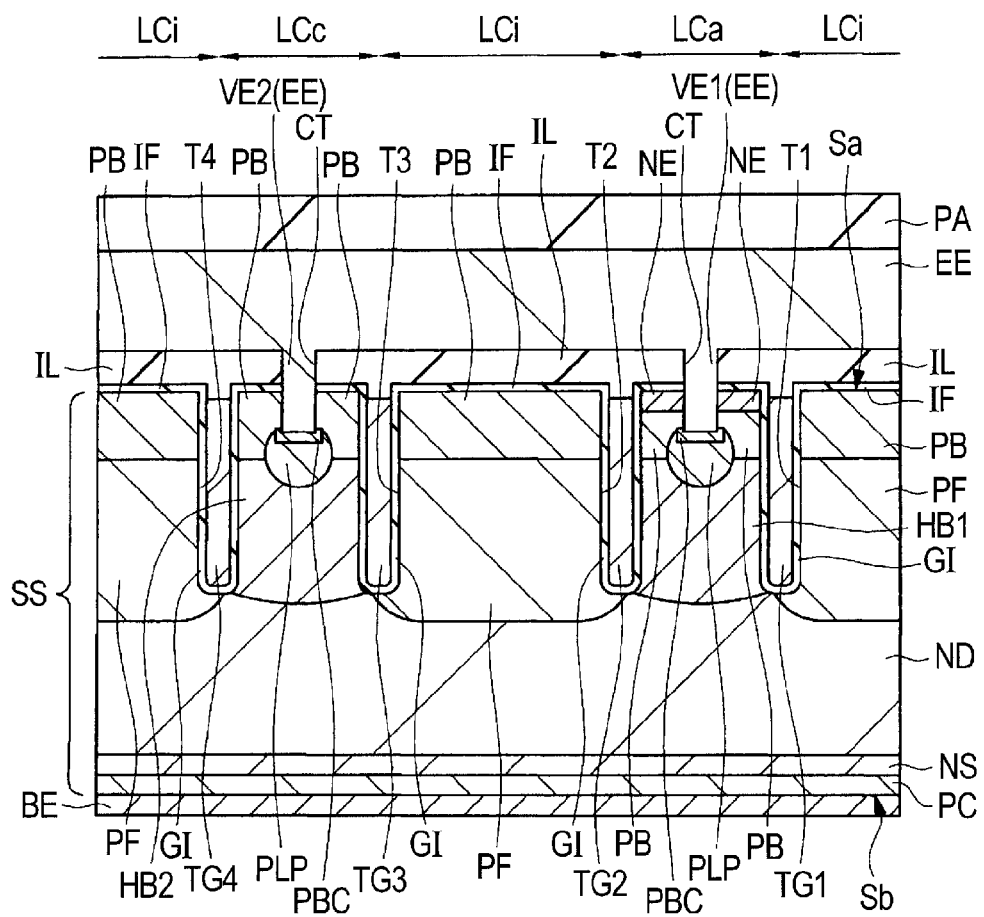
FIG. 26 is a main-portion cross-sectional view of the semiconductor device during the manufacturing process thereof, which is subsequent to FIG. 25.

Next, as shown in FIG. 26, back grinding (back-surface grinding) treatment is performed on the back surface Sb of the semiconductor substrate SS to reduce the thickness of the semiconductor substrate SS as necessary. For example, the semiconductor substrate SS having a thickness of about 800 μm before the back grinding treatment is thinned by the back grinding treatment to have a thickness of, e.g., about 30 to 200 μm. For example, when the breakdown voltage is about 600 V, the final thickness of the semiconductor substrate SS can be reduced to about 70 μm. As necessary, chemical etching for removing damage from the back surface Sb of the semiconductor substrate SS or the like can also be performed.

Next, into the back surface Sb of the semiconductor substrate SS, an n-type impurity is introduced by, e.g., ion implantation to form the n-type field stop layer NS. As a preferred example of the ion implantation conditions used at this time, an ion species of, e.g., phosphorus (P), a dose of about $7 \times 10^{12}$ cm$^{-2}$, and an implantation energy of about 350 eV can be shown. Then, as necessary, laser anneal or the like can also be performed on the back surface Sb of the semiconductor substrate SS for impurity activation.

Next, into the back surface Sb of the semiconductor substrate SS, a p-type impurity is introduced by, e.g., ion implantation to form the p+-type collector layer PC. As a preferred example of the ion implantation conditions used at this time, an ion species of, e.g., boron (B), a dose of about $1 \times 10^{13}$ cm$^{-2}$, and an implantation energy of about 40 eV can be shown. Then, as necessary, laser anneal or the like can also be performed for impurity activation on the back surface Sb of the semiconductor substrate SS.

Next, over the back surface Sb of the semiconductor substrate SS, the back-surface electrode BE is formed by, e.g., a sputtering method. The p+-type collector layer PC is adjacent to the back-surface electrode BE to be electrically coupled thereto. Between the n-type field stop layer NS and the back-surface electrode BE, the p+-type collector layer PC is interposed. Then, by dicing or the like, the semiconductor substrate SS is divided (separated) into individual chip regions to provide the foregoing semiconductor devices (semiconductor chips) CP. Thus, the semiconductor devices CP in the present embodiment are manufactured. The acquired semiconductor devices CP are packaged as necessary.

About Studied Example

Figure 27:
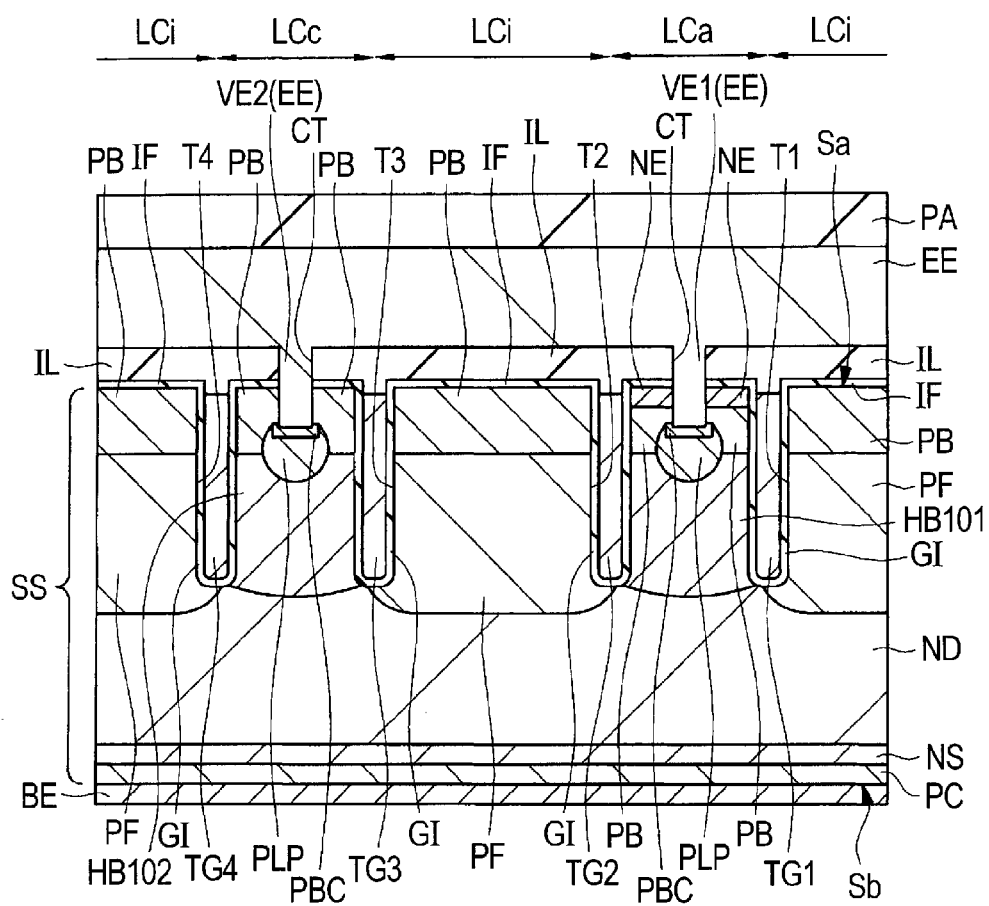
FIG. 27 is a main-portion cross-sectional view of a semiconductor device in a studied example.

Next, a description will be given of a studied example studied by the present inventors. FIG. 27 is a main-portion cross-sectional view of a semiconductor device in the studied example studied by the present inventors and shows a cross section of the region corresponding to FIG. 5 described above.

The semiconductor device in the studied example shown in FIG. 27 is mainly different from the semiconductor device in FIG. 5 described above in the present embodiment in FIG. 5 described above in that, in the active cell region LCa, an n-type hole barrier region HB101 is formed instead of the n-type hole barrier region HB1 and, in the hole collector cell region LCc, an n-type hole barrier region HB102 is formed instead of the n-type hole barrier region HB2. The n-type hole barrier region HB101 is equivalent to the foregoing n-type hole barrier region HB1. The n-type hole barrier region HB102 is equivalent to the foregoing n-type hole barrier region HB2. Each of the n-type hole barrier regions HB101 and HB102 has the same conductivity type and the same impurity concentration.

To enhance the IE (Injection Enhancement) effect in the semiconductor device in the studied example shown in FIG. 27, it is effective to increase the impurity concentrations of the n-type hole barrier regions HB101 and HB102. That is, by increasing the impurity concentrations of the n-type hole barrier regions HB101 and HB102, the holes stored in the n-type field stop layer NS, the $n^-$-type drift region ND, and the n-type hole barrier regions HB101 and HB102 are less likely to be discharged into the emitter electrode EE when the IGBT is in the ON state. This allows a further reduction in the ON voltage of the IGBT.

Specifically, when the IGBT is operated (turned ON), the holes are implanted from the $p^+$-type collector layer PC into the $n^-$-type drift region ND to move through the n-type hole barrier regions HB101 and HB102 into the emitter electrode EE. Since each of the n-type hole barrier regions HB101 and HB102 is an n-type semiconductor region, when free electrons are discharged therefrom when the IGBT is operated, each of the n-type hole barrier regions HB101 and HB102 has a positive potential. The potential acts on the holes as a force which prevents the travel thereof and therefore serves to increase the number of the holes stored in the IGBT. Accordingly, when the impurity concentrations of the n-type hole barrier regions HB101 and HB102 are increased, the positive potential produced in each of the n-type hole barrier regions HB101 and HB102 increases (becomes higher). This increases the number of the stored holes, the IE effect, and the effect of reducing the ON voltage.

However, in the case of increasing the impurity concentrations of the n-type hole barrier regions HB101 and HB102, a parasitic npn bipolar transistor equivalent to the foregoing npn bipolar transistor BP2 operates to increase the likelihood of the occurrence of latch-up. This raises a concern about a reduction in breakdown resistance and leads to the degradation of the reliability of the semiconductor device. A further description will be given thereof with reference to FIG. 28.

FIGS. 28A and 28B are illustrative views of the semiconductor device in the studied example and schematically show a part (active cell region LCa) of FIG. 27 in enlarged relation. FIG. 28A shows the case where the impurity concentration (n-type impurity concentration) of the n-type hole barrier region HB101 is low. FIG. 28B shows the case where the impurity concentration (n-type impurity concentration) of the n-type hole barrier region HB101 is high.

As shown in each of FIGS. 28A and 28B, the $n^+$-type emitter region NE, the p-type body region PB, and the n-type hole barrier region HB101 form a parasitic npn bipolar transistor equivalent to the foregoing npn bipolar transistor BP2. As can be seen from a comparison between FIGS. 28A and 28B, when the impurity concentration (n-type impurity concentration) of the n-type hole barrier region HB101 is increased, the position of the bottom surface of the p-type body region PB becomes shallower so that the thickness (dimension in a direction generally perpendicular to the top surface Sa of the semiconductor substrate SS) of the p-type body region PB is reduced. That is, a depth position P2 of the bottom surface of the p-type body region PB when the impurity concentration of the n-type hole barrier region HB101 is high (in FIG. 28B) is shallower than a depth position P1 of the bottom surface of the p-type body region PB when the impurity concentration of the n-type hole barrier region HB101 is low (in FIG. 28A). When the thickness of the p-type body region PB decreases, the resistance (base resistance Rb) of the p-type body region PB increases. When the base resistance Rb is high or when a hole current Ib is large, a produced potential difference V increases in accordance with the relationship given by V=Rb×Ib.

When the potential difference V increases to exceed about 0.7 V, a forward bias is applied between the emitter and the base to bring the parasitic npn bipolar transistor into the ON state. In the active cell region LCa where such an operation of the parasitic npn bipolar transistor has occurred, a large current which is uncontrollable with a field effect transistor equivalent to the foregoing field effect transistor flows with a collector voltage being applied so that heat is generated. The resulting temperature rise causes a positive feedback in which an electric resistance decreases to allow a larger current to flow. As a result, the large current may locally flow to result in a breakdown. Accordingly, it is necessary to prevent a situation in which such a parasitic npn bipolar transistor operates to cause latch-up.

When the impurity concentration of the n-type hole barrier region HB101 is thus increased, the position of the bottom surface of the p-type body region PB becomes shallower and the thickness of the p-type body region PB decreases to increase the base resistance Rb. As a result, the parasitic npn bipolar transistor operates to increase the likelihood of the occurrence of latch-up and degrade the reliability of the semiconductor device.

A description will be given of a mechanism in which an increased impurity concentration of the n-type hole barrier region HB101 results in a shallower position of the bottom surface of the p-type body region PB with reference to FIGS. 29 and 30.

Figure 29:
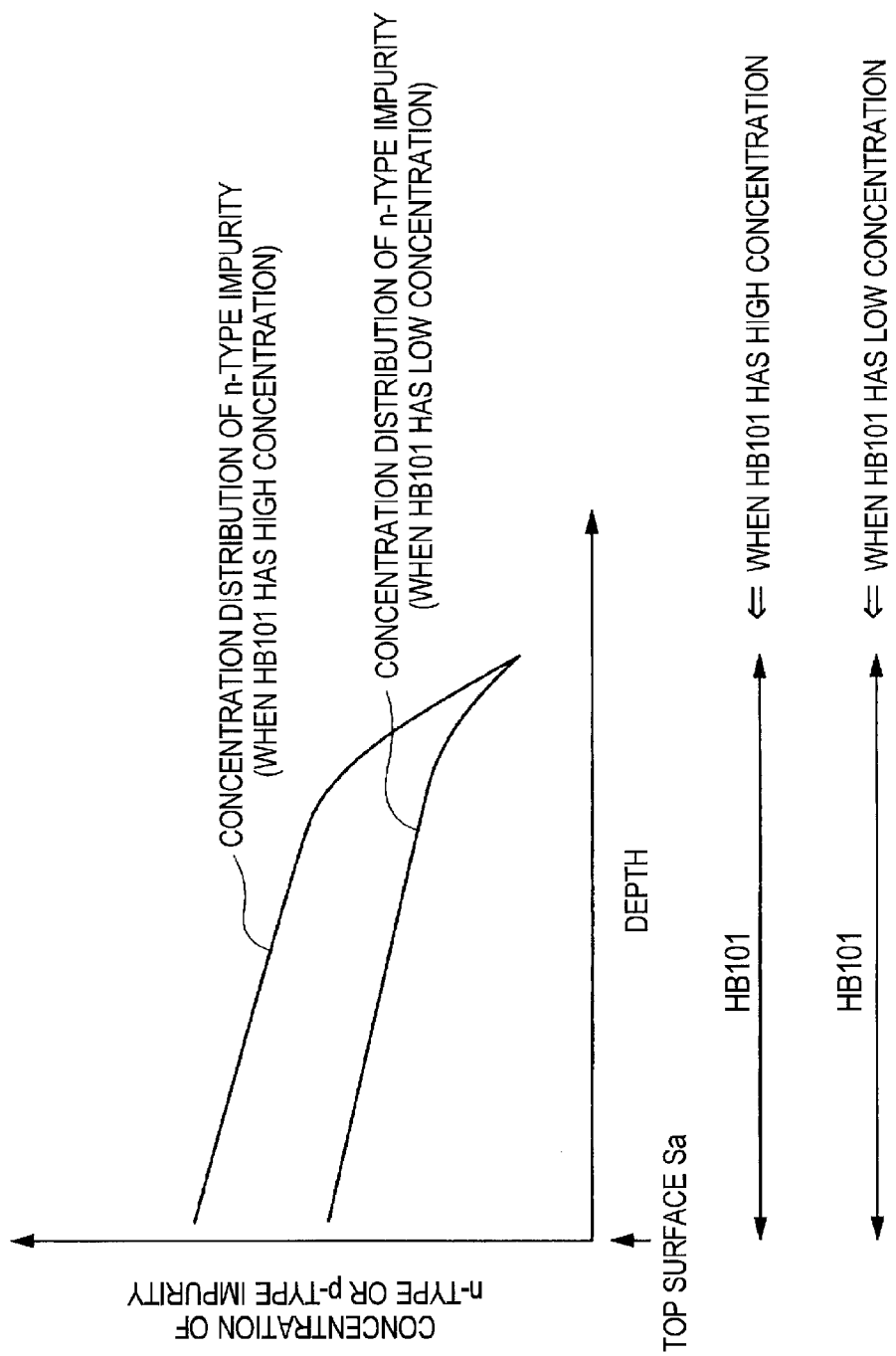
FIG. 29 is a graph showing an impurity concentration profile.
Figure 30:
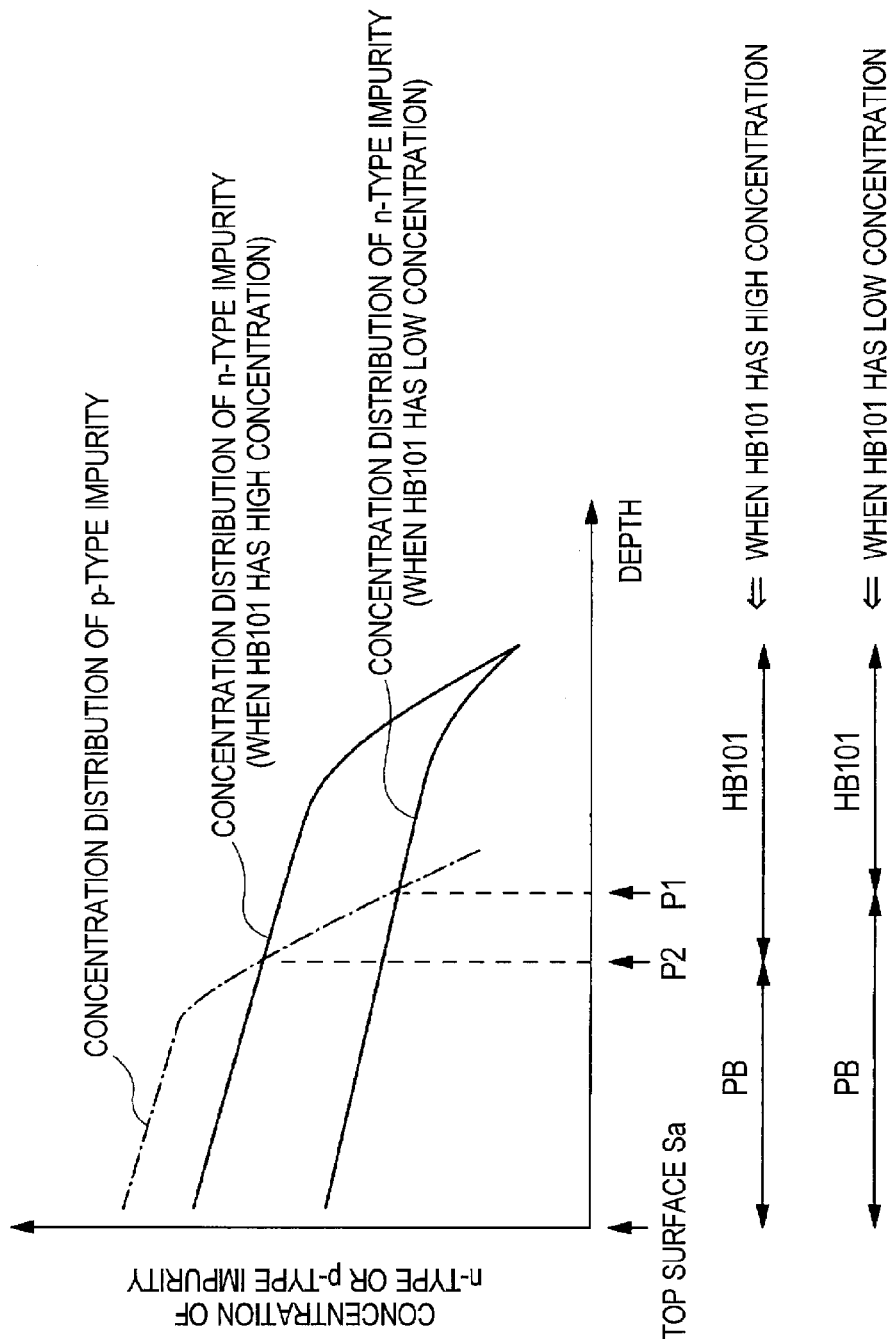
FIG. 30 is a graph showing an impurity concentration profile.

FIGS. 29 and 30 are graphs showing impurity concentration profiles. FIG. 29 shows the impurity concentration profile of the n-type hole barrier region HB101 in a depth direction before the p-type body region PB is formed. FIG. 30 shows the impurity concentration profiles of the p-type body region PB and the n-type hole barrier region HB101 after the p-type body region PB is formed. In FIGS. 29 and 30, the concentration distributions of an n-type impurity are shown by solid lines and the concentration distributions of a p-type impurity are shown by one-dot-dash lines. FIG. 29 shows the case where the impurity concentration of the n-type hole barrier region HB101 is increased (corresponding to "When HB101 Has High Concentration" in the drawing) and the case where the impurity concentration of the n-type hole barrier region HB101 is reduced (corresponding to "When HB101 Has Low Concentration" in the drawing). The same applies also to FIG. 30.

At the stage prior to the formation of the p-type body region PB, the impurity concentration profile of the n-type hole barrier region HB101 has a concentration distribution in the depth direction as shown in FIG. 29.

When the p-type body region PB is formed by introducing a p-type impurity into the upper-layer portion of the n-type hole barrier region HB101 by ion implantation or the like, the impurity concentration profiles of the p-type body region PB and the n-type hole barrier region HB101 have concentration distributions in the depth direction as shown in FIG. 30. The bottom surface of the formed p-type body region PB is at a depth position where the p-type impurity introduced to form the p-type body region PB and the n-type impurity contained in the n-type hole barrier region HB101 exactly compensate for each other. At this time, the p-type impurity that has been introduced to form the p-type body region PB has a concentration which is lower at increasing depth. Accordingly, the depth position P2 of the bottom surface (pn junction surface) of the p-type body region PB when the concentration of the n-type impurity contained in the n-type hole barrier region HB101 is high is shallower than the depth position P1 of the bottom surface (pn junction surface) of the p-type body region PB when the concentration of the n-type impurity contained in the n-type hole barrier region HB101 is low.

Thus, when the impurity concentration (n-type impurity concentration) of the n-type hole barrier region HB101 is increased, the position of the bottom surface of the p-type body region PB becomes shallower and the thickness of the p-type body region PB decreases. This leads to the operation of the parasitic npn bipolar transistor and an increase in the likelihood of the occurrence of latch-up, resulting in the degradation of the reliability of the semiconductor device.

The p-type impurity concentration of the p-type body region PB needs to be set to an impurity concentration which is appropriate for the channel formation region of a field effect transistor equivalent to the foregoing field effect transistor FE. Accordingly, it is difficult to control the foregoing base resistance RB by adjusting the p-type impurity concentration of the p-type body region PB so that, as described above, the impurity concentration of the n-type hole barrier region HB101 affects the foregoing base resistance Rb.

As a result, in the semiconductor device in the studied example shown in FIG. 27, when the impurity concentrations of the n-type hole barrier regions HB101 and HB102 are low, the IE effect is suppressed so that the effect of reducing the ON voltage decreases. By increasing the impurity concentrations of the n-type hole barrier regions HB101 and HB102, it is possible to increase the IE effect and further reduce the ON voltage. However, the parasitic npn bipolar transistor operates to increase the likelihood of the occurrence of latch-up and thus reduce the breakdown resistance, resulting in the degradation of the reliability of the semiconductor device. Consequently, in the case of the semiconductor device in the studied example shown in FIG. 27, there is a limit to reducing the ON voltage, while suppressing the degradation of the reliability of the semiconductor device.

<About Main Characteristic Feature and Effect>

One of the main characteristic features of the semiconductor device in the present embodiment is that the impurity concentration of the n-type hole barrier region HB1 is different from the impurity concentration of the n-type hole barrier region HB2 and the impurity concentration of the n-type hole barrier region HB2 is higher than the impurity concentration of the n-type hole barrier region HB1. In other words, the impurity concentration of the n-type hole barrier region HB1 is lower than the impurity concentration of the n-type hole barrier region HB2. Note that each of the impurity concentration of the n-type hole barrier region HB1 and the impurity concentration of the n-type hole barrier region HB2 is higher than the impurity concentration of the $n^-$-type drift region ND.

In the case of the semiconductor device in the studied example shown in FIG. 27 described above, the impurity concentration of the n-type hole barrier region HB101 is the same as the impurity concentration of the n-type hole barrier region HB102. In this case, as described above, when the impurity concentrations of the n-type hole barrier regions HB101 and HB102 are increased to enhance the IE effect, the parasitic npn bipolar transistor operates to increase the likelihood of the occurrence of latch-up and thus raise a concern about a reduction in breakdown resistance.

To prevent this, in the present embodiment, the respective impurity concentrations of the n-type hole barrier regions HB1 and HB2 are set different and the impurity concentration of the n-type hole barrier region HB2 is set higher than the impurity concentration of the n-type hole barrier region HB1. This can enhance the IE effect and further reduce the ON voltage. In addition, since it is possible to inhibit or prevent the parasitic npn bipolar transistor (equivalent to the foregoing npn bipolar transistor BP2) from operating and causing latch-up, the reliability of the semiconductor device can be improved. The reason for this will be described specifically below.

The parasitic npn bipolar transistor (equivalent to the foregoing npn bipolar transistor BP2) may operate to cause latch-up in the active cell region LCa. In the hole collector cell region LCc, there is no concern about the operation of such a parasitic npn bipolar transistor and the occurrence of latch-up. This is because, in the active cell region LCa, the $n^+$-type emitter region NE is provided while, in the hole collector cell region LCc, an n-type semiconductor region equivalent to the $n^+$-type emitter region NE is not formed. That is, in the portion (hole collector cell region LCc) of the semiconductor substrate SS which is interposed between the trenches T3 and T4, the n-type semiconductor region (n-type emitter region) electrically coupled to the emitter electrode EE is not formed over the p-type body region PB. In the active cell region LCa, the $n^+$-type emitter region NE, the p-type body region PB, and the n-type hole barrier region HB1 form the parasitic npn bipolar transistor. This raises a concern about the turning ON of the parasitic npn bipolar transistor and the occurrence of latch-up. However, in the hole collector cell region LCc, an n-type semiconductor region equivalent to the $n^+$-type emitter region NE is not formed in the upper portion of the p-type body region PB so that such a parasitic npn bipolar transistor is not formed. Consequently, there is no concern about the turning ON of such a parasitic npn bipolar transistor and the occurrence of latch-up.

Accordingly, even when the impurity concentration of the n-type hole barrier region HB2 formed in the hole collector cell region LCc is increased, there is no concern about the turning ON of the parasitic npn bipolar transistor and the occurrence of latch-up. An increase in the impurity concentration of the n-type hole barrier region HB2 formed in the hole collector cell region LCc can contribute to an increase in IE effect and a reduction in ON voltage.

By contrast, when the impurity concentration of the n-type hole barrier region HB1 formed in the active cell region LCa is increased, the parasitic npn bipolar transistor is turned ON to increase the likelihood of the occurrence of latch-up. This degrades the reliability of the semiconductor device.

That is, in terms only of increasing the IE effect and reducing the ON voltage, it is desirable to increase the impurity concentrations of both of the n-type hole barrier regions HB1 and HB2. However, in terms of maximally preventing the turning ON of the parasitic npn bipolar transistor and the occurrence of latch-up, it is desirable to reduce the impurity of the n-type hole barrier region HB1 to a degree.

In the present embodiment, the respective impurity concentrations of the n-type hole barrier regions HB1 and HB2 are set different and the impurity concentration of the n-type hole barrier region HB2 is set higher than the impurity concentration of the n-type hole barrier region HB1. By setting the impurity concentration of the n-type hole barrier region HB1 lower, it is possible to inhibit or prevent the parasitic npn bipolar transistor from turning ON and causing latch-up. Accordingly, it is possible to improve the reliability of the semiconductor device. In addition, by setting the impurity concentration of the n-type hole barrier region HB2 higher, it is possible to enhance the IE effect and reduce the ON voltage. Therefore, it is possible to improve the performance of the semiconductor device.

Thus, in the present embodiment, the n-type hole barrier region HB1 as one of the n-type hole barrier regions HB1 and HB2 is formed in the active cell region LCa where the parasitic npn bipolar transistor is formed. Accordingly, the impurity concentration of the n-type hole barrier region HB1 is set lower to maximally prevent the occurrence of latch-up. On the other hand, the n-type hole barrier region HB2 as the other of the n-type hole barrier regions HB1 and HB2 is formed in the hole collector cell region LCc where the parasitic npn bipolar transistor is not formed. Accordingly, by setting the impurity concentration of the n-type hole barrier region HB2 high, the IE effect is enhanced and the ON voltage is reduced. This allows a reduction in ON voltage, while preventing the degradation of the reliability of the semiconductor device. Therefore, it is possible to achieve both an improvement in the performance (specifically a reduction in ON voltage) of the semiconductor device and an improvement in the reliability of the semiconductor device.

Figure 31:
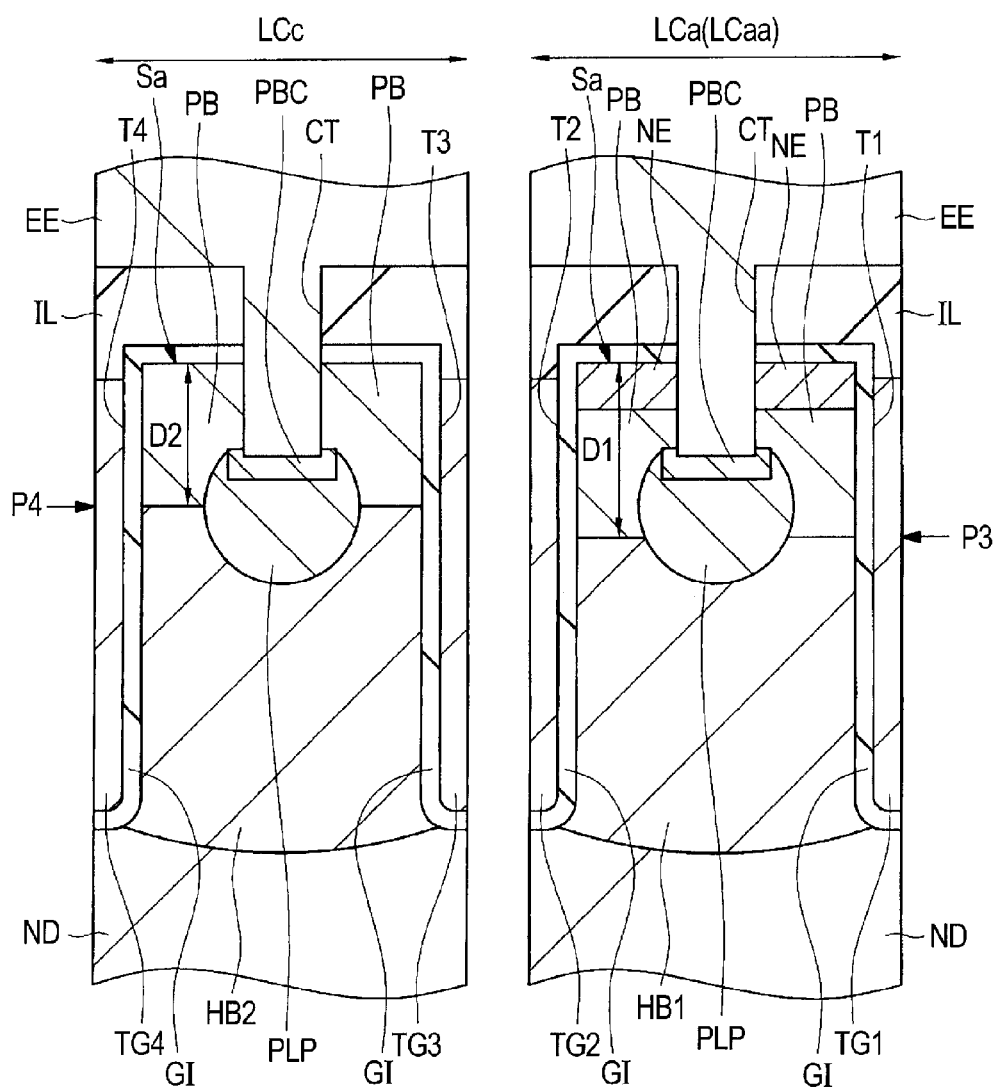
FIG. 31 is a partially enlarged cross-sectional view of the semiconductor device in the embodiment.

FIG. 31 is a partially enlarged cross-sectional view of the semiconductor device in the present embodiment and shows a part of FIG. 5 described above, specifically the active cell region LCa (active section LCaa) and the hole collector cell region LCc in enlarged relation.

In the present embodiment, as described above, the impurity concentration of the n-type hole barrier region HB1 is set lower than the impurity concentration of the n-type hole barrier region HB2. As a result, as shown in FIG. 31, a depth (distance) D1 from the top surface Sa of the region (active cell region LCa) of the semiconductor substrate SS which is interposed between the trenches T1 and T2 to the bottom surface of the p-type body region PB is deeper (larger) than a depth (distance) D2 from the top surface Sa of the region (hole collector cell region LCc) of the semiconductor substrate SS which is interposed between the trenches T3 and T4 to the bottom surface of the p-type body region PB. That is, Da>D2 is satisfied. The relationship given by D1>D2 is obtained at the stage where the p-type body region PB is formed in the step in FIG. 20 described above and maintained even in the manufactured semiconductor device. The bottom surface (lower surface) of the p-type body region PB in the region (active cell region LCa) interposed between the trenches T1 and T2 corresponds to the boundary surface (pn junction surface) between the n-type hole barrier region HB1 and the p-type body region PB. Also, the bottom surface (lower surface) of the p-type body region PB in the region (hole collector cell region LCc) interposed between the trenches T3 and T4 corresponds to the boundary surface (pn junction surface) between the n-type hole barrier region HB2 and the p-type body region PB. That is, a depth position P3 of the bottom surface of the p-type body region PB in the active cell region LCa is deeper than a depth position P4 of the bottom surface of the p-type body region PB in the hole collector cell region LCc. Accordingly, the thickness (the same as the foregoing depth D1) of the p-type body region PB in the inactive section LCai of the active cell region LCa is larger than the thickness (the same as the foregoing depth D2) of the p-type body region PB in the hole collector cell region LCc. The reason for this is the same as described above with reference to FIGS. 29 and 30 described above.

In the active cell region LCa, as a result of setting the impurity concentration of the n-type hole barrier region HB1 lower, the position of the bottom surface of the p-type body region PB becomes deeper and the thickness of the p-type body region PB increases. Consequently, the resistance (equivalent to the foregoing base resistance Rb) of the p-type body region PB is reduced to reduce the likelihood of the operation of the parasitic npn bipolar transistor and the occurrence of latch-up. On the other hand, in the hole collector cell region LCc, as a result of setting the impurity concentration of the n-type hole barrier region HB2 higher, the position of the bottom surface of the p-type body region PB becomes shallower and the thickness of the p-type body region PB decreases. However, since the parasitic npn bipolar transistor has not been formed, there should be no adverse effect.

The impurity concentration of the n-type hole barrier region HB2 which is higher than the impurity concentration of the n-type hole barrier region HB1 is more preferably not less than double the impurity concentration of the n-type hole barrier region HB1. This can more reliably provide the effect of reducing the ON voltage.

Even when the impurity concentration of the n-type hole barrier region HB2 is set higher, the effect of reducing the ON voltage is saturated when the impurity concentration reaches a given level (see FIG. 32 described later). In addition, when the impurity concentration of the n-type hole barrier region HB2 is excessively increased, there may be a reduction in the effect of discharging holes from the hole collector cell region LCc into the emitter electrode EE at the turn-OFF time. From this viewpoint, the impurity concentration of the n-type hole barrier region HB2 is more preferably not more than twenty-five times the impurity concentration of the n-type hole barrier region HB.

Accordingly, the impurity concentration of the n-type hole barrier region HB2 is particularly preferably twice to twenty-five times the impurity concentration of the n-type hole barrier region HB1.

On the other hand, the impurity concentration of the n-type hole barrier region HB1 is preferably not more than $2 \times 10^{16}/cm^{-3}$.

Figure 32:
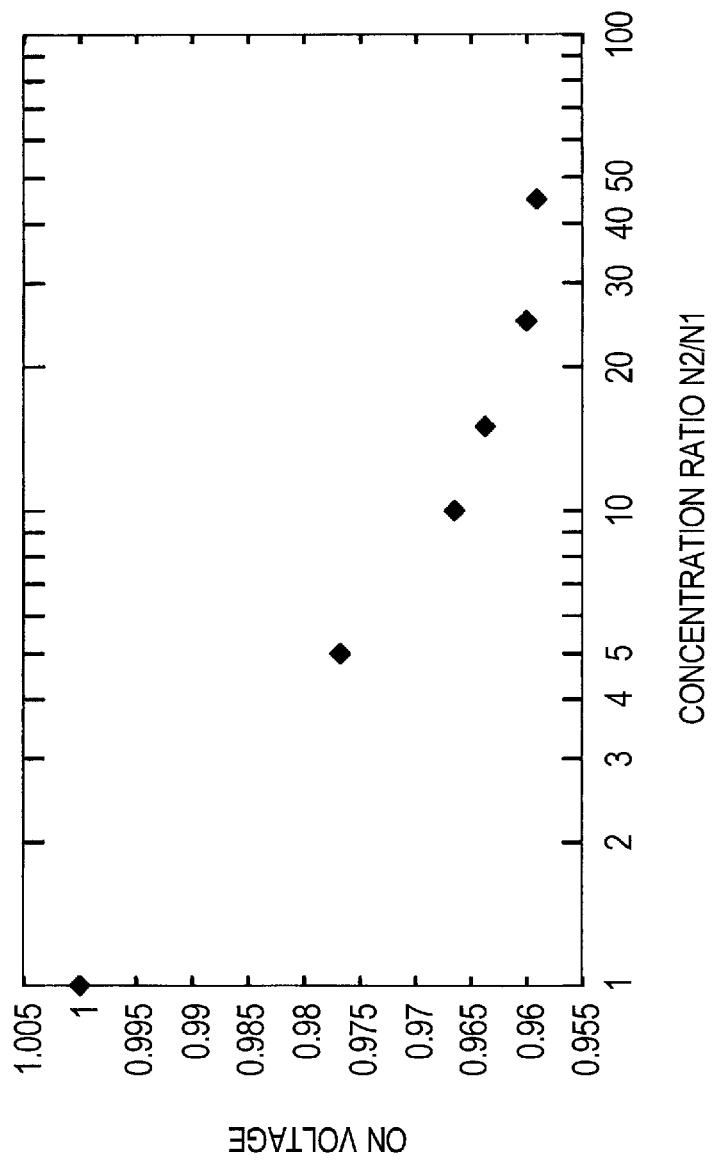
FIG. 32 is a graph showing the correlation between an impurity concentration of an n-type hole barrier region and an ON voltage.

FIG. 32 is a graph showing the correlation between the impurity concentration of the n-type hole barrier region and the ON voltage and shows the result of simulation. The abscissa axis of the graph in FIG. 32 shows the ratio (concentration ratio) of the impurity concentration of the n-type hole barrier region HB2 to the impurity concentration of the n-type hole barrier region HB1. That is, when the impurity concentration of the n-type hole barrier region HB2 is N2 and the impurity concentration of the n-type hole barrier region HB1 is N1, a value given by N2/N1 corresponds to the abscissa axis of the graph in FIG. 32. However, the abscissa axis in FIG. 32 is a logarithmic axis. On the other hand, the ordinate axis of the graph in FIG. 32 corresponds to the ON voltage (voltage between the emitter electrode and the collector electrode in the ON state) and is normalized to the ON voltage when the value given by N2/N1 is 1.

From the graph in FIG. 32, it can be seen that, when the impurity concentration of the n-type hole barrier region HB1 is fixed and the impurity concentration of the n-type hole barrier region HB2 is increased, i.e., when the value (N2/N1) of the abscissa axis of the graph in FIG. 32 is increased, the ON voltage can be reduced. This means that, when the impurity concentration of the n-type hole barrier region HB2 is increased, the IE effect is enhanced and the ON voltage decreases. When the impurity concentration (N2) of the n-type hole barrier region HB2 is set to twenty-five times the impurity concentration (N1) of the n-type hole barrier region HB1 on the basis of the value of the impurity concentration (N2) when the impurity concentration (N2) is the same as the impurity concentration (N1) of the n-type hole barrier region HB1, the ON voltage can be reduced by about 4%. In the graph in FIG. 32, even when the impurity concentration (N2) of the n-type hole barrier region HB2 is further increased to be larger than twenty-five times the impurity concentration (N1) of the n-type hole barrier region HB1, the value of the ON voltage is substantially saturated so that the effect of further reducing the ON voltage is low. Note that a reduction in ON voltage also corresponds to a reduction in ON resistance.

Also, in the present embodiment, the hole collector cell region LCc is provided. As a result, when a turn-OFF operation is performed, the holes stored in the n-type base region can be discharged also from the hole collector cell region LCc into the emitter electrode EE. This can reduce a turn-OFF loss. In the present embodiment, the impurity concentration of the n-type hole barrier region HB2 formed in the hole collector cell region LCc is increased to thus enhance the IE effect and reduce the ON voltage. Even when the impurity concentration of the n-type hole barrier region HB2 is increased, a discharge path for the holes remains unchanged and therefore it is possible to avoid the difficulty in discharging the holes at the turn-OFF time. Accordingly, it is possible to reduce the turn-OFF loss in the IGBT to allow an improvement in the switching speed of the IGBT and an improvement in the performance of the semiconductor device.

The n-type hole barrier regions HB1 and HB2 are hole barrier semiconductor regions and holes are stored immediately under the n-type hole barrier regions HB1 and HB2. Accordingly, each of the n-type hole barrier regions HB1 and HB2 has an impurity concentration higher than that of the n$^-$-type drift region ND. As a result, holes are stored in the portions of the n$^-$-type drift region ND which are adjacent to the n-type hole barrier regions HB1 and HB2. This allows a channel current to be easily drawn and thus allows a reduction in ON voltage (ON resistance).

In the present embodiment, when the impurity concentration of the n-type hole barrier region HB1 is excessively increased, latch-up due to the parasitic npn bipolar transistor (BP2) may occur so that the impurity concentration of the n-type hole barrier region HB1 is reduced to a degree. On the other hand, even when the impurity concentration of the n-type hole barrier region HB2 is increased, the latch-up due to the parasitic npn bipolar transistor does not occur. Accordingly, the impurity concentration of the n-type hole barrier region HB2 is set higher than the impurity concentration of the n-type hole barrier region HB1. By increasing the impurity concentration of the n-type hole barrier region HB2, the concentration of the holes stored immediately under the n-type hole barrier region HB2 is also increased. This allows holes to be more likely to be stored immediately under the n-type hole barrier region HB1. As a result, the concentration of the holes stored immediately under the n-type hole barrier region HB1 increases to allow the channel current to be easily drawn into the active cell region LCa and allow a reduction in ON voltage. Moreover, carriers which travel from the hole collector cell region LCc into the emitter electrode EE are also reduced. This can also contribute to a reduction in ON voltage.

<About Electronic System Using Semiconductor Device>

Figure 33:
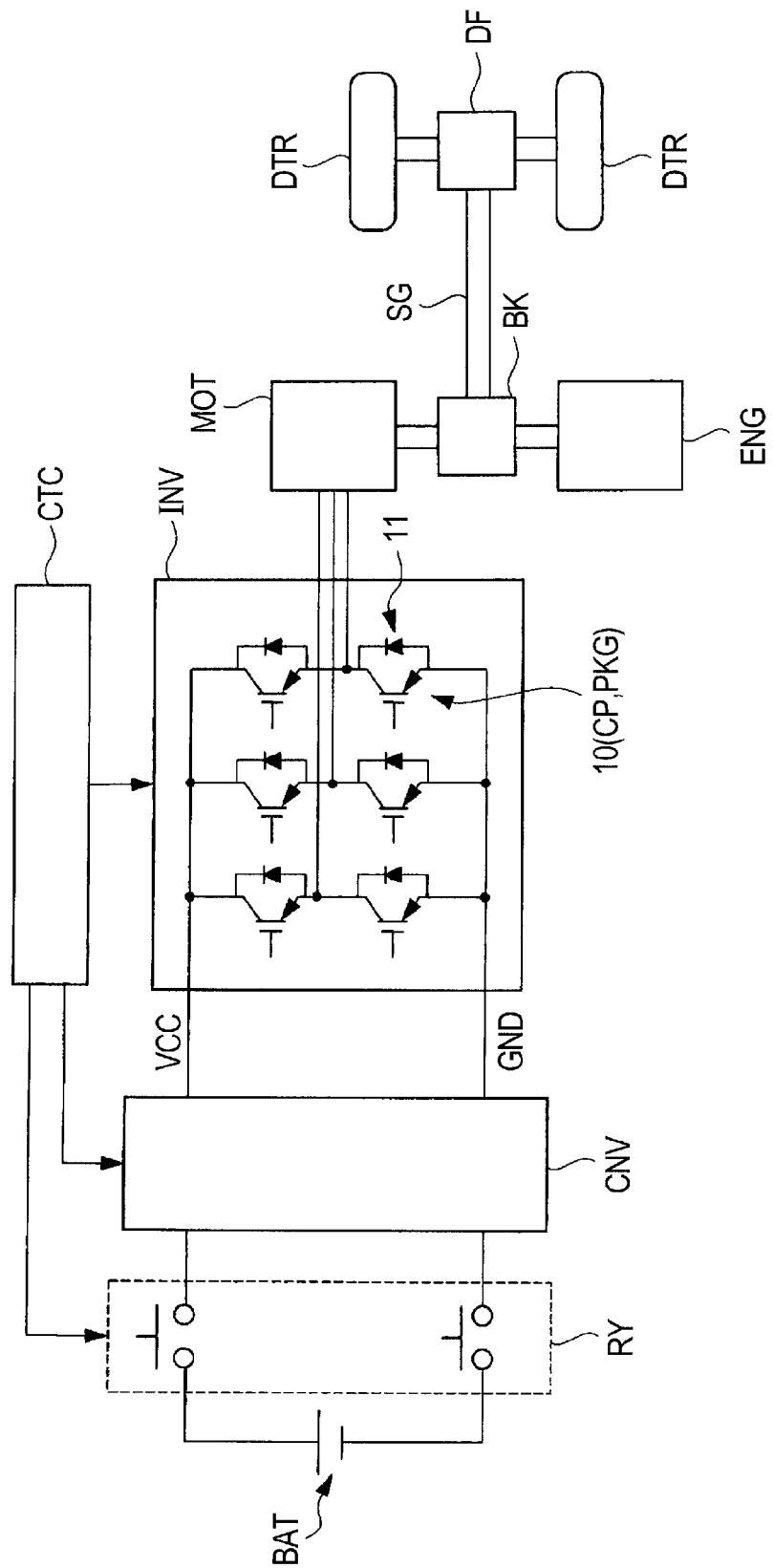
FIG. 33 is an illustrative view showing an example of an electronic system using the semiconductor device in the embodiment.

Next, a description will be given of an electronic system (electronic device) using the semiconductor device CP in the present embodiment. FIG. 33 is an illustrative view (circuit block diagram) showing an example of the electronic system (electronic device) using the semiconductor device CP in the present embodiment, which is an electric vehicle system.

The electronic system shown in FIG. 33, which is the electric vehicle system herein, has a load such as a motor MOT, an inverter (inverter circuit) INV, a power supply BAT, and a control unit (control circuit or controller) CTC. As the motor MOT, a 3-phase motor is used herein. The 3-phase motor is configured to be driven with a 3-phase voltage in different phases. The foregoing semiconductor device PC is a component of the inverter INT.

In the electronic system in FIG. 33, the power supply BAT is coupled to the inverter INV via a relay RY and a converter (boost converter) CNV such that a voltage (power) is supplied from the power supply BAT to the inverter INV. Since the converter CNV is interposed between the power supply BAT and the inverter INV, the voltage (dc voltage) from the power supply BAT is converted (boosted) to a voltage appropriate for driving the motor in the converter CNV and then supplied to the inverter INV. The relay RY is interposed between the power supply BAT and the converter DNV. Using the relay RY, the state between the power supply BAT and the converter CNV can be switched to a coupled state or an uncoupled state.

To the inverter INV, the motor MOT is coupled. A dc voltage (dc power) supplied from the power supply BAT to the inverter INV via the converter CNV is converted to an ac voltage (ac power) in the inverter INV to be supplied to the motor MOT. The motor MOT is driven with the ac voltage (ac power) supplied from the inverter INV.

The motor MOT can rotate (drive) the tires (wheels) of a vehicle.

For example, in the case of a hybrid vehicle, the output shaft of the motor MOT and the output shaft of an engine ENG are combined by a power distribution mechanism BK and the torque thereof is transmitted to an axle SG. The axle SG operates in conjunction with drive wheels DTR via differentials DF. In the case where a large drive force is needed or the like, the motor MOT is driven together with the engine ENG. The output torques thereof are combined by the power distribution mechanism BK and transmitted to the drive wheels DTR via the axle SG to be able to drive the drive wheels DTR. In such a case where the needed drive force is not so large (e.g., when the vehicle drives at a given speed), it is possible to stop the engine ENG and drive the drive wheels DTR only with the motor MOT. In the case of the hybrid vehicle, the engine ENG is also needed in addition to the motor MOT. However, in the case of an electric vehicle which does not have an engine, the engine ENG can be omitted.

To the inverter INV, the control unit CTC is also coupled. The inverter INV is configured to be controlled by the control unit CTC. That is, a dc voltage (dc power) is supplied from the power supply BAT to the inverter INV, converted to an ac voltage (ac power) by the inverter INV controlled by the control unit CTC, and supplied to the motor MOT to be able to drive the motor MOT. The control unit CTC is configured of, e.g., an ECU (Electronic Control Unit) and has a control semiconductor chip such as an MCU (Micro Controller Unit) embedded therein. The relay RY and the converter CNV can also be controlled by the control unit CTC.

The inverter INV has six IGBTs 10 and six diodes (free wheel diodes) 11 in correspondence to three phases. Each of the IGBTs 10 is configured of the foregoing semiconductor device CP. That is, the inverter INV in FIG. 33 includes the six semiconductor devices CP described above and each one of the semiconductor devices CP forms one of the IGBTs 10. The inverter INV includes the total of six pairs of the IGBTs 10 and the diodes 11 because the motor MOT is the 3-phase motor. When the motor MOT is a 2-phase motor, it follows that the inverter INV includes the total of four pairs of the IGBTs 10 and the diodes 11.

That is, in each of the three phases, between a power supply potential (VCC) supplied to the inverter INV from the power supply BAT via the converter CNV and an input potential to the motor MOT, the IGBT 10 and the diode 11 are coupled in inverse parallel. Between the input potential to the motor MOT and the ground potential (GND) also, the IGBT 10 and the diode 11 are coupled in inverse parallel. In other words, the two IGBTs 10 and the two diodes 11 are provided in each of the phases so that the total of the six IGBTs 10 and the total of the six diodes 11 are provided in three phases. To the gate electrode of each of the IGBTs 10, the control unit CTC is coupled so that the IGBT 10 is controlled by the control unit CTC.

By controlling the current flowing in each of the IGBTs 10 using the control unit CTC, the motor MOT is driven (rotated). That is, by controlling the turning ON/OFF of the IGBT 10 using the control unit CTC, the motor MOT can be driven. When the motor MOT is thus driven, the IGBT 10 needs to be turned ON/OFF and the motor MOT includes inductance. Accordingly, when the IGBT 10 is turned OFF, by the inductance included in the motor MOT, a reverse current in a direction reverse to the direction in which the current flows in the IGBT 10 is generated. Since the IGBT 10 does not have the function of allowing the reverse current to flow, by providing the diode 11 in inverse parallel with the IGBT 10, the reverse current is caused to flow backward to release the energy stored in the inductance.

Thus, the electronic system or the electronic device in the present embodiment has the semiconductor device CP electrically coupled to each of the power supply (which is the power supply BAT herein) and the load (which is the motor MOT herein) to drive the load and the control unit (which is the control unit CTC herein) which controls the semiconductor device CP.

In the electronic system shown in FIG. 33, the dc voltage (dc power) of the power supply BAT is converted by the inverter INV to the ac voltage (ac power) to drive the motor MOT. Accordingly, it is requested to reduce a power loss in the inverter INV. In addition, the ratio of the power loss in the IGBT 10 to the power loss in the inverter INV is high. By contrast, in the semiconductor device CP in the present embodiment, as described above, the ON voltage can be reduced and accordingly the ON voltage of the IGBT 10 configured of the semiconductor device CP can be reduced. This can reduce the power loss (power consumption) in the IGBT 10 and consequently reduce the power loss (power consumption) in the inverter INV. As a result, it is possible to inhibit the power from the power supply BAT from being consumed in the inverter INV and drive the motor MOT and therefore it is possible to improve the power efficiency of the entire electronic system.

A semiconductor device in Embodiment 2 or 3 described later can also be applied to the electronic system in FIG. 33.

Embodiment 2

Figure 34:
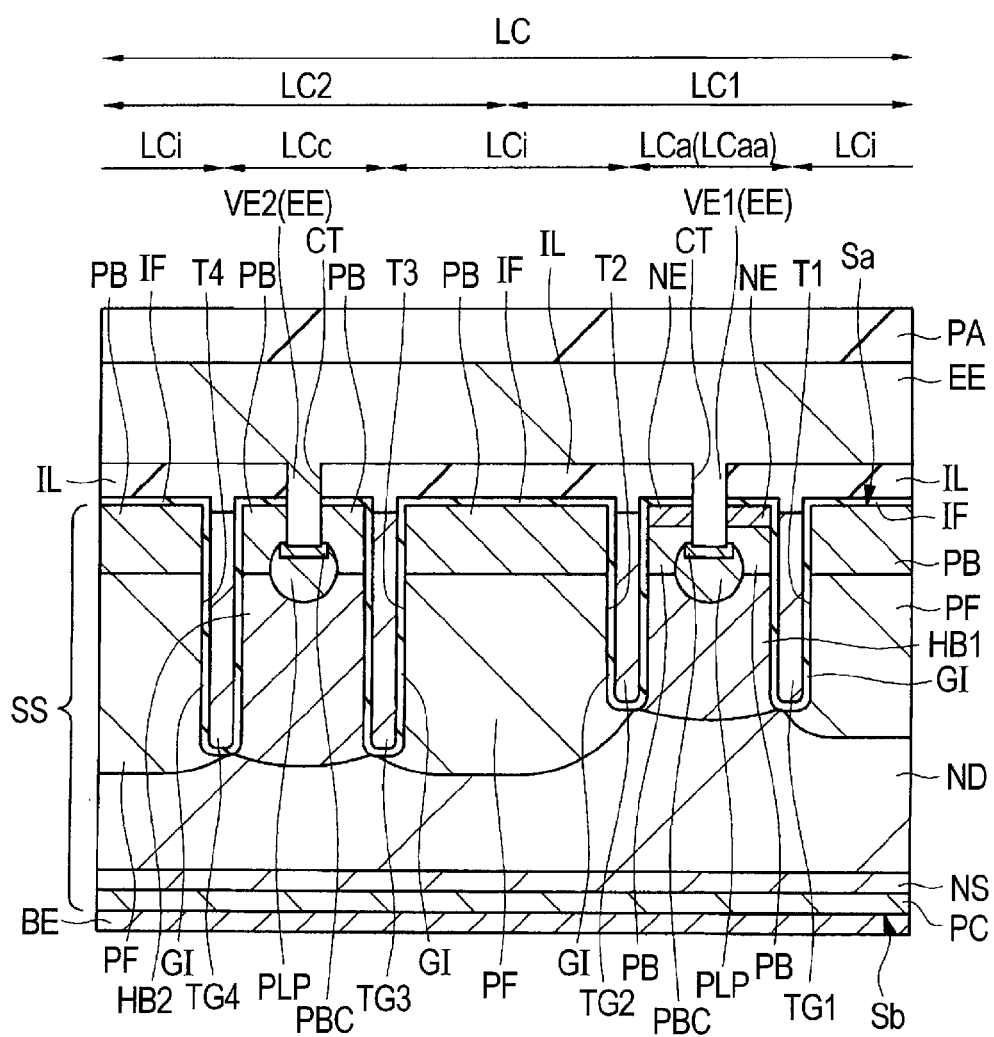
FIG. 34 is a main-portion cross-sectional view of a semiconductor device in another embodiment.

FIG. 34 is a main-portion cross-sectional view of the semiconductor device in Embodiment 2. FIG. 34 shows a cross-sectional region corresponding to FIG. 5 described above in Embodiment 1 described above.

The semiconductor device in Embodiment 2 shown in FIG. 34 is different from the semiconductor device in Embodiment 1 described above in the following point.

That is, in the semiconductor device in Embodiment 2, as also shown in FIG. 34, the depth of each of the trenches T3 and T4 is deeper than the depth of each of the trenches T1 and T2. That is, the bottom surface of each of the trenches T3 and T4 is at a depth position deeper than the depth position of the bottom surface of each of the trenches T1 and T2. In other words, the depth of each of the trenches T1 and T2 is shallower than the depth of each of the trenches T3 and T4 and the bottom surface of each of the trenches T1 and T2 is at a depth position shallower than the depth position of the bottom surface of each of the trenches T3 and T4. As a result, the bottom surface of each of the trench gate electrodes TG3 and TG4 embedded in the trenches T3 and T4 each via the gate insulating film GI is at a depth position deeper than the depth position of the bottom surface of each of the trench gate electrodes TG1 and TG2 embedded in the trenches T1 and T2 each via the gate insulating film GI. In other words, the bottom surface of each of the trench gate electrodes TG1 and TG2 is at a position shallower than the depth position of the bottom surface of each of the trench gate electrodes TG3 and TG4.

A configuration of the semiconductor device in Embodiment 2 is otherwise substantially the same as that of the semiconductor device in Embodiment 1 described above so that a repeated description thereof is omitted herein.

Next, a description will be given of the manufacturing process of the semiconductor device in Embodiment 2. FIGS. 35 to 39 are main-portion cross-sectional views of the semiconductor device in Embodiment 2 during the manufacturing process thereof and show cross-sectional views of the region corresponding to FIGS. 9 to 26 described above.

The manufacturing process of the semiconductor device in Embodiment 2 is basically the same as the manufacturing process of the semiconductor device in Embodiment 1 described above except that the trenches T1 and T2 and the trenches T3 and T4 are formed in different steps and the depth of each of the trenches T3 and T4 is set deeper than the depth of each of the trenches T1 and T2. Accordingly, a description will be given of the steps of forming the trenches T1 and T2 and the trenches T3 and T4 which are included in the manufacturing process in Embodiment 2.

The manufacturing process in Embodiment 2 is also the same as that in Embodiment 1 described above in the steps prior to and including the step of forming the foregoing hard mask film HM so that a repeated description thereof is omitted.

Figure 35:
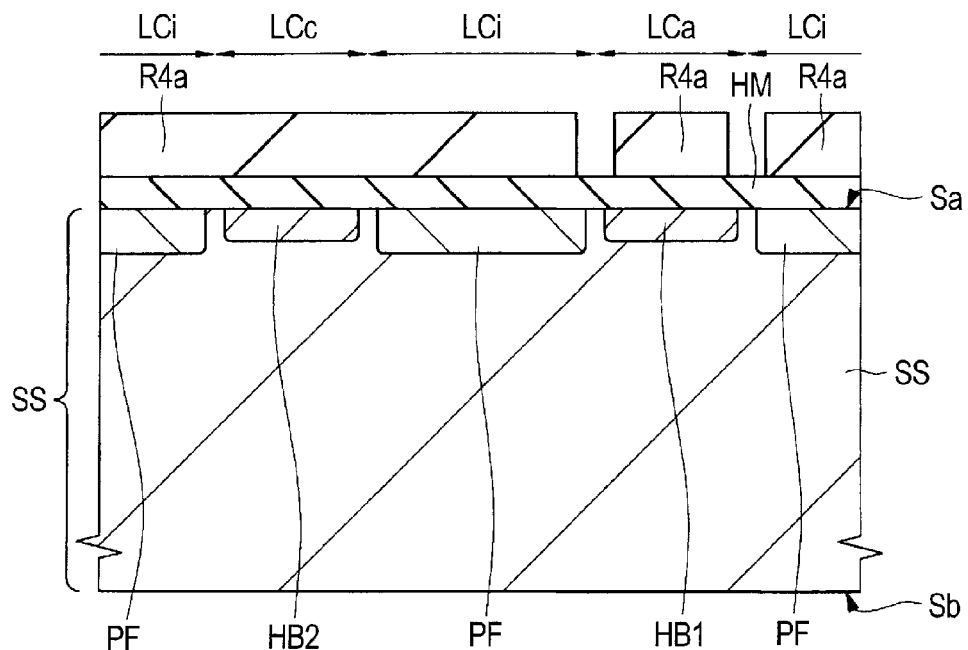
FIG. 35 is a main-portion cross-sectional view of the semiconductor device in the other embodiment during the manufacturing process thereof.
Figure 36:
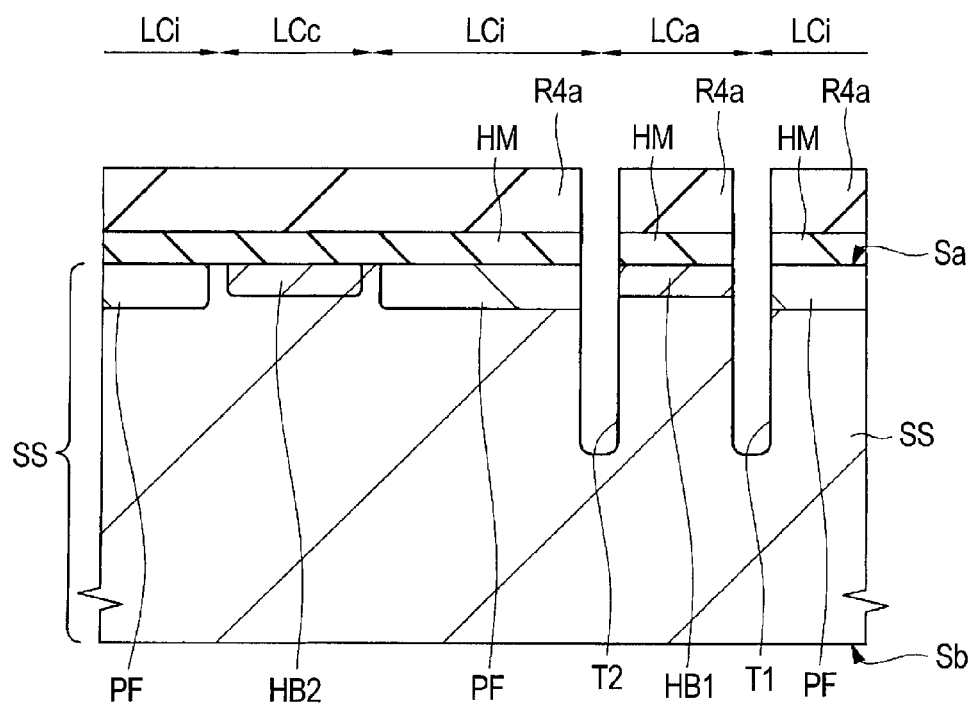
FIG. 36 is a main-portion cross-sectional view of the semiconductor device during the manufacturing process thereof, which is subsequent to FIG. 35.

After the steps prior to and including the step of forming the foregoing hard mask film HM are performed in the same manner as in Embodiment 1 described above, in Embodiment 2, a resist pattern R4a is formed over the hard mask film HM using a photolithographic technique, as shown in FIG. 35. In contrast to the foregoing resist pattern R4 having openings for forming the trenches T1, T2, T3, and T4, the resist pattern R4a has openings for forming the trenches T1 and T2, but does not have openings for forming the trenches T3 and T4. Then, as shown in FIG. 36, using the resist pattern R4a as an etching mask, the hard mask film HM and the semiconductor substrate SS are successively etched (e.g., dry-etched) to be formed with the trenches T1 and T2. Then, the unneeded resist pattern R4a is removed by ashing or the like.

Figure 37:
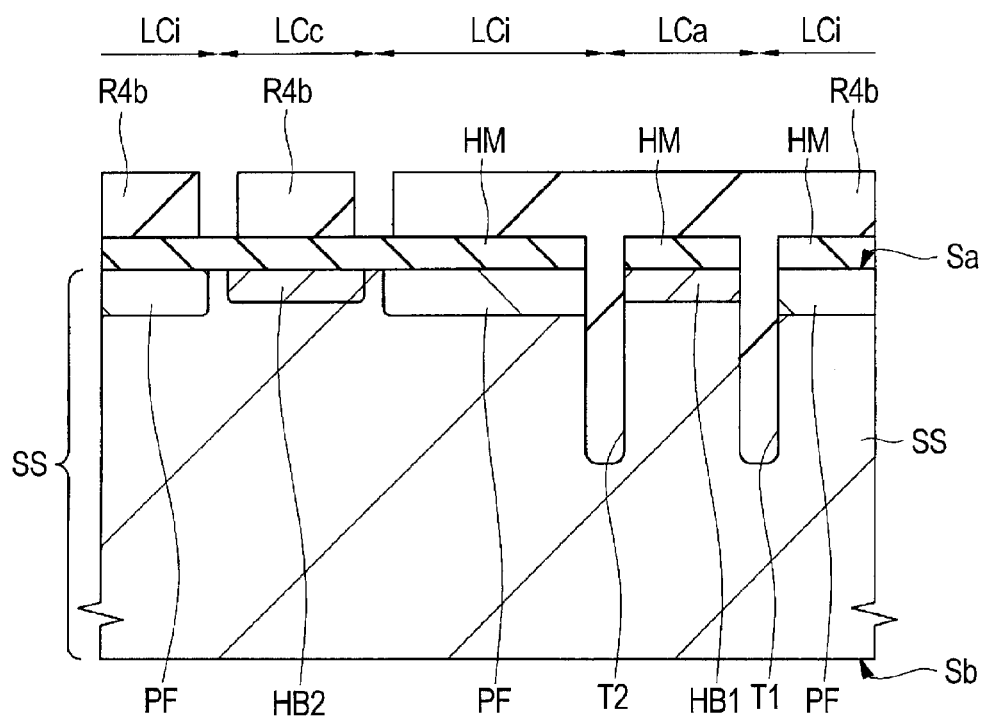
FIG. 37 is a main-portion cross-sectional view of the semiconductor device during the manufacturing process thereof, which is subsequent to FIG. 36.
Figure 38:
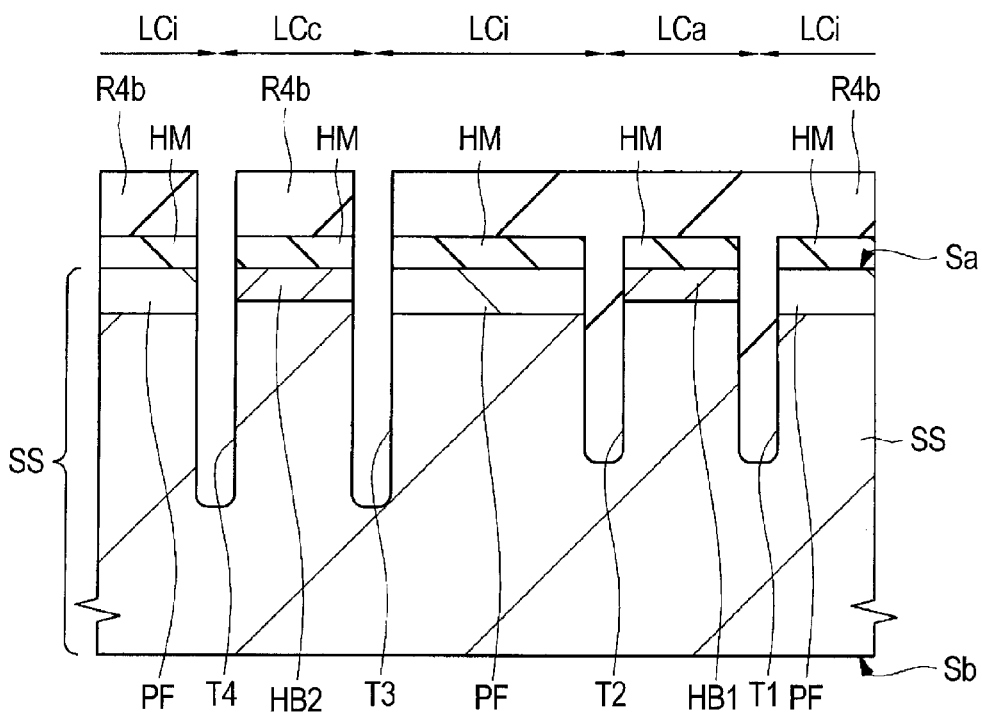
FIG. 38 is a main-portion cross-sectional view of the semiconductor device during the manufacturing process thereof, which is subsequent to FIG. 37.
Figure 39:
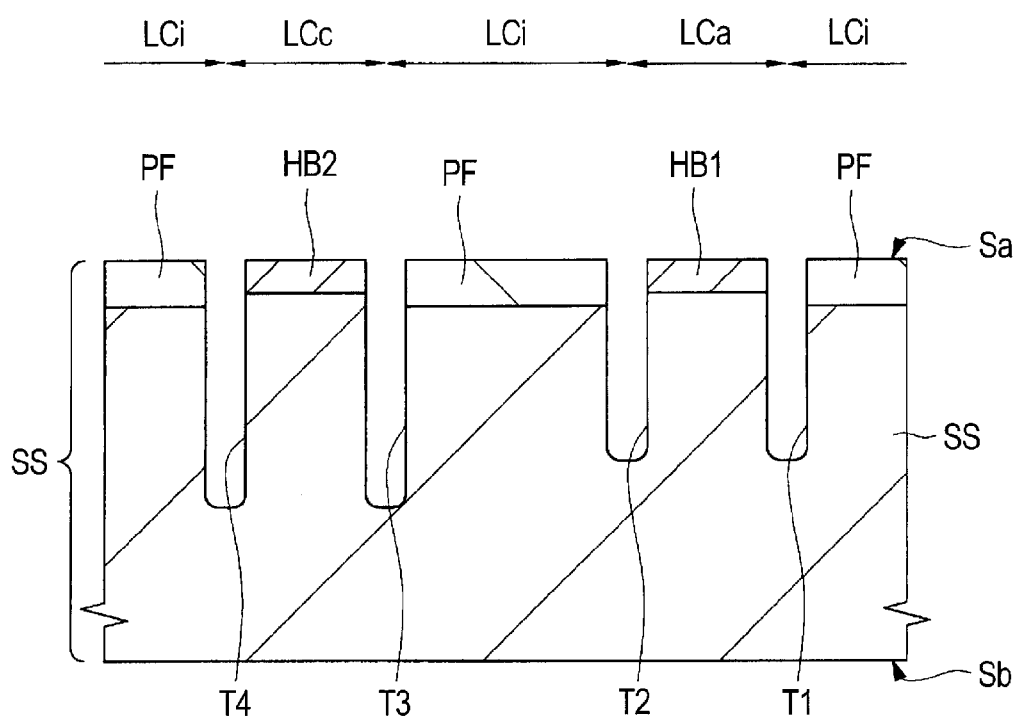
FIG. 39 is a main-portion cross-sectional view of the semiconductor device during the manufacturing process thereof, which is subsequent to FIG. 38.

Next, as shown in FIG. 37, over the hard mask film HM, using a photolithographic technique, a resist pattern R4b is formed. The resist pattern R4b has openings for forming the trenches T3 and T4, but does not have openings for forming the trenches T1 and T2. Then, as shown in FIG. 38, using the resist pattern R4b as an etching mask, the hard mask film HM and the semiconductor substrate SS are successively etched (e.g., dry-etched) to be formed with the trenches T3 and T4. The depth of each of the trenches T3 and T4 is deeper than the depth of each of the trenches T1 and T2. Then, the unneeded resist pattern R4b is removed by ashing or the like. Then, as shown in FIG. 39, the unneeded hard mask film HM is removed by wet etching or the like.

The description has been given heretofore of the case where the trenches T1 and T2 are formed first and then the trenches T3 and T4 are formed. However, it is also possible to form the trenches T3 and T4 first and then form the trenches T1 and T2.

The subsequent steps are basically the same as the steps in FIGS. 17 to 26 described above in Embodiment 1 described above so that a repeated description thereof is omitted herein.

In Embodiment 2, in addition to the effect obtained in Embodiment 1 described above, the following effects can also be further obtained.

That is, in Embodiment 2, the depth of each of the trenches T3 and T4 is deeper than the depth of each of the trenches T1 and T2. By setting the depths of the trenches T3 and T4 deeper, the number of the holes stored in the hole collector cell region LCc increases to be able to enhance the effect of reducing the ON voltage. On the other hand, by setting the depths of the trenches T1 and T2 shallower than the depths of the trenches T3 and T4, it is possible to reduce a gate capacitance formed between the trench gate electrodes TG1 and TG2 and the semiconductor substrate SS. This can improve a switching property.

To maximize the IE effect and minimize the ON voltage, it is effective to increase the depths of the trenches T1, T2, T3, and T4. This limits a path along which holes move into the emitter electrode EE to the region enclosed by the deep trenches T1, T2, T3, and T4 so that the number of the stored holes increases to allow an easy reduction in ON voltage. The trench gate electrodes TG1 and TG2 embedded in the trenches T1 and T2 face the semiconductor substrate SS via the gate insulating film GI so that the gate capacitance is formed between the trench gate electrodes TG1 and TG2 and the semiconductor substrate SB. However, when the gate capacitance increases, the switching property may deteriorate. Accordingly, in terms of reducing the gate capacitance and improving the switching property, it is desirable that the trenches T1 and T2 are not excessively deepened. On the other hand, since each of the trench gate electrodes TG3 and TG4 embedded in the trenches T3 and T4 does not function as a gate electrode, even when the trenches T3 and T4 are deepened, there is no concern about the deterioration of the switching property.

In view of this, in Embodiment 2, the respective depths of the trenches T3 and T4 are set deeper than the respective depths of the trenches T1 and T2. By setting the depths of the trenches T3 and T4 deeper, it is possible to further reduce the ON voltage. Also, by setting the depths of the trenches T1 and T2 shallower than the depths of the trenches T3 and T4, it is possible to reduce the gate capacitance formed between the trench gate electrodes TG1 and TG2 and the semiconductor substrate SS. As a result, it is possible to improve the switching property and accordingly improve the performance of the semiconductor device.

Embodiment 3

Figure 40:
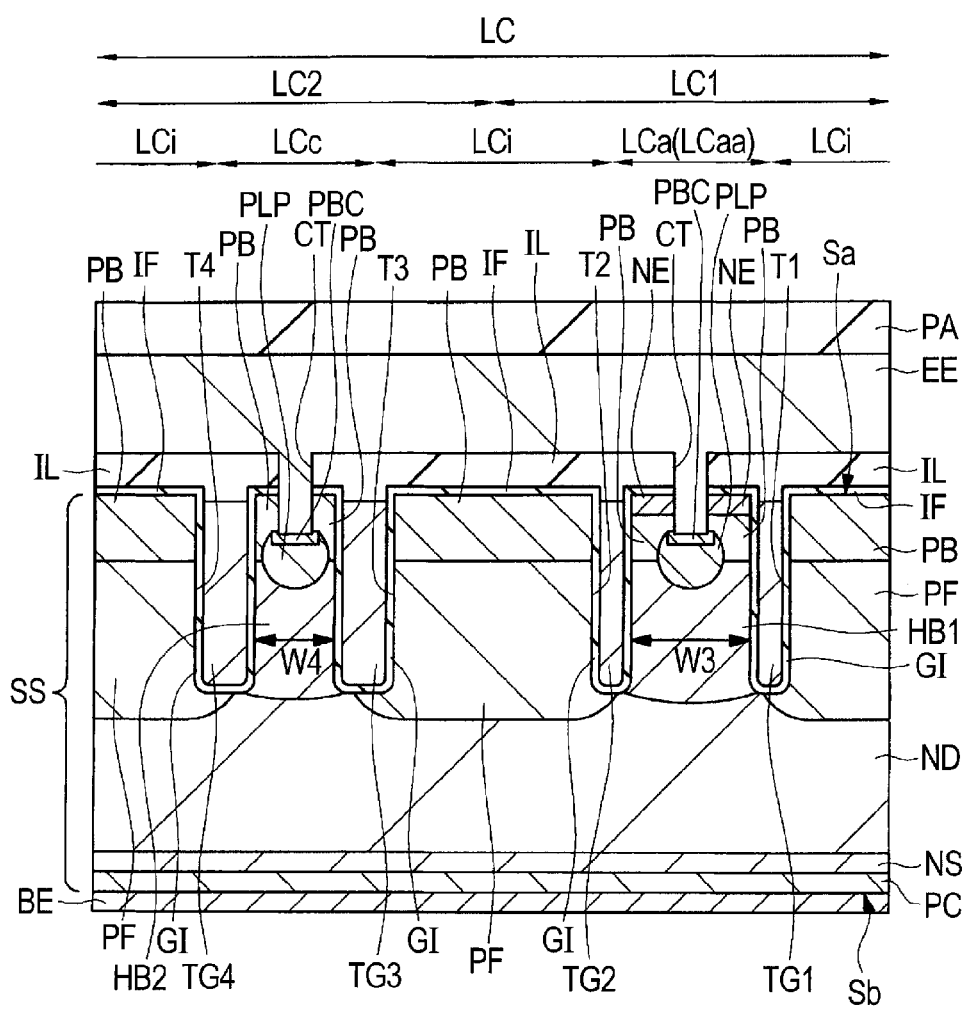
FIG. 40 is a main-portion cross-sectional view of the semiconductor device in still another embodiment.

FIG. 40 is a main-portion cross-sectional view of the semiconductor device in Embodiment 3. FIG. 40 shows a cross-sectional region corresponding to FIG. 5 described above in Embodiment 1 described above.

The semiconductor device in Embodiment 3 shown in FIG. 40 is different from the semiconductor device in Embodiment 1 described above in the following point.

That is, in the semiconductor device in Embodiment 3, as also shown in FIG. 40, the respective widths (widths in the foregoing X-direction) of the trenches T3 and T4 are larger than the respective widths (widths in the foregoing X-direction) of the trenches T1 and T2. As a result, the respective widths (widths in the foregoing X-direction) of the trench gate electrodes TG3 and TG4 embedded in the trenches T3 and T4 each via the gate insulating film GI are larger than the respective widths (widths in the foregoing X-direction) of the trench gate electrodes TG1 and TG2 embedded in the trenches T1 and T2 each via the gate insulating film GI. In addition, a space W4 between the trenches T3 and T4 is smaller than a space W3 between the trenches T1 and T2 (i.e., W4<W3 is satisfied).

The space W4 between the trenches T3 and T4 and the space W3 between the trenches T1 and T2 are the spaces in the foregoing X-direction. The space W4 between the trenches T3 and T4 corresponds to the width (width in the foregoing X-direction) of the region of the semiconductor substrate SS which is interposed between the trenches T3 and T4 and also corresponds to the width (width in the foregoing X-direction) of the n-type hole barrier region HB2 formed in the region of the semiconductor substrate SS which is interposed between the trenches T3 and T4. The space W3 between the trenches T1 and T2 corresponds to the width (width in the foregoing X-direction) of the region of the semiconductor substrate SS which is interposed between the trenches T1 and T2 and also corresponds to the width (width in the foregoing X-direction) of the n-type hole barrier region HB1 formed in the region of the semiconductor substrate SS which is interposed between the trenches T1 and T2.

A configuration of the semiconductor device in Embodiment 3 is otherwise substantially the same as that of the semiconductor device in Embodiment 1 described above so that a repeated description thereof is omitted herein.

Next, a description will be given of the manufacturing process of the semiconductor device in Embodiment 3. FIGS. 41 to 44 are main-portion cross-sectional views of the semiconductor device in Embodiment 3 during the manufacturing process thereof and show cross-sectional views of the region corresponding to FIGS. 9 to 26 described above.

The manufacturing process of the semiconductor device in Embodiment 3 is basically the same as the manufacturing process of the semiconductor device in Embodiment 1 described above except that, when the trenches T1, T2, T3, and T4 are formed in the steps in FIGS. 13 to 16 described above, the widths of the trenches T3 and T4 are set larger than the widths of the trenches T1 and T2. Accordingly, a description will be given of the steps of forming the trenches T1, T2, T3, and T4 which are included in the manufacturing process in Embodiment 3.

The manufacturing process in Embodiment 3 is also the same as that in Embodiment 1 described above in the steps prior to and including the step of forming the foregoing hard mask film HM so that a repeated description thereof is omitted.

Figure 41:
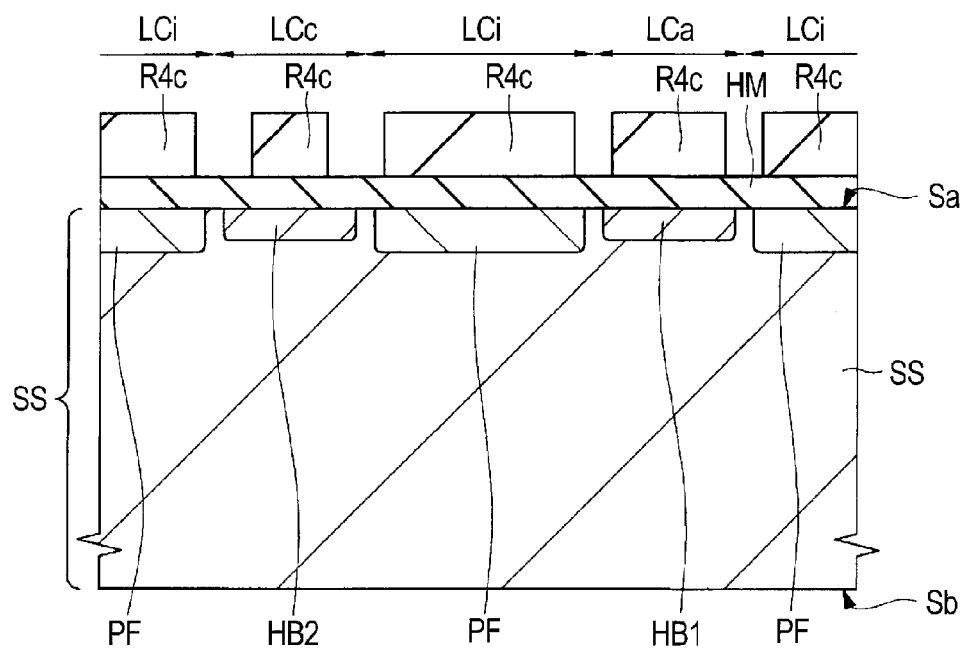
FIG. 41 is a main-portion cross-sectional view of the semiconductor device in the still other embodiment during the manufacturing process thereof.
Figure 42:
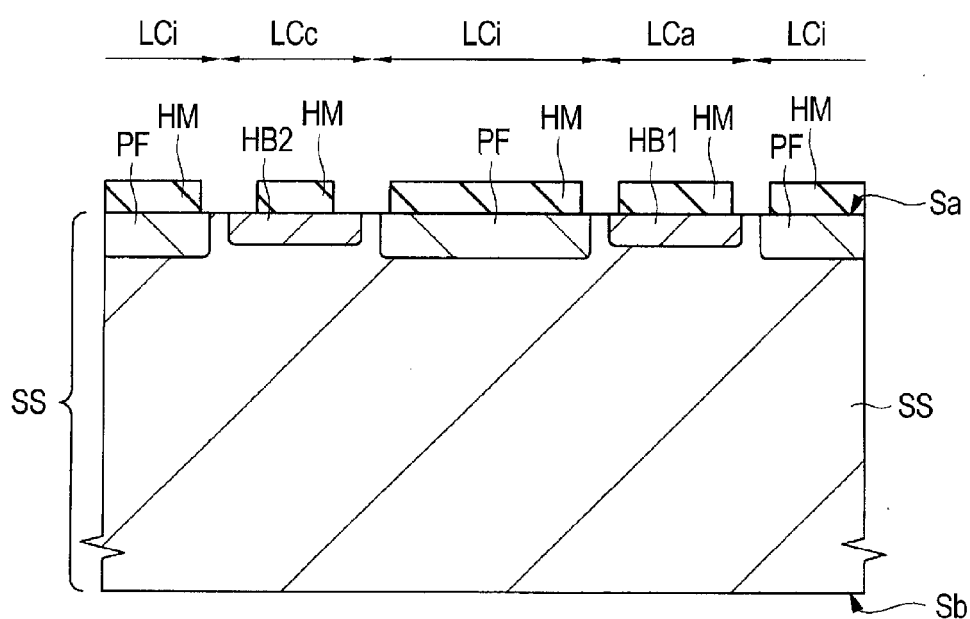
FIG. 42 is a main-portion cross-sectional view of the semiconductor device during the manufacturing process thereof, which is subsequent to FIG. 41.

After the steps prior to and including the step of forming the foregoing hard mask film HM is performed in the same manner as in Embodiment 1 described above, in Embodiment 3, a resist pattern R4c is formed over the hard mask film HM using a photolithographic technique, as shown in FIG. 41. In the resist pattern R4c, openings for forming the trenches T3 and T4 have dimensions different from those in the foregoing resist pattern R4. Then, using the resist pattern R4c as an etching mask, the hard mask film HM is etched (e.g., dry-etched) to be patterned. Then, the unneeded resist pattern R4a is removed by asking or the like. FIG. 42 shows the semiconductor device at this stage.

Figure 43:
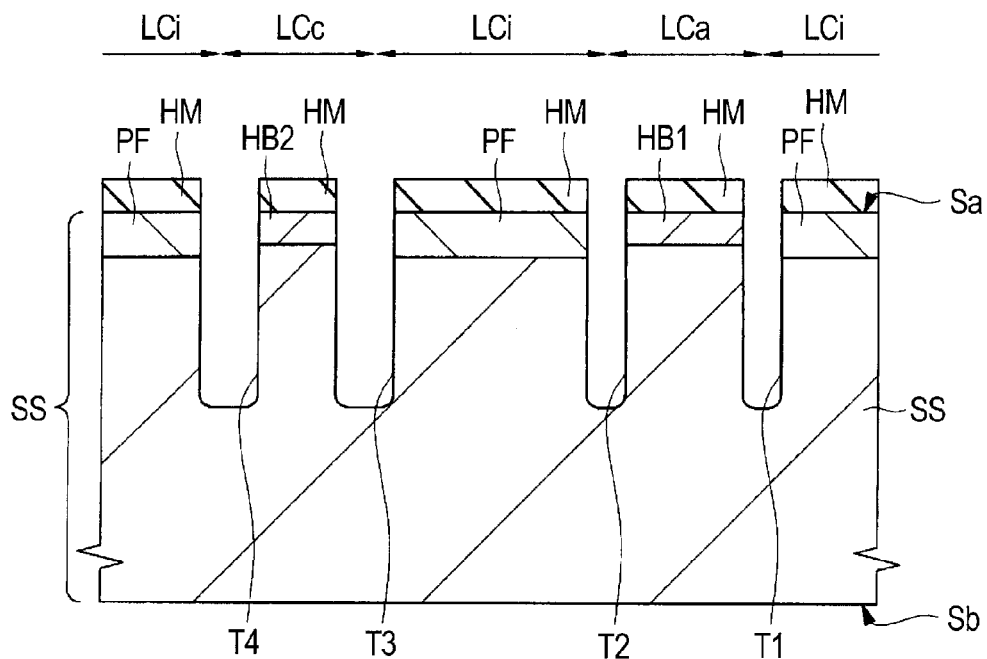
FIG. 43 is a main-portion cross-sectional view of the semiconductor device during the manufacturing process thereof, which is subsequent to FIG. 42.
Figure 44:
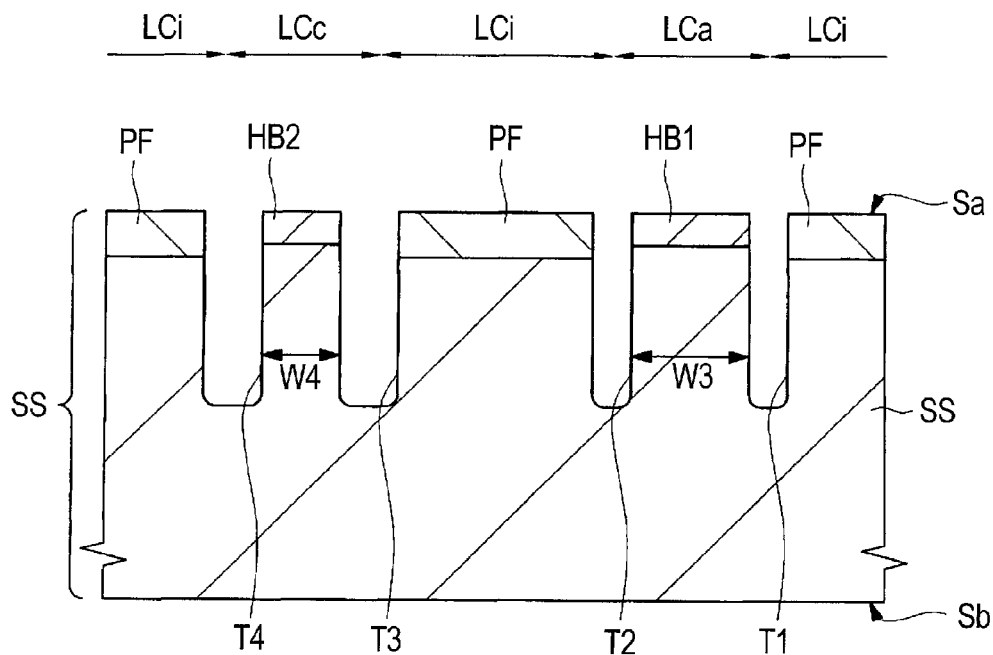
FIG. 44 is a main-portion cross-sectional view of the semiconductor device during the manufacturing process thereof, which is subsequent to FIG. 43.

Next, as shown in FIG. 43, using the patterned hard mask film HM as an etching mask, the semiconductor substrate SS is etched (e.g., anisotropically dry-etched) to be formed with the trenches T1, T2, T3, and T4. Then, as shown in FIG. 44, the unneeded hard mask film HM is removed by wet etching. The respective widths (widths in the foregoing X-direction) of the formed trenches T3 and T4 are larger than the respective widths (widths in the foregoing X-direction) of the formed trenches T1 and T2. As a result, the space W4 between the trenches T3 and T4 is smaller than the space W3 between the trenches T1 and T2 (i.e., W4<W3 is satisfied).

The subsequent steps are basically the same as the steps in FIGS. 17 to 26 described above in Embodiment 1 described above so that a repeated description thereof is omitted.

In Embodiment 3, in addition to the effects obtained in Embodiment 1 described above, the following effect can further be obtained.

That is, in Embodiment 3, the space W4 between the trenches T3 and T4 is smaller than the space W3 between the trenches T1 and T2 (i.e., W4<W3 is satisfied). By setting the space W4 between the trenches T3 and T4 smaller, the number of holes stored in the hole collector region LCc increases to be able to enhance the effect of reducing the ON voltage. On the other hand, by setting the space W3 between the trenches T1 and T2 larger than the space W4, the structure of the foregoing field effect transistor FE can easily be formed properly in the region of the semiconductor substrate SS which is interposed between the trenches T1 and T2.

To maximize the IE effect and minimize the ON voltage, it is effective to reduce the space W3 between the trenches T1 and T2 and the space W4 between the trenches T3 and T4. As a result, the path along which the holes move into the emitter electrode EE is narrowed to increase the number of the stored holes and allow an easy reduction in ON voltage.

However, in the region of the semiconductor substrate SS which is interposed between the trenches T1 and T2, the structure of the foregoing field effect transistor FE needs to be properly formed. For example, in the region of the semiconductor substrate SS which is interposed between the trenches T1 and T2, an n-type semiconductor region (corresponding to the $n^+$-type emitter region NE herein) which serves as a source, an n-type semiconductor region (corresponding to the n-type hole barrier region HB1) which serves as a drain region, and a p-type semiconductor region (the portions of the p-type body region PB which are adjacent to the side surfaces of the trenches T1 and T2 herein) which serves as a channel formation region need to be properly formed.

The space W3 between the trenches T1 and T2 corresponds to the width (width in the foregoing X-direction) of the region of the semiconductor substrate SS which is interposed between the trenches T1 and T2. Accordingly, when the space W3 between the trenches T1 and T2 is reduced, the width of the region of the semiconductor substrate SS which is interposed between the trenches T1 and T2 decreases. Consequently, it becomes difficult to properly form the structure of the foregoing field effect transistor FE in the region of the semiconductor substrate SS which is interposed between the trenches T1 and T2. On the other hand, in the region of the semiconductor substrate SS which is interposed between the trenches T3 and T4, the structure of the foregoing field effect transistor FE need not be formed. Accordingly, even when the space W4 between the trenches T3 and T4 decreases and consequently the width (width in the foregoing X-direction) of the region of the semiconductor substrate SS which is interposed between the trenches T3 and T4 decreases, a manufacturing problem is less likely to arise.

In view of this, in Embodiment 3, the space W4 between the trenches T3 and T4 is reduced to allow a further reduction in ON voltage and also the space W3 between the trenches T1 and T2 is set larger than the space W4 between the trenches T3 and T4. This allows the structure of the foregoing field effect transistor FE to be easily and properly formed in the region of the semiconductor substrate SS which is interposed between the trenches T1 and T2. Therefore, it is possible to improve the manufacturing yield of the semiconductor device and also allow easy control of the manufacturing process of the semiconductor device.

As described above, in Embodiment 3, it is important to set the space W4 between the trenches T3 and T4 smaller than the space W3 between the trenches T1 and T2. As a method for achieving this, in the case of FIG. 40 described above, the respective widths (widths in the foregoing X-direction) of the trenches T3 and T4 are set larger than the respective widths (widths in the foregoing X-direction) of the trenches T1 and T2. The increased widths of the trenches T3 and T4 accordingly allow the width (width in the foregoing X-direction) of the region of the semiconductor substrate SS which is interposed between the trenches T3 and T4 to be reduced. Consequently, it is possible to reduce the space W4 between the trenches T3 and T4.

In another form, it is also possible to set the respective widths of the trenches T3 and T4 equal to the respective widths of the trenches T1 and T2 and also set the space W4 between the trenches T3 and T4 smaller than the space W3 between the trenches T1 and T2. In such a case also, the space W4 between the trenches T3 and T4 which has been set smaller can achieve a further reduction in ON voltage and the space W3 between the trenches T1 and T2 which has been set larger than the space W4 between the trenches T3 and T4 allows the structure of the foregoing field effect transistor FE to be easily and properly formed in the region of the semiconductor substrate SS which is interposed between the trenches T1 and T2.

It is also possible to combine Embodiment 3 with Embodiment 2 described above. In this case, even in the semiconductor device in Embodiment 3, the respective depths of the trenches T3 and T4 are deeper than the respective depths of the trenches T1 and T2. This allows a further reduction in ON voltage, while reducing the gate capacitance.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device having an IGBT, comprising:
   a semiconductor substrate having a first main surface and a second main surface opposite to the first main surface;

a first semiconductor region having a first conductivity type and formed in the semiconductor substrate to be closer to the second main surface;

a collector electrode formed over the second main surface of the semiconductor substrate to be electrically coupled to the first semiconductor region;

a second semiconductor region having a second conductivity type opposite to the first conductivity type and formed in the semiconductor substrate to be located over the first semiconductor region;

first and second trenches formed in the first main surface of the semiconductor substrate to face each other;

third and fourth trenches formed in the first main surface of the semiconductor substrate to face each other;

a first trench gate electrode formed in the first trench via a first gate insulating film;

a second trench gate electrode formed in the second trench via a second gate insulating film;

a first trench electrode formed in the third trench via a first insulating film;

a second trench electrode formed in the fourth trench via a second insulating film;

a third semiconductor region having the first conductivity type and formed in a portion of the semiconductor substrate which is interposed between the first and second trenches to be closer to the first main surface;

a fourth semiconductor region having the second conductivity type and formed in the portion of the semiconductor substrate which is interposed between the first and second trenches to be located in an upper portion of the third semiconductor region;

a fifth semiconductor region having the second conductivity type and formed in the portion of the semiconductor substrate which is interposed between the first and second trenches to be located under the third semiconductor region;

a sixth semiconductor region having the first conductivity type and formed in a portion of the semiconductor substrate which is interposed between the third and fourth trenches to be closer to the first main surface;

a seventh semiconductor region having the second conductivity type and formed in the portion of the semiconductor substrate which is interposed between the third and fourth trenches to be located under the sixth semiconductor region; and an emitter electrode formed over the first main surface of the semiconductor substrate to be electrically coupled to the third, fourth, and sixth semiconductor regions;

wherein, in the portion of the semiconductor substrate which is interposed between the third and fourth trenches, a semiconductor region having the second conductivity type and electrically coupled to the emitter electrode is not formed over the sixth semiconductor region, wherein the first and second trench electrodes are electrically coupled to the emitter electrode, wherein the second semiconductor region is present under each of the fifth and seventh semiconductor regions, wherein an impurity concentration of the fifth semiconductor region is higher than an impurity concentration of the second semiconductor region, and wherein an impurity concentration of the seventh semiconductor region is higher than an impurity concentration of each of the second and fifth semiconductor regions.

2. The semiconductor device according to claim 1, wherein the impurity concentration of the seventh semiconductor region is not less than double the impurity concentration of the fifth semiconductor region.

3. The semiconductor device according to claim 2, wherein the impurity concentration of the seventh semiconductor region is not more than twenty-five times the impurity concentration of the fifth semiconductor region.

4. The semiconductor device according to claim 1, further comprising:

an eight semiconductor region having the second conductivity type and interposed between the first and second semiconductor regions in the semiconductor substrate, wherein an impurity concentration of the eighth semiconductor region is higher than the impurity concentration of the second semiconductor region.

5. The semiconductor device according to claim 1, further comprising:

an interlayer insulating film formed over the first main surface of the semiconductor substrate so as to cover the first and second trench gate electrodes and the first and second trench electrodes;

a first opening located between the first and second trenches in plan view to extend through the interlayer insulating film and be cut in a part of the semiconductor substrate;

a second opening located between the third and fourth trenches in plan view to extend through the interlayer insulating film and be cut in a part of the semiconductor substrate;

a first coupling electrode electrically coupled to the emitter electrode and embedded in the first opening; and a second coupling electrode electrically coupled to the emitter electrode and embedded in the second opening, wherein the first coupling electrode is electrically coupled to the third and fourth semiconductor regions, and wherein the second coupling electrode is electrically coupled to the sixth semiconductor region.

6. The semiconductor device according to claim 5, wherein the first and second coupling electrodes are formed integrally with the emitter electrode.

7. The semiconductor device according to claim 5, further comprising:

a ninth semiconductor region having the first conductivity type and formed in the third semiconductor region to be adjacent to a bottom surface of the first coupling electrode, wherein an impurity concentration of the ninth semiconductor region is higher than an impurity concentration of the third semiconductor region, and wherein the ninth semiconductor region is in contact with the fifth semiconductor region.

8. The semiconductor device according to claim 7, wherein the ninth semiconductor region includes a tenth semiconductor region having the first conductivity type and adjacent to the bottom surface of the first coupling electrode and an eleventh semiconductor region having the first conductivity type and interposed between the tenth and fifth semiconductor regions, and wherein an impurity concentration of the eleventh semiconductor region is higher than the impurity concentration of the third semiconductor region and lower than an impurity concentration of the tenth semiconductor region.

9. The semiconductor device according to claim 1, wherein a bottom surface of the third semiconductor region is deeper than a bottom surface of the sixth semiconductor region.

10. The semiconductor device according to claim 1, wherein each of the fifth and seventh semiconductor regions is a hole barrier semiconductor region.

11. The semiconductor device according to claim 1, wherein the third, fourth, and fifth semiconductor regions are components of a unit IGBT.

12. The semiconductor device according to claim 1, wherein the seventh and sixth semiconductor regions are components of a carrier discharge cell.

13. The semiconductor device according to claim 1, wherein a depth of each of the third and fourth trenches is deeper than a depth of each of the first and second trenches.

14. The semiconductor device according to claim 1, wherein a space between the third and fourth trenches is smaller than a space between the first and second trenches.

15. A semiconductor device having an IGBT, comprising:
a semiconductor substrate having a first main surface and a second main surface opposite to the first main surface;
a collector region having a first conductivity type and formed in the semiconductor substrate to be closer to the second main surface;
a collector electrode formed over the second main surface of the semiconductor substrate to be electrically coupled to the collector region;
a drift region having a second conductivity type opposite to the first conductivity type and formed in the semiconductor substrate to be located over the collector region;
first and second trenches formed in the first main surface of the semiconductor substrate to face each other;
third and fourth trenches formed in the first main surface of the semiconductor substrate to face each other;
a first trench gate electrode formed in the first trench via a first gate insulating film;
a second trench gate electrode formed in the second trench via a second gate insulating film;
a first trench electrode formed in the third trench via a first insulating film;
a second trench electrode formed in the fourth trench via a second insulating film;
a first body region having the first conductivity type and formed in a portion of the semiconductor substrate which is interposed between the first and second trenches to be closer to the first main surface;
a first emitter region having the second conductivity type and formed in the portion of the semiconductor substrate which is interposed between the first and second trenches to be located in an upper portion of the first body region;
a first hole barrier region having the second conductivity type and formed in the portion of the semiconductor substrate which is interposed between the first and second trenches to be located under the first body region;
a second body region having the first conductivity type and formed in a portion of the semiconductor substrate which is interposed between the third and fourth trenches to be closer to the first main surface;
a second hole barrier region having the second conductivity type and formed in the portion of the semiconductor substrate which is interposed between the third and fourth trenches to be located under the second body region; and
an emitter electrode formed over the first main surface of the semiconductor substrate to be electrically coupled to the first body region, the first emitter region, and the second body region;
wherein, in the portion of the semiconductor substrate which is interposed between the third and fourth trenches, an emitter region having the second conductivity type and electrically coupled to the emitter electrode is not formed over the second body region,
wherein the first and second trench electrodes are electrically coupled to the emitter electrode,
wherein the drift region is present under each of the first and second hole barrier regions,
wherein an impurity concentration of the first hole barrier region is higher than an impurity concentration of the drift region, and
wherein an impurity concentration of the second hole barrier region is higher than an impurity concentration of each of the drift region and the first hole barrier region.

* * * * *